US010688756B2

(12) United States Patent
Chu et al.

(10) Patent No.: US 10,688,756 B2
(45) Date of Patent: Jun. 23, 2020

(54) FOLDABLE ELECTRONIC DEVICE ASSEMBLIES AND COVER ELEMENTS FOR THE SAME

(71) Applicant: CORNING INCORPORATED, Corning, NY (US)

(72) Inventors: Polly Wanda Chu, Painted Post, NY (US); Michael Patrick Donovan, Painted Post, NY (US); Timothy Michael Gross, Corning, NY (US); Louis Mattos, Jr., Painted Post, NY (US); Prakash Chandra Panda, Ithaca, NY (US); Robert Lee Smith, III, Painted Post, NY (US)

(73) Assignee: Corning Incorporated, Corning, NY (US)

( * ) Notice: Subject to any disclaimer, the term of this patent is extended or adjusted under 35 U.S.C. 154(b) by 0 days.

(21) Appl. No.: 16/069,959

(22) PCT Filed: Jan. 13, 2017

(86) PCT No.: PCT/US2017/013374
§ 371 (c)(1),
(2) Date: Jul. 13, 2018

(87) PCT Pub. No.: WO2017/123899
PCT Pub. Date: Jul. 20, 2017

(65) Prior Publication Data
US 2019/0022980 A1    Jan. 24, 2019

Related U.S. Application Data

(60) Provisional application No. 62/415,088, filed on Oct. 31, 2016, provisional application No. 62/279,558, filed on Jan. 15, 2016.

(51) Int. Cl.
*B32B 17/06* (2006.01)
*B32B 7/12* (2006.01)
(Continued)

(52) U.S. Cl.
CPC .............. *B32B 17/064* (2013.01); *B32B 7/12* (2013.01); *B32B 17/1055* (2013.01);
(Continued)

(58) Field of Classification Search
CPC .................................................. B32B 17/064
(Continued)

(56) References Cited

U.S. PATENT DOCUMENTS 6,815,070 B1   11/2004   Burkle et al.
9,865,844 B1   1/2018    Park et al.
(Continued)

FOREIGN PATENT DOCUMENTS

WO    WO-2014159168 A1 * 10/2014   ........... B32B 17/064
WO    2016028542 A1    2/2016

OTHER PUBLICATIONS

Chu et al; "Bendable Glass Stack Assemblies and Articles"; U.S. Appl. No. 62/279,558, filed Jan. 15, 2016; 89 Pages.
(Continued)

*Primary Examiner* — Tahseen Khan
(74) *Attorney, Agent, or Firm* — Jeffrey A. Schmidt

(57) ABSTRACT

A cover element for a foldable electronic device that includes a foldable glass element, first and second primary surfaces, and a compressive stress region extending from the first primary surface to a first depth that is defined by a stress $\sigma_I$ of at least about 100 MPa in compression at the first primary surface. The device also includes a polymeric layer disposed over the first primary surface. The glass element has a stress profile such that when the glass element is bent to a target bend radius of from 1 mm to 20 mm, to induce
(Continued)

a bending stress $\sigma_B$ at the first primary surface in tension, $\sigma_I+\sigma_B<400$ MPa (in tension). Further, the cover element can withstand a pen drop height of at least 1.5 times that of a control pen drop height of the cover element without the layer according to a Drop Test 1.

9 Claims, 25 Drawing Sheets

(51) Int. Cl.
| | |
|---|---|
| H01L 51/00 | (2006.01) |
| B32B 17/10 | (2006.01) |
| G06F 1/16 | (2006.01) |
| G09F 9/30 | (2006.01) |
| B32B 3/16 | (2006.01) |
| G02F 1/1333 | (2006.01) |

(52) U.S. Cl.
CPC .......... *G06F 1/1641* (2013.01); *G06F 1/1652* (2013.01); *G09F 9/301* (2013.01); *H01L 51/0097* (2013.01); *B32B 3/16* (2013.01); *B32B 2255/10* (2013.01); *B32B 2307/536* (2013.01); *B32B 2307/546* (2013.01); *B32B 2315/08* (2013.01); *B32B 2457/00* (2013.01); *B32B 2457/20* (2013.01); *G02F 1/133305* (2013.01); *H01L 2251/5338* (2013.01); *Y10T 428/24942* (2015.01); *Y10T 428/26* (2015.01); *Y10T 428/266* (2015.01)

(58) Field of Classification Search
USPC ......................................................... 428/213
See application file for complete search history.

(56) References Cited

U.S. PATENT DOCUMENTS

| | | | |
|---|---|---|---|
| 2010/0110354 A1 | 5/2010 | Suzuki et al. | |
| 2011/0217541 A1 | 9/2011 | Shimano et al. | |
| 2014/0132132 A1 | 5/2014 | Chowdhury et al. | |
| 2014/0349130 A1* | 11/2014 | Petcavich | C08J 5/18 428/480 |
| 2015/0210588 A1* | 7/2015 | Chang | C03C 21/002 361/750 |
| 2015/0210589 A1* | 7/2015 | Chang | C03C 21/002 428/220 |
| 2015/0210590 A1* | 7/2015 | Chang | C03C 21/002 428/220 |
| 2015/0258750 A1 | 9/2015 | Kang et al. | |
| 2016/0002103 A1 | 1/2016 | Wang et al. | |
| 2016/0224069 A1* | 8/2016 | Chang | C03C 21/002 |
| 2017/0115700 A1* | 4/2017 | Chang | C03C 21/002 |
| 2017/0274627 A1 | 9/2017 | Chang et al. | |
| 2018/0113490 A1* | 4/2018 | Chang | C03C 21/002 |
| 2019/0050027 A1* | 2/2019 | Chang | C03C 21/002 |

OTHER PUBLICATIONS

Gulati et al; "45.2: Two Point Bending of Thin Glass Substrates," in SID Conf., 2011, pp. 652-654.

International Search Report and Written Opinion of the International Searching Authority; PCT/US2017/013374; dated May 10, 2017; 14 Pages; European Patent Office.

* cited by examiner

Pixel damage to OLED - 7cm drop height - Bright Spot - White Bitmap

Pixel damage to OLED - 7cm drop height - Bright Spot - Black Bitmap

Dimple on PI - 3cm drop height - Bright Spot

| 50 μm Polyimide (PI) |
| 50 μm removable tape |
| 50 μm Polyimide (PI) |
| 50 μm removable tape |
| OLED |

FOLDABLE ELECTRONIC DEVICE ASSEMBLIES AND COVER ELEMENTS FOR THE SAME

CROSS-REFERENCE TO RELATED APPLICATIONS

This application claims the benefit of priority under 35 U.S.C. § 371 of International Patent Application Serial No. PCT/US2017/013374, filed on Jan. 13, 2017, which in turn, claims the benefit of priority of U.S. Provisional Patent Application Ser. No. 62/415,088 filed on Oct. 31, 2016 and U.S. Provisional Patent Application Ser. No. 62/279,558 filed on Jan. 15, 2016, the contents of each of which are relied upon and incorporated herein by reference in their entireties.

TECHNICAL FIELD

The disclosure generally relates to foldable electronic device assemblies, cover elements for these assemblies, and various methods for making these elements and assemblies. More particularly, the disclosure relates to bendable, impact- and warp-resistant versions of these elements and assemblies, along with methods for making them.

BACKGROUND

Flexible versions of products and components that are traditionally rigid in nature are being conceptualized for new applications. For example, flexible electronic devices can provide thin, lightweight and flexible properties that offer opportunities for new applications, for example curved displays and wearable devices. Many of these flexible electronic devices require flexible substrates for holding and mounting the electronic components of these devices. Metal foils have some advantages including thermal stability and chemical resistance, but suffer from high cost and a lack of optical transparency. Polymeric foils have some advantages including resistance to fatigue failure, but suffer from marginal optical transparency, lack of thermal stability and limited hermeticity. Polymeric foils also suffer from a limited ability to offer impact-resistance to underlying electronic components. Further, polymeric foils can suffer from permanent deformation associated with their viscoelasticity upon repeated application-related bending.

Some of these electronic devices also can make use of flexible displays. Optical transparency and thermal stability are often important properties for flexible display applications. In addition, flexible displays should have high fatigue and puncture resistance, including resistance to failure at small bend radii, particularly for flexible displays that have touch screen functionality and/or can be folded.

Conventional flexible glass materials offer many of the needed properties for flexible substrate and/or display applications. However, efforts to harness glass materials for these applications have been largely unsuccessful to date. Generally, glass substrates can be manufactured to very low thickness levels (<25 µm) to achieve smaller and smaller bend radii. These "thin" glass substrates suffer from limited puncture resistance. At the same time, thicker glass substrates (>150 µm) can be fabricated with better puncture resistance, but these substrates lack suitable fatigue resistance and mechanical reliability upon bending.

In addition, foldable glass substrates for foldable electronic device applications, while offering improvements in transparency, stability and wear resistance over polymeric foils, can be limited by impact resistance. More particularly, impact resistance concerns for foldable glass substrates can be manifested in damage to the substrate and/or underlying electronic components when subjected to impacts.

Thus, there is a need for improved foldable electronic device assemblies, and cover elements for these assemblies, for reliable use in flexible substrate and/or display applications and functions, particularly for flexible electronic device applications.

SUMMARY

According to some embodiments, a cover element for a foldable electronic device is provided that includes: a foldable glass element comprising a thickness from about 25 µm to about 200 µm, the glass element further comprising: (a) a first primary surface, (b) a second primary surface, and (c) a compressive stress region extending from the first primary surface of the glass element to a first depth in the glass element, the region defined by a stress $\sigma_I$ of at least about 100 MPa in compression at the first primary surface of the glass element. The device also includes a polymeric layer comprising a thickness from about 10 µm to about 100 µm and disposed over the first primary surface of the glass element. Further, the glass element is characterized by a stress profile such that when the glass element is bent to a target bend radius of from 1 mm to 20 mm, with the center of curvature on the side of the second primary surface so as to induce a bending stress $\sigma_B$ at the first primary surface in tension, $\sigma_I+\sigma_B<400$ MPa (in tension). In addition, the cover element comprises an ability to withstand a pen drop height of at least 1.5 times that of a control pen drop height of the cover element without the layer, wherein the pen drop heights are measured according to a Drop Test 1, with the layer disposed on the side of the glass element facing the pen.

According to some embodiments, a cover element for a foldable electronic device is provided that includes: a foldable glass element comprising a thickness from about 25 µm to about 200 µm, the glass element further comprising: (a) a first primary surface, (b) a second primary surface, and (c) a compressive stress region extending from the second primary surface of the glass element to a first depth in the glass element, the region defined by a stress $\sigma_I$ of at least about 100 MPa in compression at the second primary surface of the glass element. The device also includes a polymeric layer comprising a thickness from about 10 µm to about 100 µm and disposed over the first primary surface of the glass element. Further, the glass element is characterized by a stress profile such that when the glass element is bent to a target bend radius of from 1 mm to 20 mm, with the center of curvature on the side of the first primary surface so as to induce a bending stress $\sigma_B$ at the second primary surface in tension, $\sigma_I+\sigma_B<200$ MPa (in tension). In addition, the cover element comprises an ability to withstand a pen drop height of at least 1.5 times that of a control pen drop height of the cover element without the layer, wherein the pen drop heights are measured according to a Drop Test 1, with the layer disposed on the side of the glass element facing the pen.

According to some embodiments, a foldable electronic device assembly is provided that includes: a foldable electronic device substrate; a foldable glass element comprising a thickness from about 25 µm to about 200 µm, the glass element further comprising: (a) a first primary surface, (b) a second primary surface, and (c) a compressive stress region extending from the first primary surface of the glass element to a first depth in the glass element, the region defined by a stress $\sigma_I$ of at least about 100 MPa in compression at the first primary surface of the glass element; and a polymeric layer comprising a thickness from about 10 μm to about 100 μm and disposed over the first primary surface of the glass element. Further, the glass element is characterized by a stress profile such that when the glass element is bent to a target bend radius of from 1 mm to 20 mm, with the center of curvature on the side of the second primary surface so as to induce a bending stress $\sigma_B$ at the first primary surface in tension, $\sigma_I + \sigma_B < 400$ MPa (in tension). In addition, the foldable electronic device assembly comprises an ability to withstand a pen drop height of at least 1.5 times that of a control pen drop height of the foldable electronic device assembly without the polymeric layer, wherein the pen drop heights are measured according to a Drop Test 1, with the layer disposed on the side of the glass element facing the pen.

According to some embodiments, a foldable electronic device assembly is provided that includes: a foldable electronic device substrate; a foldable glass element comprising a thickness from about 25 μm to about 200 μm, the glass element further comprising: (a) a first primary surface, (b) a second primary surface, and (c) a compressive stress region extending from the first primary surface of the glass element to a first depth in the glass element, the region defined by a stress $\sigma_I$ of at least about 100 MPa in compression at the first primary surface of the glass element; and a polymeric layer comprising a thickness from about 10 μm to about 100 μm and disposed over the first primary surface of the glass element. Further, the glass element is characterized by a stress profile such that when the glass element is bent to a target bend radius of from 1 mm to 20 mm, with the center of curvature on the side of the second primary surface so as to induce a bending stress $\sigma_B$ at the first primary surface in tension, $\sigma_I + \sigma_B < 400$ MPa (in tension). In addition, the foldable electronic device assembly comprises an ability to resist permanent warp such that a permanent warp of the foldable electronic device assembly is at least 10% lower than a permanent warp of a comparable foldable electronic device assembly, wherein the permanent warp of the device assemblies is measured according to a Static Test after a hold time on test of 480 hours at 85° C. and 85% relative humidity. Still further, the comparable foldable electronic device assembly comprises (a) a comparable substrate and comparable polymeric layer comprising the same dimensions and compositions as the respective substrate and polymeric layer of the foldable electronic device assembly, and (b) a comparable foldable polymeric element disposed between the comparable substrate and comparable polymeric layer that comprises a polyimide (PI) comprising the same, or a smaller, thickness as the glass element of the foldable electronic device assembly.

According to some embodiments, the cover element of any of the above embodiments is configured such that $\sigma_I + \sigma_B < 0$ MPa at the first primary surface of the glass element, at the second primary surface of the glass element, or at both of the primary surfaces. The cover element can also be configured such that $\sigma_I + \sigma_B < 0$ MPa to a depth of at least 1 μm below the first primary surface of the glass element, the second primary surface of the glass element, or below both of the primary surfaces. Further, the stress at the first and/or second primary surface of the glass element can be from about 700 MPa to about 2000 MPa in compression, wherein the compressive stress region comprises a plurality of ion-exchangeable metal ions and a plurality of ion-exchanged metal ions, the ion-exchanged metal ions comprising an atomic radius larger than the atomic radius of the ion-exchangeable metal ions. Still further, the first depth of the compressive stress region can be set at approximately one third of the thickness of the glass element or less from the first and/or second primary surface of the glass element.

According to some embodiments, the cover element is configured according to any of the above embodiments and the glass element further comprises a maximum flaw size of less than or equal to 2 μm at first primary surface of the glass element, at the second primary surface of the glass element, or at both of the primary surfaces.

In some embodiments, the polymeric layer comprises a polyimide, a polyethylene terephthalate, a polycarbonate or a poly methyl methacrylate. The layer, in some embodiments, can also be coupled to the glass element by an adhesive.

According to some embodiments, the cover element or the foldable electronic device assembly is configured according to any of the above embodiments and further includes a scratch-resistant coating disposed on the polymeric layer. The coating has a pencil hardness of at least 5H according to ASTM Test Method D3363. In addition, the cover element or the foldable electronic device assembly comprises an ability to withstand a pen drop height of at least 1.5 times that of a control pen drop height of the cover element or the device assembly without the layer and the coating, wherein the pen drop heights are measured according to a Drop Test 1, with the layer and coating disposed on the side of the glass element facing the pen.

According to some embodiments, the foldable electronic device assembly of any of the above embodiments can be configured to withstand a pen drop height of greater than 8 cm according to the Drop Test 1. In some embodiments, the foldable electronic device assembly can be configured to withstand a pen drop height of greater than 15 cm according to the Drop Test 1.

According to some embodiments, the foldable electronic device assembly of any of the above embodiments can be configured with an ability to resist permanent warp such that a permanent warp of the foldable electronic device assembly is at least 20% lower than a permanent warp of the comparable foldable electronic device assembly.

According some embodiments, the foldable glass element of any of the above embodiments is further configured with a second compressive stress region that extends from the first or second primary surface (as the case may be) to a second depth in the glass element. Further, this second compressive stress region can be defined with a stress $\sigma_I$ of at least 100 MPa in compression at the first or second primary surface of the glass element (as the case may be).

According to some embodiments, a foldable electronic device assembly of any of the above embodiments is provided such that the foldable electronic device substrate comprises one or more of a display, printed circuit board, adhesives, and/or other electronic components.

In some embodiments, the foldable glass element of any of the above embodiments can further comprise one or more additional glass layers and one or more respective compressive stress regions disposed beneath the first glass layer. For example, the glass element can comprise two, three, four or more additional glass layers with corresponding additional compressive stress regions beneath the first glass layer.

In some embodiments, a glass layer of the foldable glass element of any of the above embodiments comprises an alkali-free or alkali-containing aluminosilicate, borosilicate, boroaluminosilicate, or silicate glass composition. The thickness of the glass layer can also range from about 50 μm to about 100 μm. The thickness can range from 60 μm to about 80 μm, according to some embodiments.

In some embodiments, the bend radius of the foldable glass element (or the glass layer within the element) of any of the above embodiments can be from about 1 mm to about 20 mm. In other embodiments, the bend radius can be from about 3 mm to about 10 mm. The bend radius of the glass layer, when incorporated within a foldable glass element, can be from about 1 mm to about 5 mm in some embodiments. Further, the bend radius can also be from about 5 mm to about 7 mm for such glass layers.

In some embodiments, the compressive stress in the compressive stress region at the first primary surface and/or the second primary surface of the foldable glass element of any of the above embodiments is from about 500 to about 2000 MPa. In some embodiments, the compressive stress at the first primary surface and/or the second primary surface is from about 600 MPa to 1000 MPa. The compressive stress region can also include a maximum flaw size of 5 μm or less at the first primary surface and/or second primary surface of the glass element. In certain cases, the compressive stress region comprises a maximum flaw size of 2.5 μm or less, or even as low as 0.4 μm or less.

In other embodiments, the compressive stress region within the foldable glass element of any of the above embodiments comprises a plurality of ion-exchangeable metal ions and a plurality of ion-exchanged metal ions, the ion-exchanged metal ions selected so as to produce compressive stress. In some embodiments, the ion-exchanged metal ions have an atomic radius larger than the atomic radius of the ion-exchangeable metal ions. According to other embodiments, the foldable glass element and/or a glass layer within the glass element can further comprise a core region, and a first and a second clad region disposed on the core region, and further wherein the coefficient of thermal expansion for the core region is greater than the coefficient of thermal expansion for the clad regions.

Additional features and advantages will be set forth in the detailed description which follows, and in part will be readily apparent to those skilled in the art from that description or recognized by practicing the embodiments as described herein, including the detailed description which follows, the claims, as well as the appended drawings.

It is to be understood that both the foregoing general description and the following detailed description are merely exemplary, and are intended to provide an overview or framework to understanding the nature and character of the claims. The accompanying drawings are included to provide a further understanding, and are incorporated in and constitute a part of this specification. The drawings illustrate one or more embodiments, and together with the description serve to explain principles and operation of the various embodiments. Directional terms as used herein—for example, up, down, right, left, front, back, top, bottom—are made only with reference to the figures as drawn and are not intended to imply absolute orientation.

DETAILED DESCRIPTION

Figure 1:
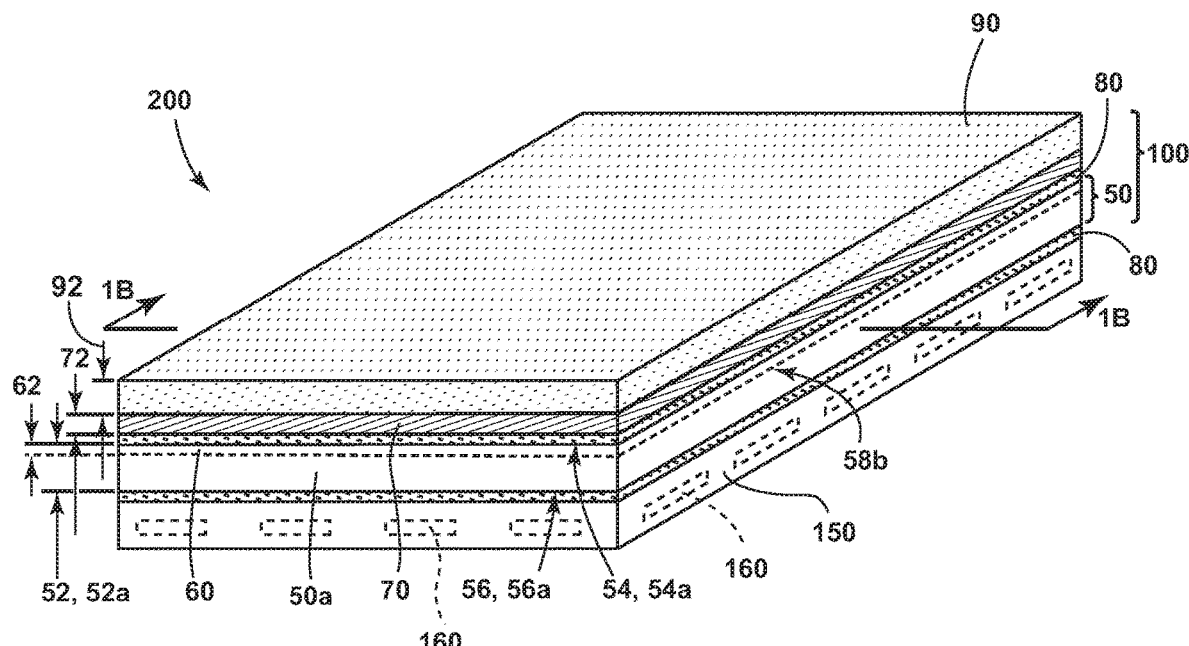
FIG. 1 is a perspective view of a foldable electronic device assembly comprising a foldable glass element, a polymeric layer and a foldable electronic device substrate according to some embodiments of this disclosure.

Reference will now be made in detail to embodiments, examples of which are illustrated in the accompanying drawings. Whenever possible, the same reference numerals will be used throughout the drawings to refer to the same or like parts. Ranges can be expressed herein as from "about" one particular value, and/or to "about" another particular value. When such a range is expressed, another embodiment includes from the one particular value and/or to the other particular value. Similarly, when values are expressed as approximations, by use of the antecedent "about," it will be understood that the particular value forms another embodiment. Whether or not a numerical value or end-point of a range in the specification recites "about," the numerical value or end-point of a range is intended to include two embodiments: one modified by "about," and one not modified by "about." It will be further understood that the endpoints of each of the ranges are significant both in relation to the other endpoint, and independently of the other endpoint.

The terms "substantial," "substantially," and variations thereof as used herein are intended to note that a described feature is equal or approximately equal to a value or description. For example, a "substantially planar" surface is intended to denote a surface that is planar or approximately planar. Moreover, "substantially" is intended to denote that two values are equal or approximately equal. In some embodiments, "substantially" may denote values within about 10% of each other, such as within about 5% of each other, or within about 2% of each other.

Among other features and benefits, the cover elements for foldable electronic devices and foldable electronic device assemblies (and the methods of making them) of the present disclosure provide mechanical reliability (e.g., in static tension and fatigue) at small bend radii, high puncture and impact resistance and/or resistance to permanent warp and deformation. The small bend radii, puncture resistance and impact resistance, and resistance to permanent warp are beneficial when the cover elements and foldable electronic device assemblies of the disclosure are used in a foldable display, for example, one wherein one part of the display is folded over on top of another portion of the display (e.g., in an 'in-fold' or an 'out-fold' configuration with the display on the inside or outside after the device is folded). Further, the cover elements for foldable electronic devices and foldable electronic device assemblies described herein may be used in a tri-fold or multi-fold arrangement, wherein two or more parts of the device are folded over one another.

For example, the cover element and/or foldable electronic device assembly may be used as one or more of: a cover on the user-facing portion of a foldable display, a location wherein puncture and impact resistance is particularly important; a substrate, disposed internally within the device itself, on which electronic components are disposed; or elsewhere in a foldable display device. Alternatively, the cover element and/or foldable electronic device assembly may be used in a device not having a display, but one wherein a glass layer is used for its beneficial properties and is folded, in a similar manner as in a foldable display, to a tight bend radius. The puncture and impact resistance is particularly beneficial when the cover element and/or foldable electronic device assembly are used on the exterior of the device, wherein a user will interact with it.

The resistance to warp can also be of importance when the cover elements and foldable electronic device assemblies of the disclosure are used in fold-driven applications, such as foldable displays, foldable substrates with electronic components and the like. In particular, most devices associated with these applications can benefit from a lack of fold-related history being apparent in the device after application-related folding and bending. That is, the cover elements and foldable electronic device assemblies, as disclosed herein, can exhibit a resistance to permanent warp, which advantageously makes the device containing these elements and assemblies resistant to permanent creases, folds, bends and the like after application-related device-level folding and bending.

Figure 1A:
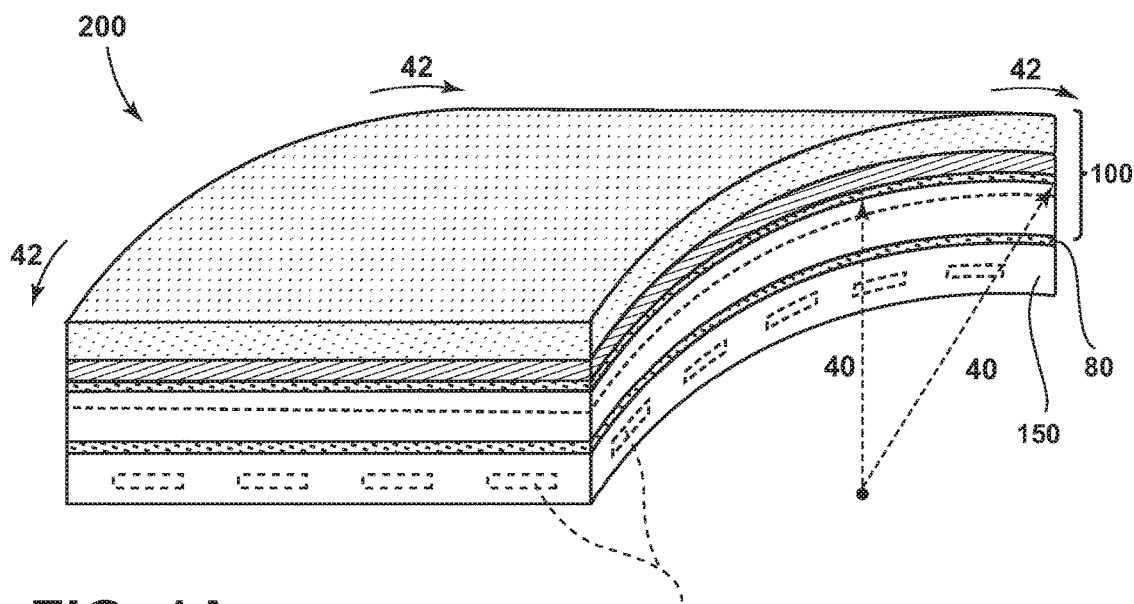
FIG. 1A is a perspective view of the device assembly depicted in FIG. 1 subjected to bending forces with a center of curvature on the substrate side of the assembly.
Figure 1B:
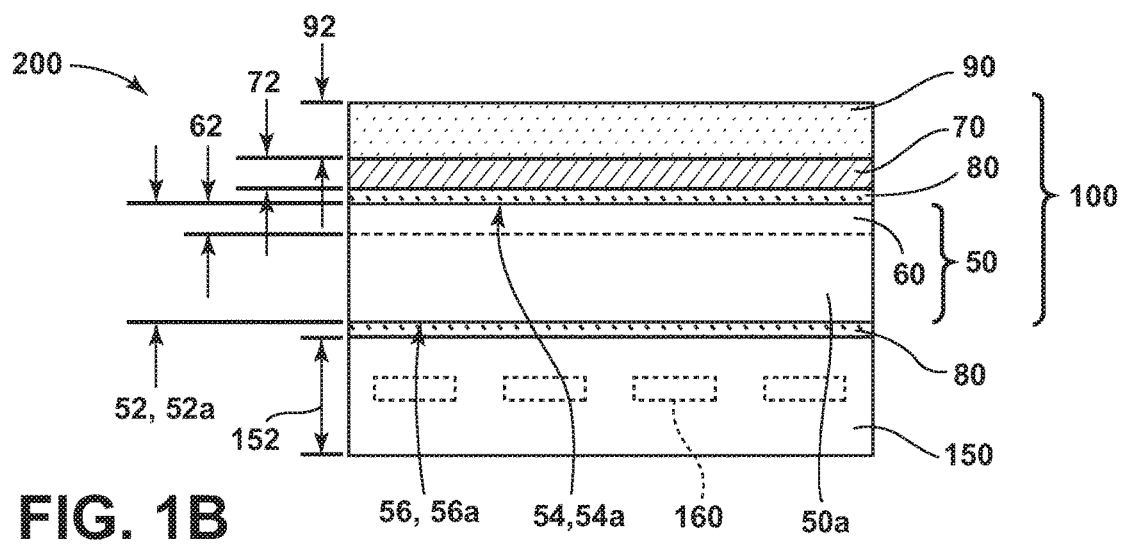
FIG. 1B is a cross-sectional view of the device assembly depicted in FIG. 1.

Referring to FIGS. 1 and 1B, a foldable electronic device assembly 200 is depicted that includes a foldable electronic device substrate 150 and a cover element 100 disposed over the substrate 150. The cover element 100 includes a foldable glass element 50. Glass element 50 has a thickness 52, a first primary surface 54 and a second primary surface 56. In addition, the cover element 100 also includes a polymeric layer 70, with a thickness 72, disposed over the first primary surface 54 of the foldable glass element 50.

With further regard to the foldable glass element 50, the thickness 52 can range from about 25 μm to about 200 μm in some embodiments. In other embodiments, thickness 52 can range from about 25 μm to about 125 μm, from about 50 μm to about 100 μm, or about 60 μm to about 80 μm. Thickness 52 can also be set at other thicknesses between the foregoing ranges.

The foldable glass element 50 includes a glass layer 50a with a glass layer first primary surface 54a and a glass layer second primary surface 56a. In addition, glass layer 50a also includes edges 58b, generally configured at right angles to the primary surfaces 54a and 56a. Glass layer 50a is further defined by a glass layer thickness 52a. In the embodiments of the foldable electronic device assembly 200 and the cover element 100 depicted in FIGS. 1 and 1B, the foldable glass element 50 includes one glass layer 50a. As a consequence, the glass layer thickness 52a is comparable to the glass element thickness 52 for the device assembly 200 and cover element 100. In other embodiments, foldable glass element 50 can include two or more glass layers 50a (see, e.g., foldable electronic device assembly 200c and cover element 100c depicted in FIG. 2 and the corresponding description). As such, the thickness 52a of glass layer 50a can range from about 1 μm to about 200 μm. For example, glass element 50 can include three glass layers 50a, each having a thickness 52a of about 8 μm. In this example, the thickness 52 of glass element 50 may be about 24 μm. It should also be understood, however, that glass element 50 could include other non-glass layers (e.g., compliant polymer layers) in addition to one or more glass layers 50a. It should also be understood that a foldable glass element 50 comprising two or more glass layers 50a can be configured such that the layers 50a have different thicknesses 52a.

In FIGS. 1 and 1B, glass layer 50a can be fabricated from alkali-free aluminosilicate, borosilicate, boroaluminosilicate, and silicate glass compositions. Glass layer 50a can also be fabricated from alkali-containing aluminosilicate, borosilicate, boroaluminosilicate, and silicate glass compositions. In certain embodiments, alkaline earth modifiers can be added to any of the foregoing compositions for glass layer 50a. In some embodiments, glass compositions according to the following are suitable for the glass layer 50a: $SiO_2$ at 64 to 69% (by mol %); $Al_2O_3$ at 5 to 12%; $B_2O_3$ at 8 to 23%; MgO at 0.5 to 2.5%; CaO at 1 to 9%; SrO at 0 to 5%; BaO at 0 to 5%; $SnO_2$ at 0.1 to 0.4%; $ZrO_2$ at 0 to 0.1%; and $Na_2O$ at 0 to 1%. In some embodiments, the following composition is suitable for the glass layer 50a: $SiO_2$ at ~67.4% (by mol %); $Al_2O_3$ at ~12.7%; $B_2O_3$ at ~3.7%; MgO at ~2.4%; CaO at 0%; SrO at 0%; $SnO_2$ at ~0.1%; and $Na_2O$ at ~13.7%. In some embodiments, the following composition is also suitable for the glass layer 50a: $SiO_2$ at 68.9% (by mol %); $Al_2O_3$ at 10.3%; $Na_2O$ at 15.2%; MgO at 5.4%; and $SnO_2$ at 0.2%. In some embodiments, a composition for glass layer 50a is selected with a relatively low elastic modulus (compared to other alternative glasses). Lower elastic modulus in the glass layer 50a can reduce the tensile stress in the layer 50a during bending. Other criteria can be used to select the composition for glass layer 50a, including but not limited to ease of manufacturing to low thickness levels while minimizing the incorporation of flaws, ease of development of a compressive stress region to offset tensile stresses generated during bending, optical transparency, and/or corrosion resistance.

The foldable glass element 50 and the glass layer 50a can adopt a variety of physical forms. From a cross-sectional perspective, the element 50 and the layer 50a (or layers 50a) can be flat or planar. In some embodiments, element 50 and layer 50a can be fabricated in non-rectilinear, sheet-like forms depending on the final application. As an example, a mobile display device having an elliptical display and bezel could include a glass element 50 and layer 50a having a generally elliptical, sheet-like form.

Still referring to FIGS. 1 and 1B, the foldable glass element 50 of the foldable electronic device assembly 200 and the cover element 100 can include a compressive stress region 60 that extends from the first primary surface 54a to a first depth 62 in the glass element 50. Among other advantages, the compressive stress region 60 can be employed within the glass layer 50a to offset tensile stresses generated in the glass layer 50a upon bending, particularly tensile stresses that reach a maximum near the first primary surface 54a. The compressive stress region 60 can include a stress, $\sigma_I$, of at least about 100 MPa in compression at the first primary surface of the layer 54a. In some embodiments, the stress, $\sigma_I$, at the first primary surface 54a is from about 600 MPa to about 1000 MPa in compression. In other embodiments, the stress, $\sigma_I$, can exceed 1000 MPa in compression at the first primary surface 54a, up to 2000 MPa, depending on the process employed to produce the compressive stress in the glass layer 50a. The stress, $\sigma_I$, can also range from about 100 MPa to about 600 MPa in compression at the first primary surface 54a in other embodiments of this disclosure. As is also evident to those with ordinary skill, the stress, $\sigma_I$, can be configured at the first primary surface of the layer 54a to be from any level from about 100 MPa to about 2000 MPa in compression. Still further, the compressive stress region 60, in some embodiments, can extend from the second primary surface 56a (not shown) of the glass element 50 to a selected depth in the glass element 50. It should also be understood that two compressive stress regions 60 can exist within the element 50, each emanating from one of the primary surfaces 54, 56 down to a selected depth within the element 50.

Compressive stress (at the surface of the glass, e.g., at one of the primary surfaces 54, 56 of the foldable glass element 50) is measured by surface stress meter (FSM) using commercially available instruments such as the FSM-6000, manufactured by Orihara Industrial Co., Ltd. (Japan). Surface stress measurements rely upon the accurate measurement of the stress optical coefficient (SOC), which is related to the birefringence of the glass. SOC in turn is measured according to Procedure C (Glass Disc Method) described in ASTM standard C770-16, entitled "Standard Test Method for Measurement of Glass Stress-Optical Coefficient," the contents of which are incorporated herein by reference in their entirety.

As used herein, depth of compression ("DOC") means the depth at which the stress in the chemically strengthened alkali aluminosilicate glass article described herein changes from compressive to tensile. DOC may be measured by FSM or a scattered light polariscope (SCALP) depending on the ion exchange treatment. Where the compressive stress in the glass article is generated by exchanging potassium ions into the glass article, FSM is used to measure DOC. Where the compressive stress is generated by exchanging sodium ions into the glass article, SCALP is used to measure DOC. Where the compressive stress in the glass article is generated by exchanging both potassium and sodium ions into the glass, the DOC is measured by SCALP, since it is believed the exchange depth of sodium indicates the DOC and the exchange depth of potassium ions indicates a change in the magnitude of the compressive stress (but not the change in stress from compressive to tensile); the exchange depth of potassium ions in such glass articles is measured by FSM.

Within the compressive stress region 60, the compressive stress can stay constant, decrease or increase within the glass layer 50a as a function of depth from the first primary surface of the glass layer 54a down to the first depth 62. As such, various compressive stress profiles can be employed in compressive stress region 60. Further, the depth 62 can be set at approximately 15 µm or less from the first primary surface of the glass layer 54a. In other embodiments, the depth 62 can be set such that it is approximately ⅓ of the thickness 52a of the glass layer 50a or less, or 20% of the thickness 52a of the glass layer 50a or less, from the first primary surface of the glass layer 54a.

Referring to FIGS. 1 and 1A, the foldable glass element 50 of the foldable electronic device assembly 200 and the cover element 100, according to some embodiments, may be characterized by an absence of failure when the element is held at the bend radius 40 from about 1 mm to about 20 mm for at least 60 minutes at about 25° C. and about 50% relative humidity. As shown in FIG. 1A and defined herein, the bend radius 40 is measured to a primary surface 54 of the foldable glass element 50 (or to the primary surface 56 as shown in FIG. 3A), unless noted otherwise. Without being bound by theory, one with ordinary skill would recognize that bend radii associated with the device assembly 200 and/or cover element 100 could be measured to the outer surface of the polymeric layer 70 (or scratch-resistant coating 90, if present) with a range of values based on the bend radii 40 and associated considerations detailed herein. For example, a foldable electronic device assembly 200 and/or cover element 100, according to some embodiments, may be characterized by an absence of failure when the assembly and/or element is held at bend radius measured to the outer surface of the polymer layer 70 from about 1 mm to about 20 mm, and the thickness 72 of the polymeric layer 70, for at least 60 minutes at about 25° C. and about 50% relative humidity. As used herein, the terms "fail," "failure" and the like refer to breakage, destruction, delamination, crack propagation or other mechanisms that leave the foldable electronic device assemblies, cover elements, glass articles, and/or glass elements of this disclosure unsuitable for their intended purpose. When the glass element 50 is held at the bend radius 40 under these conditions, bending forces 42 are applied to the ends of the element 50. In general, tensile stresses are generated at the first primary surface 54 of the element 50 and compressive stresses are generated at the second primary surface 56 during the application of bending forces 42. In other embodiments, glass element 50 can be configured to avoid failure for bend radii that range from about 3 mm to about 10 mm. In some embodiments, the bend radius 40 can be set in a range from about 1 mm to about 5 mm. The bend radius 40 can also be set to a range from about 5 mm to 7 mm without causing a failure in the glass element 50 according to other embodiments of cover element 100. The glass element 50 can also be characterized in some embodiments by an absence of failure when the element is held at a bend radius 40 from about 1 mm to about 20 mm for at least 120 hours at about 25° C. and about 50% relative humidity. Bend testing results can vary under testing conditions with temperatures and/or humidity levels that differ from the foregoing.

Referring again to the foldable electronic device assembly 200 and the cover element depicted in FIGS. 1 and 1B, the foldable glass element 50 may also be characterized by a puncture resistance of greater than about 1.5 kgf when the second primary surface 56 of the element 50 is supported by (i) an approximately 25 µm thick pressure-sensitive adhesive ("PSA") having an elastic modulus of less than about 1 GPa and (ii) an approximately 50 µm thick polyethylene terephthalate layer ("PET") having an elastic modulus of less than about 10 GPa, and the first primary surface 54 of the element 50 is loaded with a stainless steel pin having a flat bottom with a 200 µm diameter. Puncture testing according to embodiments of this disclosure is performed under displacement control at 0.5 mm/min cross-head speed. The stainless steel pin is replaced with a new pin after a specified quantity of tests (i.e., 10 tests) to avoid bias that could result from deformation of the metal pin associated with the testing of materials possessing a higher elastic modulus (e.g., glass element 50). In some embodiments, the glass element 50 is characterized by a puncture resistance of greater than about 1.5 kgf at a 5% or greater failure probability within a Weibull plot. The glass element 50 can also be characterized by a puncture resistance of greater than about 3 kgf at the Weibull characteristic strength (i.e., a 63.2% or greater). In certain embodiments, the glass element 50 of the cover element 100 can resist puncture at about 2 kgf or greater, 2.5 kgf or greater, 3 kgf or greater, 3.5 kgf or greater, 4 kgf or greater, and even higher ranges. The glass element 50 is also characterized by a pencil hardness of greater than or equal to 8H.

Referring again to FIGS. 1 and 1B, the foldable electronic device assembly 200 and the cover element 100 include a polymeric layer 70 having a thickness 72. In these configurations, the polymeric layer 70 is disposed over the first primary surface 54 of the foldable glass element 50. For example, the polymeric layer 70 can be disposed directly on the first primary surface 54 of the foldable glass element in some embodiments. In other embodiments, as depicted in exemplary form in FIGS. 1 and 1B, the polymeric layer 70 can be adhered to the foldable glass element 50 with an adhesive 80. The thickness 72 of the polymeric layer 70 can be set at about 1 micrometer (µm) to about 200 µm or less in some embodiments. In other embodiments, the thickness 72 of the polymeric layer 70 can be set from about 10 µm to about 100 µm. As is also evident to those with ordinary skill, the thickness 72 of the polymeric layer 70 can be configured to be from any level from about 1 µm to about 200 µm, and all ranges and sub-ranges between the foregoing values.

According to an additional implementation, the polymeric layer 70 can have a low coefficient of friction. In these configurations, the polymeric layer 70 is disposed on the first primary surface 54 of the glass element 50. When employed in the cover elements and foldable electronic devices of the disclosure, the polymeric layer 70 can serve to decrease friction and/or reduce surface damage from abrasion. The polymeric layer 70 can also provide a measure of safety in retaining pieces and shards of glass element 50 and/or layer 50a when the element and/or layer has been subjected to stresses in excess of its design limitations that cause failure. The thickness 72 of the polymeric layer 70 can be set at 1 micrometer (µm) or less in some aspects. In other aspects, the thickness 72 of the polymeric layer 70 can be set at 500 nm or less, or as low as 10 nm or less for certain compositions. Further, in some aspects of the foldable electronic device assembly 200 and the cover element 100, the polymeric layer 70 can be employed on the primary surface 56 to provide a safety benefit in retaining shards of glass element 50 and/or layer 50*a* that have resulted from stresses in excess of their design requirements. The polymeric layer 70 on the primary surface 56 may also provide to the cover element 100 an increased resistance to puncture. Not wishing to be bound by theory, the polymeric layer 70 may have energy absorbing and/or dissipating and/or distributing characteristics that allow the cover element 100 to take a load that it would otherwise not be able to withstand without the polymeric layer 70. The load may be either static or dynamic, and may be applied on the side of the cover element 100 having the polymeric layer 70.

As deployed in the foldable electronic device assembly 200 and the cover element 100 depicted in FIGS. 1 and 1B, the polymeric layer 70, according to some embodiments, can provide a measure of safety in retaining pieces and shards of the foldable glass element 50 and/or layer 50*a* in the event that the element and/or layer has been subjected to stresses in excess of its design limitations that cause failure, as configured within the device assembly 200 and cover element 100. Further, in some embodiments of the foldable electronic device assembly 200 and cover element 100, an additional polymeric layer 70 (not shown) can be employed on the second primary surface 56 of the foldable glass element 50 to provide an additional safety benefit in retaining shards of glass element 50 and/or layer 50*a* (i.e., as located on or in proximity to the second primary surface 56) that have resulted from stresses in excess of their design requirements.

The polymeric layer 70 on the primary surface 56 of the foldable glass element 50 employed in the foldable electronic device assembly 200 and the cover element 100, as depicted in FIGS. 1 and 1B, also functions to provide to the assembly and element with an increased resistance to impacts and puncture. Not wishing to be bound by theory, the polymeric layer 70 may have energy absorbing and/or dissipating and/or distributing characteristics that allow the foldable electronic device assembly 200 and the cover element 100 to take a load that it would otherwise not be able to withstand without the polymeric layer 70. The load may be either static or dynamic, and may be applied on the side of the foldable electronic device assembly 200 and the cover element 100 having the polymeric layer 70. Similarly, the presence of the polymeric layer 70 can ensure that objects and other instrumentalities that might otherwise directly impact the foldable glass element 50 are impacted against the polymeric layer 70. This can provide a benefit in terms of reducing the likelihood of the development of impact-related flaws, defects and the like in the foldable glass element 50 that might otherwise reduce its strength in static and/or cyclic bending. Still further, the presence of the polymeric layer 70 also can serve to spread a stress field from an impact over a larger area of the underlying foldable glass element 50 and any foldable electronic device substrate 150, if present. In some embodiments, the presence of the polymeric layer 70 can reduce the likelihood of damage to electronic components, display features, pixels and the like contained within a foldable electronic device substrate 150.

According to some embodiments, the foldable electronic device assembly 200 and/or cover element 100 depicted in FIGS. 1 and 1B (i.e., as including the polymeric layer 70) can withstand greater pen drop heights in comparison to a comparative foldable electronic device assembly 200 and/or cover element 100 without a polymeric layer, such as polymeric layer 70. More particularly, these pen drop heights can be measured according to a Drop Test 1. As described and referred to herein, a Drop Test 1 is conducted such that samples of the cover element or foldable electronic device assembly, as the case may be, are tested with the load (i.e., from a pen dropping at a certain height) imparted to the side of the foldable glass element (e.g., foldable glass element 50) having the polymeric layer 70 thereon (when such layer was part of the stack), with the opposite side of the cover element or device assembly being supported by an aluminum plate (6063 aluminum alloy, as polished to a surface roughness with 400 grit paper). No tape is used on the side of the glass element resting on the aluminum plate. One tube is used according to the Drop Test 1 to guide the pen to the sample, and the tube is placed in contact with the top surface of the sample so that the longitudinal axis of the tube is substantially perpendicular to the top surface of the sample. Each tube has an outside diameter of 2.54 cm (1 inch), an inside diameter of 1.4 cm (nine sixteenths of an inch) and a length of 90 cm. An acrylonitrile butadiene ("ABS") shim is employed to hold the pen at a desired height for each test (except for tests conducted at 90 cm, as no shim was used for this height). After each drop, the tube is relocated relative to the sample to guide the pen to a different impact location on the sample. The pen employed in the Drop Test 1 is a BIC® Easy Glide Pen, Fine, having a tungsten carbide, ball point tip of 0.7 mm diameter, and a weight of 5.73 grams as including the cap (4.68 g without the cap). According to the Drop Test 1, the pen is dropped with the cap attached to the top end (i.e., the end opposite the tip) so that the ball point can interact with the test sample. In a drop sequence according to the Drop Test 1, 1 pen drop is conducted at an initial height of 1 cm, followed by successive drops in 2 cm increments to a maximum pen drop height of 90 cm. Further, after each drop is conducted, the presence of any observable fracture, failure or other evidence of damage to the foldable electronic device assembly or cover element is recorded along with the particular pen drop height. More particularly, with regard to the device assemblies and cover elements of the disclosure, pen drop heights are recorded based on observed damage to the polymer layer, glass element and/or OLED-containing substrate. Under the Drop Test 1, multiple samples can be tested according to the same drop sequence to generate a population with improved statistics. Also according to the Drop Test 1, the pen is to be changed to a new pen after every 5 drops, and for each new sample tested. In addition, all pen drops are conducted at random locations on the sample at or near the center of the sample, with no pen drops near or on the edge of the samples.

According to some embodiments, the foldable electronic device assembly 200 and/or cover element 100 depicted in FIGS. 1 and 1B (i.e., as including the polymeric layer 70) can withstand a pen drop height of at least 1.5 times that of a control pen drop height associated with a comparative foldable electronic device assembly 200 and/or cover element 100 without a polymeric layer, such as polymeric layer 70, in which all pen drop heights are measured according to the Drop Test 1 outlined herein. Further, in some embodiments, a foldable electronic device assembly 200 and/or a cover element 100 can withstand a pen drop height of greater than 5 cm, 6 cm, 7 cm, 8 cm, 9 cm, 10 cm, 11 cm, 12 cm, 13 cm, 14 cm, 15 cm, 20 cm, 21 cm, 22 cm, 23 cm, 24 cm, 25 cm and all pen drop heights between these levels, as measured according to the Drop Test 1.

According to some embodiments, the polymeric layer 70 can employ any of a variety of energy-resistant polymeric materials. In some embodiments, the polymeric layer 70 is selected with a polymeric composition having a high optical transmissivity, particularly when the foldable electronic device assembly 200 or the cover element 100 including the layer 70 is employed in a display device or related application. According to some embodiments, the polymeric layer 70 comprises a polyimide ("PI"), a polyethylene terephthalate ("PET"), a polycarbonate ("PC") or a poly methyl methacrylate ("PMMA"). The layer 70, in some embodiments, can also be coupled to the foldable glass element 50 by an adhesive 80, as shown in FIGS. 1 and 1B.

According to another implementation, the polymeric layer 70 can employ various fluorocarbon materials that are known to have low surface energy, including thermoplastics for example, polytetrafluoroethylene ("PTFE"), fluorinated ethylene propylene ("FEP"), polyvinylidene fluoride ("PVDF"), and amorphous fluorocarbons (e.g., DuPont® Teflon® AF and Asahi® Cytop® coatings) which typically rely on mechanical interlocking mechanisms for adhesion. Layer 70 can also be fabricated from silane-containing preparation for example, Dow Corning® 2634 coating or other fluoro- or perfluorosilanes (e.g., alkylsilanes) which can be deposited as a monolayer or a multilayer. In some aspects, layer 70 can include silicone resins, waxes, polyethylene (oxidized), PET, polycarbonate (PC), PC with hard coat (HC) thereon, polyimide (PI), PI with HC, or adhesive tape (for example, 3M® code 471 adhesive tape), used by themselves or in conjunction with a hot-end coating for example, tin oxide, or vapor-deposited coatings for example, parylene and diamond-like coatings ("DLCs"). Layer 70 can also include zinc oxide, molybdenum disulfide, tungsten disulfide, hexagonal boron nitride, or aluminum magnesium boride that can be used either alone or as an additive in the foregoing coating compositions and preparations.

Still further, the polymeric layer 70 may be applied directly to the glass element 50 (as when the material of layer 70 is applied as a liquid, for example), may be placed atop the glass element 50 (as when the material of layer 70 is in the form of a sheet or film, for example), or may be bound to the glass layer 50 using an adhesive (e.g., adhesive 80), for example. When present, the adhesive 80 may be optically clear, pressure sensitive, or combinations thereof.

Alternatively or in addition to the above, the polymeric layer 70 may include various other attributes, such as anti-microbial, anti-splinter, anti-smudge, and anti-fingerprint characteristics. Moreover, the polymeric layer 70 itself may be made of more than one layer, or may be made of different materials within one layer, so as to provide a variety of functions for the foldable electronic device assembly 200 or the cover element 100, as the case may be.

In some embodiments, the foldable electronic device assembly 200 and the cover element 100 depicted in FIGS. 1 and 1B can include a foldable glass element 50 having a compressive stress region 60 with a maximum flaw size of 5 µm or less at the first primary surface 54a of the glass layer 50. The maximum flaw size can also be held to 2.5 µm or less, 2 µm or less, 1.5 µm or less, 0.5 µm or less, 0.4 µm or less, and all ranges and sub-ranges between the foregoing values, or even smaller flaw size ranges. Reducing the flaw size in the compressive stress region of the glass element 50, the layer 50a and/or the layers 50a can further reduce the propensity of these elements and/or layers to fail by crack propagation upon the application of tensile stresses by virtue of bending forces, for example, bending forces 42 (see FIG. 1A). In addition, some embodiments of foldable electronic device assembly 200 and the cover element 100 can include a surface region with a controlled flaw size distribution (e.g., flaw sizes of 0.5 µm or less at the first primary surface 54a of the glass layer 50a) that also lacks the superposition of a compressive stress region.

Referring again to FIG. 1A, bending forces 42 applied to the foldable electronic device assembly 200 and cover element 100 result in bending stresses, $\sigma_B$, at the first primary surface 54 of the foldable glass element 50 in tension. Tighter bending radii 40 lead to higher tensile, bending stresses, $\sigma_B$. Equation (1) below can be used to estimate the maximum tensile stresses, $\sigma_{max}$, in the device assembly 200 or the cover element 100, particularly at the first primary surface 54 of the foldable glass element 50, as subjected to bending with a constant bend radius 40 and assuming little to no influence from the polymeric layer 70, adhesive(s) 80, device substrate 150 and scratch-resistant coating 90. In view of these assumptions and considerations, Equation (1) is given by:

$$\sigma_{max} = \frac{E}{1-v^2}\frac{h}{2}\frac{1}{R} \tag{1}$$

where E is the Young's modulus of the glass element 50, v is the Poisson's ratio of the glass element 50 (typically v is ~0.2-0.3 for most glass compositions), h is reflective of the thickness 52 of the glass element, and R is the bend radius of curvature (comparable to bend radius 40). In Equation (1), R is assumed to be constant as the device assembly 200 and/or cover element 100 is bent around a hypothetical, perfectly cylindrical mandrel between two parallel plates. Without being bound by theory, those with ordinary skill would also recognize that the radius, R, can be non-constant during a bend evolution, either from an application-related bend or testing between two parallel plates. Equation (1A) below can account for these non-uniformities:

$$\sigma_{max} = 1.198\frac{E}{1-v^2}\left[\frac{t}{(D-t)}\right] \tag{1A}$$

where E is the modulus of the material in GPa, v is the Poisson's ratio of the material, t is the thickness of the material in mm, and D is the separation distance (in mm) between the parallel plates. Equation (1A) is the maximum stress in a parallel plate bend apparatus, and is different from that in Equation (1) because it accounts for the fact that the sample will not achieve a uniform constant bend radius (as was assumed for Equation (1)) in a parallel plate test apparatus, but will have a smaller minimum radius. The minimum radius (R) is defined as D−h=2.396 R, wherein h is the glass element thickness in mm and is the same as t. The minimum radius R, determined for a given plate separation can be used in Equation (1) to determine maximum stress. More generally, it is evident from Equations (1) and (1A) that maximum bending stresses are linearly dependent on the thickness 52 of the glass element and elastic modulus, and inversely dependent on the bend radius 40 of curvature of the glass element.

The bending forces 42 applied to the foldable electronic device assembly 200 and the cover element 100 could also result in the potential for crack propagation leading to instantaneous or slower, fatigue failure mechanisms. The presence of flaws at the first primary surface 54, or just beneath the surface, of the foldable glass element 50 can contribute to these potential failure modes. Using Equation (2) below, it is possible to estimate the stress intensity factor, K, in a foldable glass element 50 subjected to bending forces 42. Equation (2) is given by:

$$K = Y\sigma\sqrt{\pi a} = \frac{YE}{1-v^2}\frac{h}{2}\frac{1}{R}\sqrt{\pi a} \qquad (2)$$

where a is the flaw size, Y is a geometry factor (generally assumed to be 1.12 for cracks emanating from a glass edge, a typical failure mode), and a is the bending stress associated with the bending forces 42 as estimated using Equation (1). Equation (2) assumes that the stress along the crack face is constant, which is a reasonable assumption when the flaw size is small (e.g., <1 µm). When the stress intensity factor K reaches the fracture toughness of the glass element 50, $K_{IC}$, instantaneous failure will occur. For most compositions suitable for use in glass element 50, $K_{IC}$ is ~0.7 MPa√m. Similarly, when K reaches a level at or above a fatigue threshold, $K_{threshold}$, failure can also occur via slow, cyclic fatigue loading conditions. A reasonable assumption for $K_{threshold}$ is ~0.2 MPa√m. However, $K_{threshold}$ can be experimentally determined and is dependent upon the overall application parameters (e.g., a higher fatigue life for a given application can increase $K_{threshold}$). In view of Equation (2), the stress intensity factor can be reduced by reducing the overall tensile stress level and/or the flaw size at the surface of the foldable glass element 50.

According to some embodiments of foldable electronic device assembly 200 and cover element 100, the tensile stress and stress intensity factor estimated through Equations (1) and (2) can be minimized through the control of the stress distribution at the first primary surface 54 of the foldable glass element 50. In particular, a compressive stress profile (e.g., a compressive stress region 60) at and below the first primary surface 54 is subtracted from the bending stress calculated in Equation (1). As such, overall bending stress levels are reduced which, in turn, also reduces the stress intensity factors estimated through Equation (2). According to some embodiments of the foldable electronic device assembly 200 and cover element 100, the foldable glass element 50 is characterized by a stress profile such that when the glass element 50 is bent to a target bend radius 40 of from 1 mm to 20 mm, with the center of curvature on the side of the second primary surface 54 so as to induce a bending stress $\sigma_B$ at the first primary surface in tension, $\sigma_I+\sigma_B$<400 MPa (in tension). According to some embodiments, the foldable electronic device assembly 200 and/or the cover element 100 is configured such that $\sigma_I+\sigma_B$<0 MPa at the first primary surface 54 of the foldable glass element 50, at the second primary surface 56 of the glass element, or at both of the primary surfaces 54, 56. The cover element can also be configured such that $\sigma_I+\sigma_B$<0 MPa to a depth of at least 1 µm below the first primary surface 54 of the glass element, the second primary surface 56 of the glass element, or below both of the primary surfaces 54, 56.

As also depicted in FIGS. 1 and 1B, the foldable electronic device assembly 200 includes a foldable electronic device substrate 150 having a thickness 152. In some embodiments, the foldable substrate includes one or more foldable features. In other embodiments, as shown in FIGS. 1 and 1B, the device substrate 150 includes a plurality of organic light-emitting diode ("OLED") elements 160. The device substrate 150, for example, can include a flexible display, printed circuit board, housing and/or other features associated with a flexible, electronic device. When the foldable electronic substrate 150 is configured as part of an electronic display, for example, the foldable electronic device assembly 200 housing the substrate 150 can be substantially transparent. In some embodiments, the foldable electronic device assembly 200 is a wearable electronic device, such as a watch, wallet or bracelet, that includes or otherwise incorporates the cover element 100 described according to the foregoing. As defined herein, "foldable" includes complete folding, partial folding, bending, flexing, and multiple-fold capabilities.

According to some embodiments, the foldable electronic device assembly 200 and the cover element 100 depicted in FIGS. 1 and 1B may include a scratch-resistant coating 90 disposed over the polymeric layer 70. The coating 90 can be configured with a thickness 92, set to 1 µm or less in some embodiments. In other embodiments, the thickness 92 of the coating 90 can be set at 500 nm or less, or as low as 10 nm or less, and all ranges and sub-ranges between the foregoing values, for certain compositions of the coating 90. In other embodiments, the coating 90 has a thickness 92 that ranges from about 1 µm to about 100 µm, including all thickness levels between these bounds. More generally, the scratch-resistant coating 90 can serve to provide additional scratch-resistance (e.g., as manifested in increased pencil hardness as tested according to ASTM Test Method D3363 with a load of at least 750 g) for the foldable electronic device assembly 200 and cover element 100 employing it. Moreover, the scratch-resistant coating 90 can also enhance the impact resistance of the foldable electronic device assembly 200 and the cover element 100, as quantified by the Drop Test 1 described herein. The added scratch resistance (and additional impact resistance in some embodiments) can be advantageous for the device assembly 200 and the cover element 100 to ensure that the significant gains in puncture and impact resistance afforded by the polymeric layer 70 are not offset by reduced scratch resistance (e.g., as compared to a device assembly and/or cover element that would otherwise lack the polymeric layer 70).

In some embodiments, the scratch-resistant coating 90 can comprise a silane-containing preparation for example, Dow Corning® 2634 coating or other fluoro- or perfluorosilanes (e.g., alkylsilanes) which can be deposited as a monolayer or a multilayer. Such silane-containing formulations, as used herein, can also be referred to as a hard coating ("HC"), while recognizing that other formulations, as understood in the field of the disclosure, can also constitute a hard coating. In some embodiments, the scratch-resistant coating 90 can include silicone resins, waxes, polyethylene (oxided), a PET, a polycarbonate (PC), a PC with an HC component, a PI, and a PI with an HC component, or adhesive tape (for example, 3M® code 471 adhesive tape), used by themselves or in conjunction with a hot-end coating for example, tin oxide, or vapor-deposited coatings for example, parylene and diamond-like coatings ("DLCs"). Still further, the scratch-resistant coating 90 may also include a surface layer with other functional properties, including, for example, additional fluorocarbon materials that are known to have low surface energy, including thermoplastics for example, polytetrafluoroethylene ("PTFE"), fluorinated ethylene propylene ("FEP"), polyvinylidene fluoride ("PVDF"), and amorphous fluorocarbons (e.g., DuPont® Teflon® AF and Asahi® Cytop® coatings) which typically rely on mechanical interlocking mechanisms for adhesion. In some additional embodiments, the scratch-resistant coating 90 can include zinc oxide, molybdenum disulfide, tungsten disulfide, hexagonal boron nitride, or aluminum magnesium boride that can be used either alone or as an additive in the foregoing coating compositions and preparations.

In certain embodiments of the foldable electronic device assembly 200 and the cover element 100 depicted in FIGS. 1 and 1B, the scratch-resistant coating 90 has a pencil hardness of at least 5H (as measured according to ASTM Test Method D3363 with a load of at least 750 g). According to some embodiments, the scratch-resistant coating 90 can exhibit a pencil hardness of at least 6H, 7H, 8H, 9H, and all values between these hardness levels as measured according to ASTM Test Method D3363.

According to certain embodiments of the foldable electronic device assembly 200 and the cover element 100 depicted in FIGS. 1 and 1B, one or more adhesives 80 may be employed between the polymeric layer 70 and the foldable glass element 50, and/or between the foldable electronic device substrate 150 and the foldable glass element 50. Such adhesives can generally range in thickness from about 1 µm to 100 µm, in some embodiments. In other embodiments, the thickness of each adhesive 80 can range from about 10 µm to about 90 µm, from about 20 µm to about 60 µm, or, in some cases, any of the thickness values from 1 µm to 100 µm, and all ranges and sub-ranges between the foregoing values. In preferred embodiments, particularly for a foldable electronic device assembly 200 and cover element 100 configured for a display-type application, the adhesives 80 are substantially transmissive, such as optically clear adhesives ("OCA"), as understood by those with skill in the field of the disclosure.

Figure 1C:
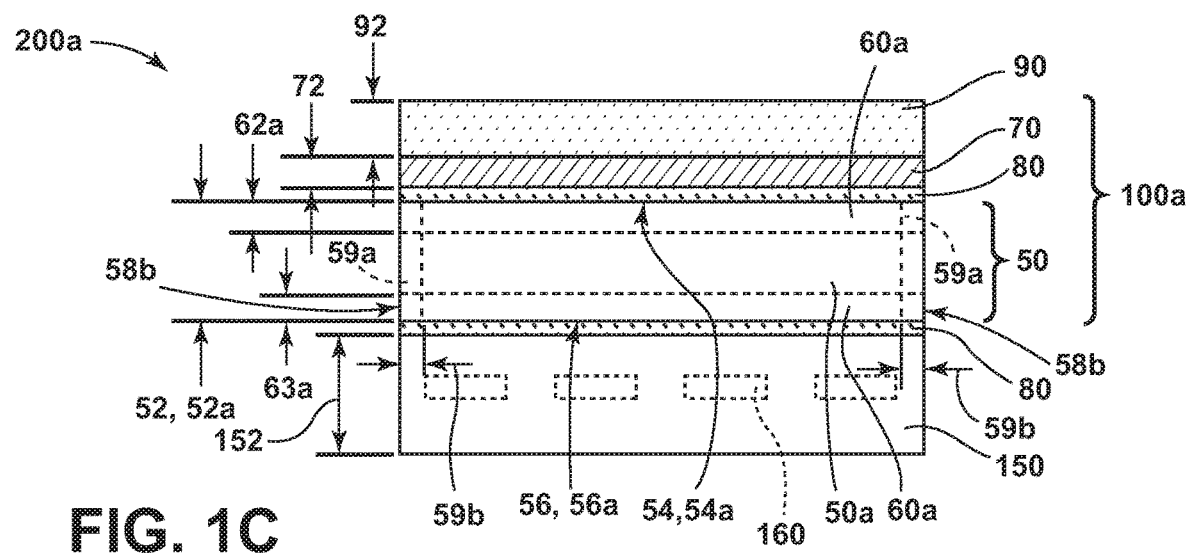
FIG. 1C is a cross-sectional view of the device assembly depicted in FIG. 1, as including a foldable glass element with compressive stress regions formed by an ion exchange process according to some embodiments.

Referring to FIG. 1C, a cross-section of a foldable electronic device assembly 200a and a cover element 100a is depicted that relies on an ion exchange process to develop a compressive stress region 60a. The device assembly 200a and the cover element 100a shown in FIG. 1C are similar to the device assembly 200 and the cover element 100 embodiments depicted in FIGS. 1-1B, and like-numbered elements have comparable structure and function. In the cover element 100a, however, the compressive stress region 60a of the foldable glass element 50 can be developed through an ion exchange process. That is, the compressive stress region 60a can include a plurality of ion-exchangeable metal ions and a plurality of ion-exchanged metal ions, the ion-exchanged metal ions selected so as to produce compressive stress in the region 60a. In some embodiments of the device assembly 200a and the cover element 100a, the ion-exchanged metal ions have an atomic radius larger than the atomic radius of the ion-exchangeable metal ions. The ion-exchangeable ions (e.g., $Na^+$ ions) are present in the foldable glass element 50 and the layer 50a before being subjected to the ion exchange process. Ion-exchanging ions (e.g., $K^+$ ions) can be incorporated into the foldable glass element 50 and layer 50a, replacing some of the ion-exchangeable ions. The incorporation of ion-exchanging ions, for example, $K^+$ ions, into the foldable glass element 50 and the layer 50a can be effected by submersing the element or the layer in a molten salt bath containing ion-exchanging ions (e.g., molten $KNO_3$ salt). In this example, the $K^+$ ions have a larger atomic radius than the $Na^+$ ions and tend to generate local compressive stresses in the glass wherever present.

Depending on the ion-exchanging process conditions employed, the ion-exchanging ions can be imparted from the first primary surface 54a down to a first ion exchange depth 62a, establishing an ion exchange depth-of-compression ("DOC") for the compressive stress region 60a. Similarly, a second compressive stress region 60a can be developed from the second primary surface 56a down to a second ion exchange depth 63a as depicted in FIG. 1C. Compressive stress levels within the DOC that far exceed 100 MPa can be achieved with such ion exchange processes, up to as high as 2000 MPa. As noted earlier, the compressive stress levels in the compressive stress region 60a (and a second region 60a when present) can serve to offset the tensile stresses generated in the cover element 100a, glass element 50 and glass layer 50a generated from bending forces 42, e.g., such that $\sigma_I+\sigma_B$<400 MPa (in tension), $\sigma_I+\sigma_B$<200 MPa (in tension), or even $\sigma_I+\sigma_B$<0 MPa.

Referring again to FIG. 1C, some embodiments of foldable electronic device assembly 200a and the cover element 100a can include one or more edge compressive stress regions 59a, each defined by a compressive stress of at least 100 MPa. An edge compressive stress region 59a in the foldable glass element 50 can be established from an edge 58b down to an edge depth 59b. Ion-exchanging processes similar in nature to those employed to generate the compressive stress region 60a can be deployed to generate an edge compressive stress region 59a. More specifically, the edge compressive stress region 59a can be used to offset tensile stresses generated at the edge 58b through, for example, bending of the glass element 50 across the face of the edge 58b. Alternatively, or as an addition thereto, without being bound by theory, the compressive stress region 59a may offset adverse effects from an impact or abrasion event at or to the edge 58b.

Figure 1D:
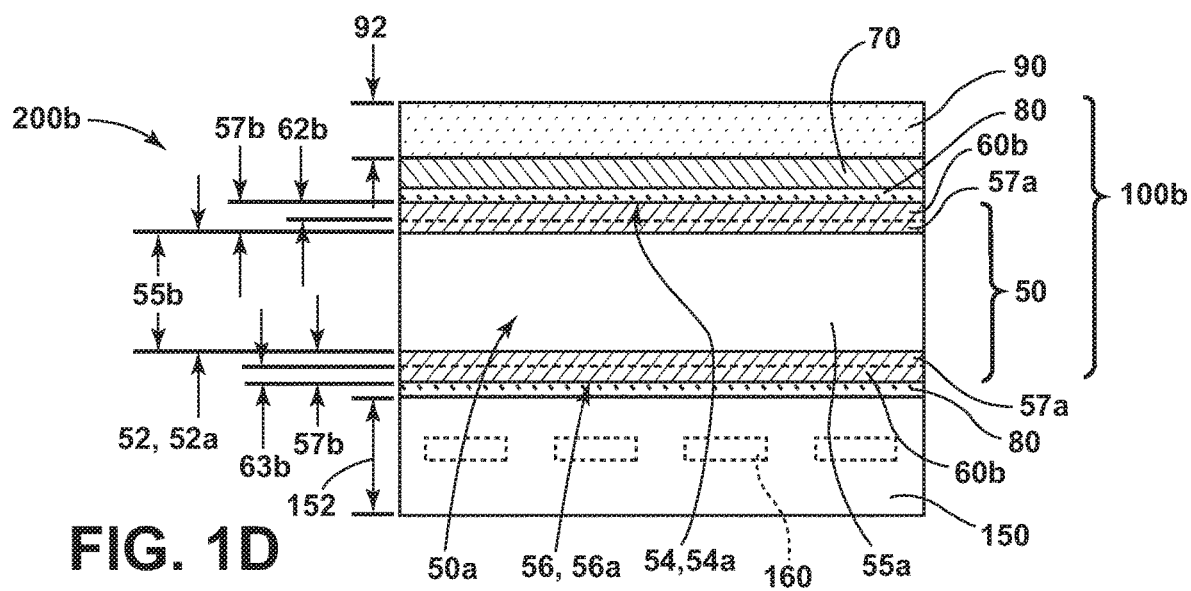
FIG. 1D is a cross-sectional view of the device assembly depicted in FIG. 1, as including a foldable glass element having a glass layer with a core region and two clad regions according to some embodiments.

In FIG. 1D, a foldable electronic device assembly 200b and cover element 100b is depicted that relies on a mismatch in the coefficient of thermal expansion ("CTE") between regions of the glass layer 50a to develop compressive stress regions 60b. The device assembly 200b and cover element 100b depicted in FIG. 1D are both similar to the foldable electronic device assembly 200 and the cover element 100 depicted in FIGS. 1-1B, and like-numbered elements have comparable structure and function. In the device assembly 200b and the cover element 100b, however, the compressive stress regions 60b of the foldable glass element 50 can be developed via the tailored structure of glass layer 50a which relies on CTE differences within the layer 50a itself. In particular, the glass layer 50a includes a core region 55a and a first and a second clad region 57a disposed on the core region 55a. Notably, the CTE of the core region 55a is greater than the CTE of the clad regions 57a. After the glass layer 50a is cooled during fabrication, the CTE differences between the core region 55a and the clad regions 57a cause uneven volumetric contraction upon cooling, leading to the development of compressive stress regions 60b in the clad regions 57a, below the respective first and second primary surfaces 54a and 56a as shown in FIG. 1D. Put another way, the core region 55a and the clad regions 57a are brought into intimate contact with one another at high temperatures; and regions 55a and 57a are then cooled to a low temperature such that the greater volume change of the high CTE core region 55a relative to the low CTE clad regions 57a creates the compressive stress regions 60b in the clad regions 57a.

Referring again to FIG. 1D, the CTE-developed compressive stress regions 60b reach from the first primary surface of the glass layer 54a down to a CTE region depth 62b, and from the second primary surface 56a down to a CTE region depth 63b, thus establishing CTE-related DOCs. In some embodiments, the compressive stress levels in the compressive stress regions 60b can exceed 150 MPa. Maximizing the difference in CTE values between the core region 55a and the clad regions 57a can increase the magnitude of the compressive stress developed in the compressive stress regions 60b upon cooling of the foldable glass element 50 after fabrication, which benefits the reliability and performance of the foldable electronic device assembly 200b and the cover element 100b depicted in FIG. 1D.

In some embodiments of foldable electronic device assembly 200b and the cover element 100b, the core region 55a has a core region thickness 55b and the clad regions 57a have a clad thickness 57b as shown in FIG. 1D. In these embodiments, it is preferable to set a thickness ratio of greater than or equal to 3 for the core region thickness 55b divided by the sum of the clad region thicknesses 57b. As such, maximizing the size of the core region 55a and/or its CTE relative to the size and/or CTE of the clad regions 57a can serve to increase the magnitude of the compressive stress levels observed in the compressive stress regions 60b of the device assembly 200b and the cover element 100b.

Figure 2:
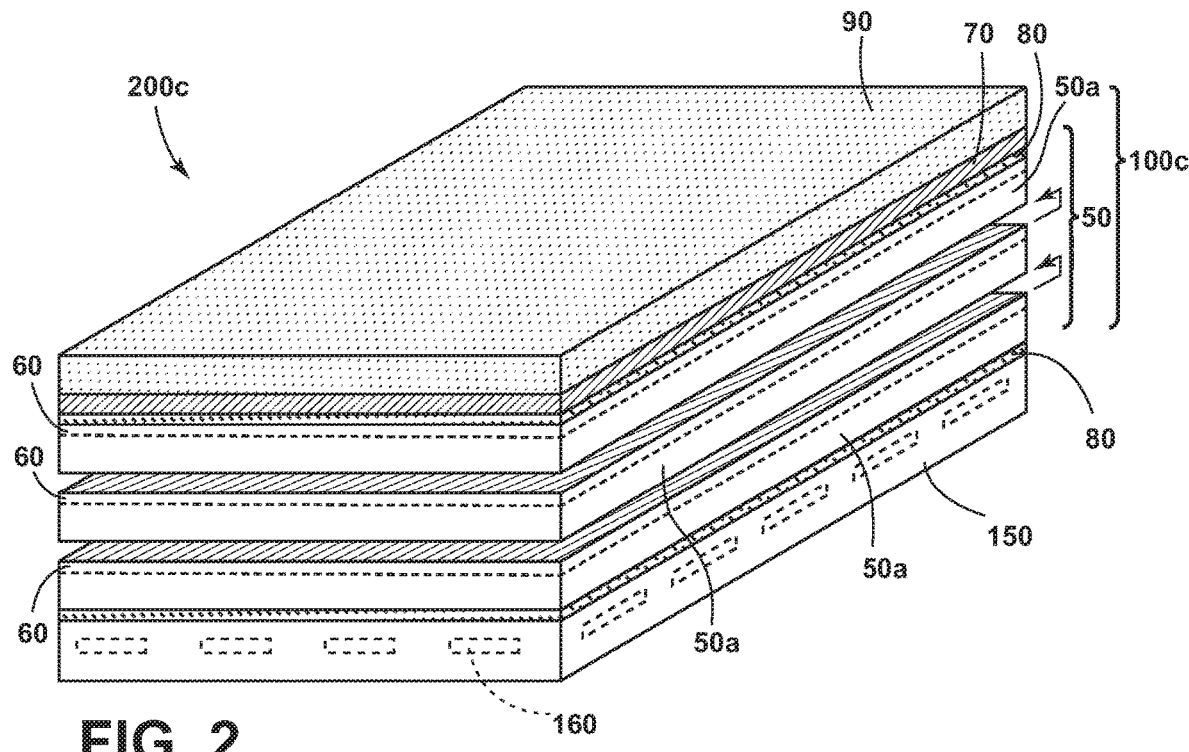
FIG. 2 is a perspective view of a foldable electronic device assembly comprising a foldable glass element with three glass layers, a polymeric layer and a foldable electronic device substrate according to some embodiments of this disclosure.
Figure 2A:
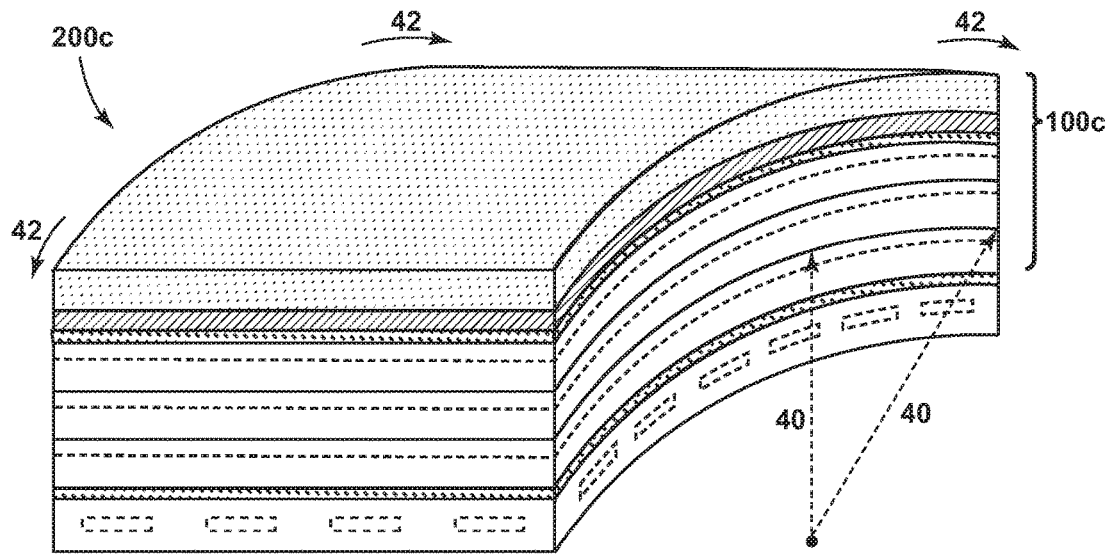
FIG. 2A is a perspective view of the device assembly depicted in FIG. 2 subjected to bending forces with a center of curvature on the substrate side of the assembly.

According to some embodiments, FIGS. 2 and 2A depict a foldable electronic device assembly 200c and a cover element 100c with a foldable glass element 50 having multiple glass layers 50a (e.g., two layers 50a, three layers 50a, four layers 50a, and so on). The device assembly 200c and cover element 100c depicted in FIGS. 2 and 2A are both similar to the foldable electronic device assembly 200 and the cover element 100 depicted in FIGS. 1-1B, and like-numbered elements have comparable structure and function. As shown in FIGS. 2 and 2A, the three glass layers 50a, stacked together, make up the foldable glass element 50. A compressive stress region 60 can be present in each layer 50a as shown in FIG. 2. The layers 50a can be stacked directly together or, in some embodiments, compliant interlayers can be disposed between them. Further, in some embodiments of device assembly 200c and the cover element 100c, a compressive stress region 60 is not required in all layers 50a within the glass element 50. Preferably, a compressive stress region 60 is present in the topmost layer 50a of the element 50 (e.g., the portion one the outside of the bend). In addition, it is also preferable in some embodiments to include edge compressive stress regions 59a (see FIG. 1C and the corresponding description), compressive stress regions 60a (see FIG. 1C and the corresponding description), and/or compressive stress regions 60b (see FIG. 1D and the corresponding description) in one or more layers 50a.

In general, the layers 50a of the foldable electronic device assembly 200c and the cover element 100c depicted in FIGS. 2 and 2A are configured to allow movement with respect to one another upon bending of the foldable glass element 50 (see FIG. 2A); or the layers 50a are loosely coupled to one another. The collective thickness of the foldable glass element 50 obtained through the stacking of layers 50a can increase the resistance of the element 50 to puncture, as each layer 50a supports the layer above it. Further, the ability of the glass layers 50a to move relative to one another during bending reduces the amount of tensile stress generated in each layer 50a upon bending to a bend radius 40. This is because the thickness of each layer 50a (rather than the thickness of element 50) is the contributing factor in generating the tensile stress in that layer, as estimated by Equation (1). Because each layer 50a is generally decoupled, in terms of generating bending stresses, from its adjacent layer 50a, some embodiments of the device assembly 200c and the cover element 100c incorporate a compressive stress region 60 within each layer 50a present in the assembly and cover element, as the case may be.

Figure 3:
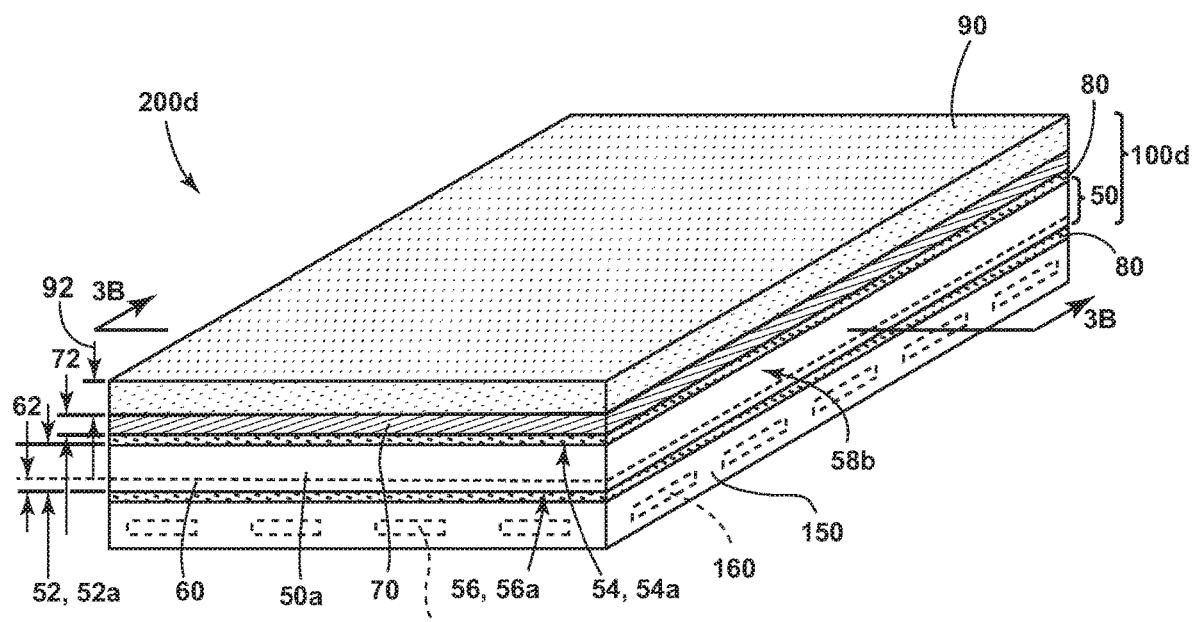
FIG. 3 is a perspective view of a foldable electronic device assembly comprising a foldable glass element, a polymeric layer and a foldable electronic device substrate according to some embodiments of this disclosure.
Figure 3A:
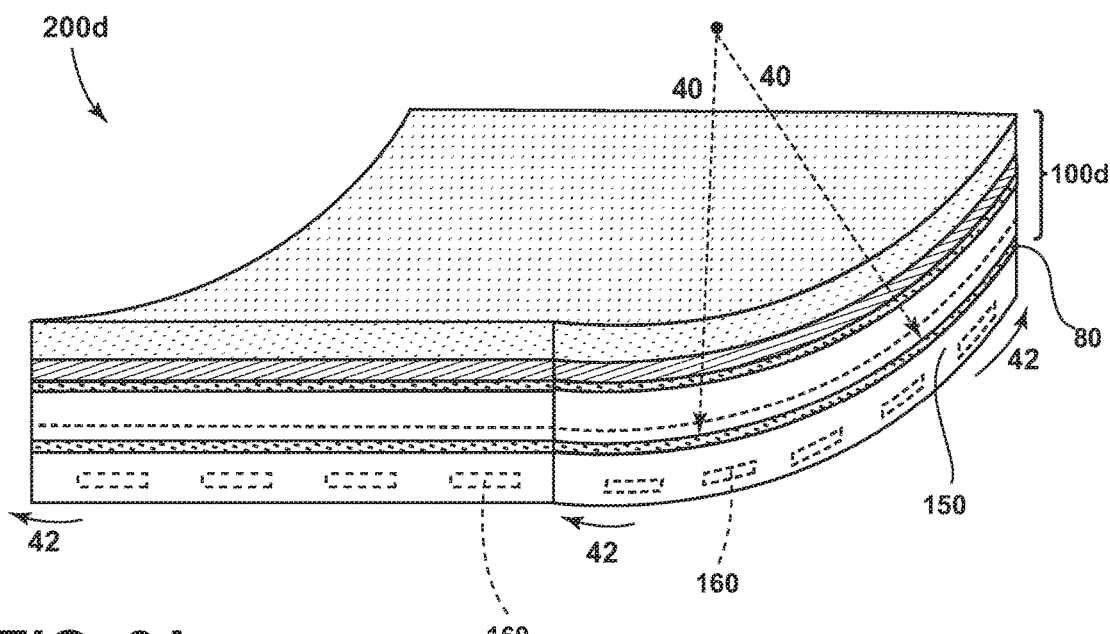
FIG. 3A is a perspective view of the device assembly depicted in FIG. 3 subjected to bending forces with a center of curvature on the polymeric layer side of the assembly.
Figure 3B:
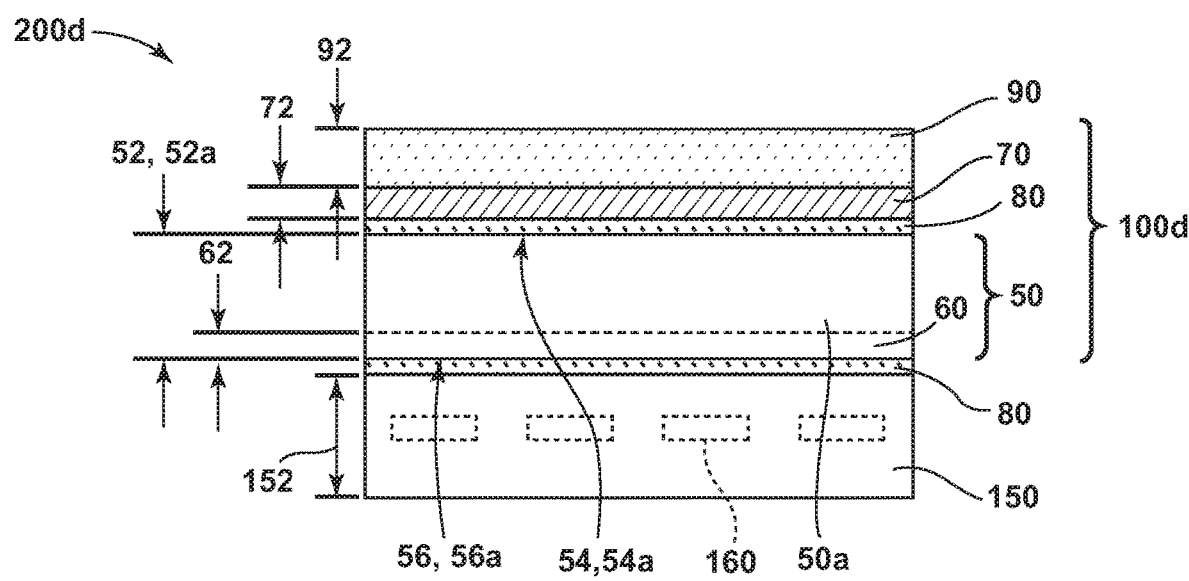
FIG. 3B is a cross-sectional view of the device assembly depicted in FIG. 3.

Referring now to FIGS. 3-3B, a foldable electronic device assembly 200d and a cover element 100d is depicted. The device assembly 200d and cover element 100d depicted in FIGS. 3-3B are both similar to the foldable electronic device assembly 200 and the cover element 100 depicted in FIGS. 1-1B, and like-numbered elements have comparable structure and function. A difference between the respective device assembly 200d and the cover element 100d, and the device assembly 200 and the cover element 100, is that the latter assembly and element are shown as bent in an 'out-fold' configuration (wherein the cover element is on the opposite side of the device substrate as is the center of curvature) in which the maximum bending stress in tension is associated with the first primary surface 54 of the foldable glass element 50. In contrast, the device assembly 200d and the cover element 100d, as shown in FIG. 3A, are bent in an 'in-fold' configuration (wherein the cover element is on the same side of the device substrate as is the center of curvature) in which the maximum bending stress in tension is associated with the second primary surface 56 of the foldable glass element 50. Accordingly, the device assembly 200d and the cover element 100d can include a foldable glass element 50 comprising a thickness 52 from about 25 µm to about 200 µm and a compressive stress region 60 extending from the second primary surface 56 of the glass element 50 to a first depth 62 in the glass element (see FIG. 3), the region defined by a stress, $\sigma_I$, of at least about 100 MPa in compression at the second primary surface of the glass element. As such, the location of the compressive stress region 60 in proximity to the second primary surface 56 of the foldable glass element 50 ensures that it can offset bending stresses at this location in tension when the device assembly 200d and the cover element 100d is bent in an 'in-fold' configuration (see FIG. 3A). Further, the glass element 50 is characterized by a stress profile such that when the glass element is bent to a target bend radius 40 of from 1 mm to 20 mm, with the center of curvature on the side of the first primary surface 54 so as to induce a bending stress, $\sigma_B$, at the second primary surface 56 in tension, $\sigma_I + \sigma_B < 200$ MPa (in tension).

Still further, the device assembly 200d and cover element 100d depicted in FIGS. 3-3B also includes a polymeric layer 70 comprising a thickness 72 from about 10 µm to about 100 µm and disposed over the first primary surface 54 of the foldable glass element 50. In addition, the device assembly 200d and the cover element 100d can be characterized by an ability to withstand a pen drop height of at least 1.5 times that of a control pen drop height of the cover element 100d without the layer 70, wherein the pen drop heights are measured according to a Drop Test 1, with the layer 70 disposed on the side of the glass element facing the pen.

Figure 4:
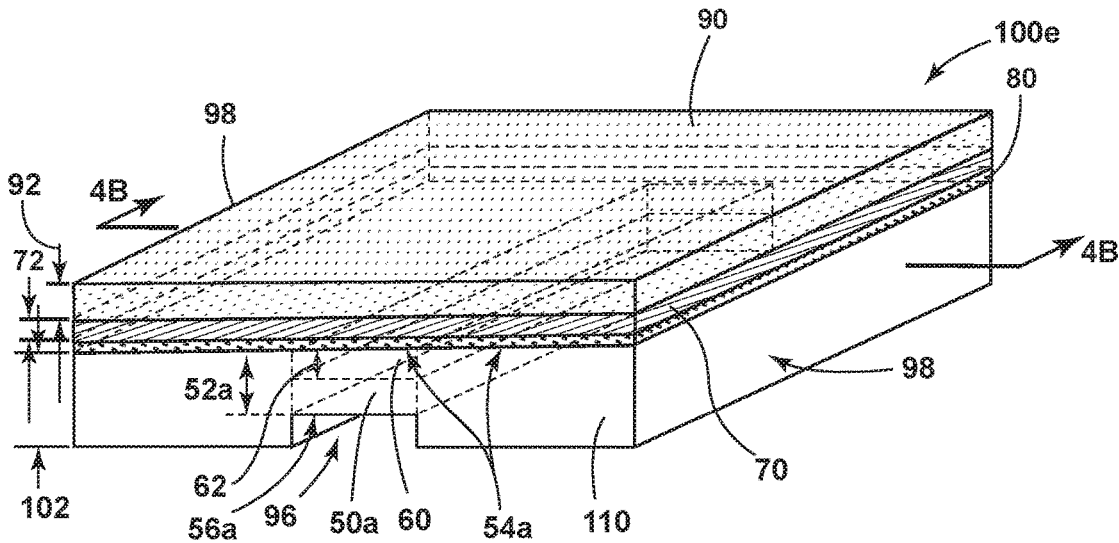
FIG. 4 is a perspective view of a cover element comprising a glass structure and a glass element according to an aspect of the disclosure.
Figure 4A:
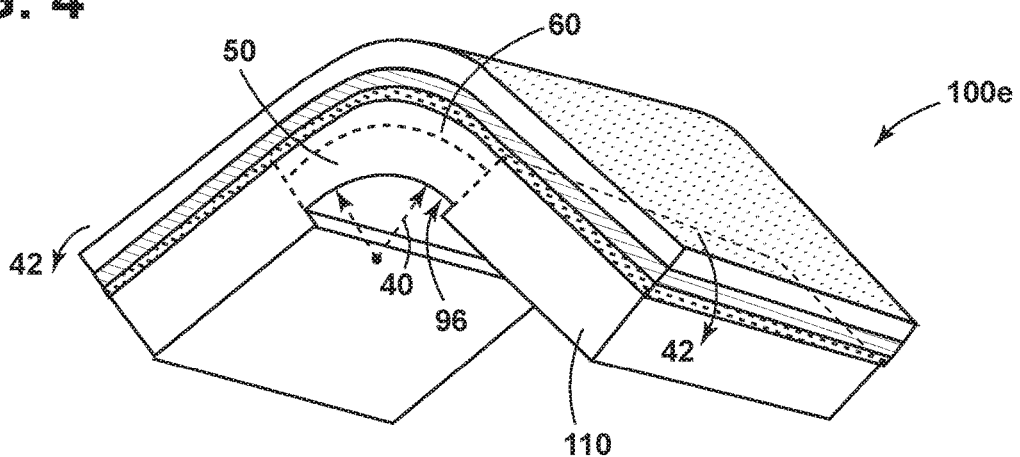
FIG. 4A is a perspective view of the cover element depicted in FIG. 4 subjected to bending forces.
Figure 4B:
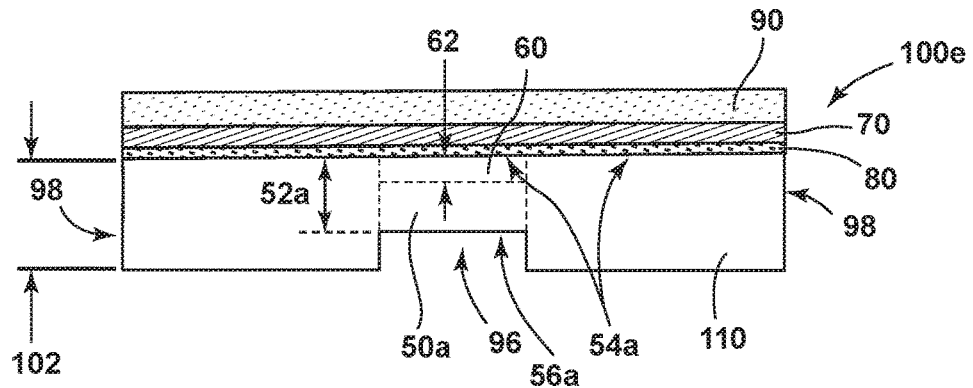
FIG. 4B is a cross-sectional view of the cover element depicted in FIG. 4.

Referring now to FIGS. 4 and 4B, a cover element (or glass article) 100e is depicted according to an additional aspect of this disclosure. In many respects, the cover element 100e is similar to the cover elements 100-100d (see FIGS. 1-3B), and like numbered elements have the same or similar structure unless otherwise noted. The cover element 100e includes a glass structure 110 having a thickness 102 that is greater than the thickness 52a of its glass layer 50a. Glass layer 50a includes a first primary surface 54a and a second primary surface 56a. The first primary surface 54a also can extend to the first primary surface of the glass structure 110. In some aspects, the glass structure 110 has a thickness 102 that is greater than or equal to 125 µm. According to an exemplary embodiment, the thickness 52a of the glass layer can be set from about 20 µm to about 125 µm. In certain aspects of cover element 100e, a polymeric layer 70 can be disposed on the first primary surface 54a of the glass layer 50a and glass structure 110. A polymeric layer 70 employed for this purpose in the cover element 100e has a comparable structure and function to the polymeric layer 70 outlined earlier in connection with the cover elements 100-100d. In addition, as depicted in exemplary form in FIGS. 4 and 4B, the polymeric layer 70 can be adhered to the foldable glass element 50 with an optional adhesive 80. As also depicted in exemplary form, the cover element 100e depicted in FIGS. 4 and 4B may optionally include a scratch-resistant coating 90 disposed over the polymeric layer 70. The coating 90 can be configured with a thickness 92, set to 1 µm or less in some embodiments. In other embodiments, the thickness 92 of the coating 90 can be set at 500 nm or less, or as low as 10 nm or less, and all ranges and sub-ranges between the foregoing values, for certain compositions of the coating 90. In other embodiments, the coating 90 has a thickness 92 that ranges from about 1 µm to about 100 µm, including all thickness levels between these bounds.

As shown in FIGS. 4 and 4B, the glass structure 110 and the glass layer 50a of the cover element/glass article 100e are monolithic with regard to one another. However, in some aspects, the glass structure 110 can be a separate component that is bonded or otherwise joined to glass layer 50a. Further, in cover element 100e, the glass layer 50a is arranged in a central region 96 of the glass structure 110, between the substantially parallel edges 98 of the glass structure. In some aspects, and as depicted in FIGS. 4 and 4B, the glass layer 50a and central region 96 are spaced some distance from each of the parallel edges 98. In other aspects, the glass layer 50a and central region 96 can be spaced closer to one edge 98 than the other substantially parallel edge 98.

In the cover element (or glass article) 100e depicted in FIGS. 4 and 4B, the glass layer 50a, as incorporated into the glass structure 110, is essentially the same as the glass layer 50a described in the foregoing in connection with cover elements 100, 100a and 100b. As such, the glass layer 50a employed in cover element 100e includes a compressive stress region 60, 60a or 60b that spans from the first primary surface 54a of the glass layer 50a down to the first depth 62a. According to some aspects of the cover element 100e, the compressive stress region 60, 60a, or 60b within the glass layer 50a can also span laterally into the glass structure 110. While not required in all aspects, the inclusion of the compressive stress region 60, 60a or 60b throughout the glass layer 50a and the glass structure 110 can provide a manufacturability benefit. For example, an ion exchange process could be employed to develop the compressive stress region 60 or 60a in both the glass layer 50a and the glass structure 110 in one submersion step.

As shown in FIG. 4A, the cover element 100e (or glass article) can be subjected to bending forces 42 that bend the glass layer 50a upon a constant bend radius 40. Since the thickness 52a of the glass layer 50a is generally smaller than the thickness 102 of the glass structure 110, the bending forces 42 tend to cause bending displacements in the glass layer 50a and little or no bending in the adjacent sections of the glass structure 110. As such, the bending stress and stress intensity levels are reduced at the first primary surface 54a of the glass layer 50a by virtue of minimizing the thickness 52a to levels below the thickness 102 of the glass structure 110. Nevertheless, the increased thickness 102 of the glass structure 110 provides additional puncture resistance for the majority of the cover element 100e (i.e., beyond that in the central region 96 containing the glass layer 50a).

In some additional aspects of cover element 100e, the central region 96 beneath the glass layer 50a and second primary surface 56a can be further reinforced with a generally non-compliant, polymeric layer. This reinforcement can tend to offset any reduced puncture resistance in the glass layer 50a relative to the puncture resistance of the glass structure 110. Further, the compressive stress region 60, 60a or 60b employed in the glass layer 50a of the cover element 100e can be developed through the ion exchange processes and/or CTE mismatch concepts outlined earlier in connection with cover elements 100a and 100b (see FIGS. 1C and 1D and the corresponding description).

Figure 5:
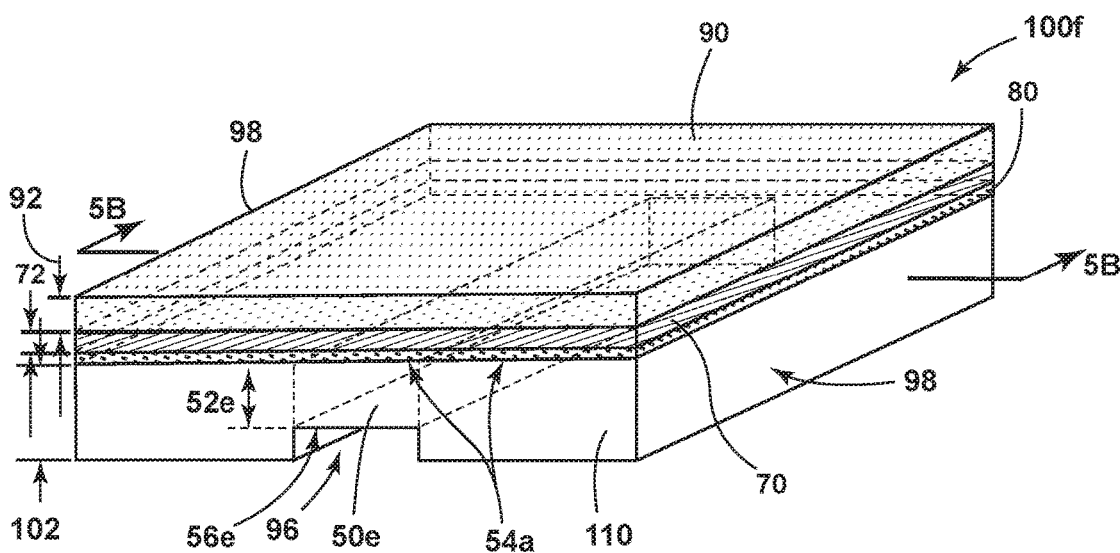
FIG. 5 is a perspective view of a cover element comprising a glass structure and a glass element according to an aspect of this disclosure.
Figure 5A:
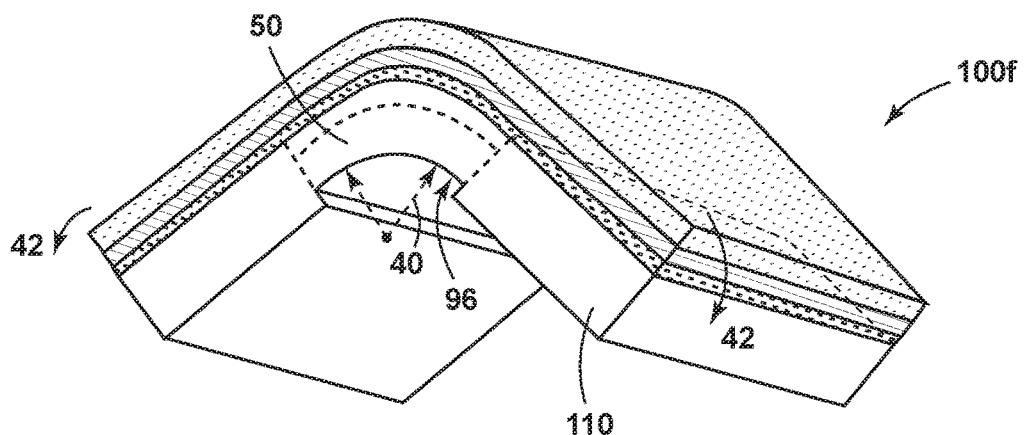
FIG. 5A is a perspective view of the cover element depicted in FIG. 5 subjected to bending forces.
Figure 5B:
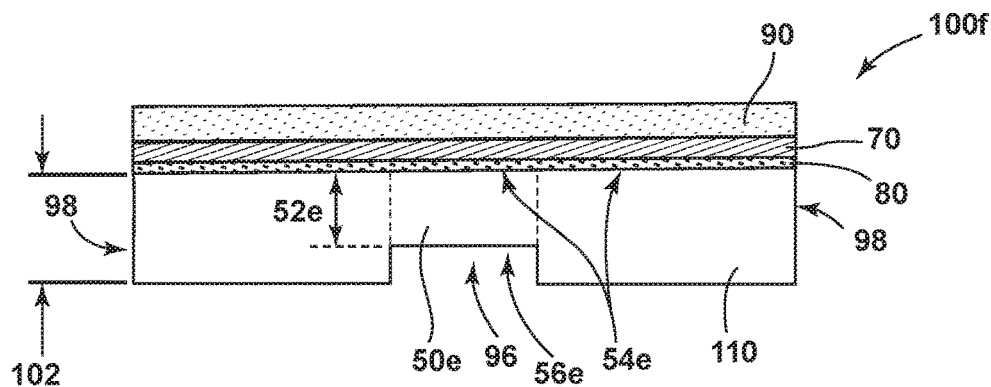
FIG. 5B is a cross-sectional view of the cover element depicted in FIG. 5.

As shown in FIGS. 5, 5A and 5B, a glass article or cover element 100f is provided that comprises: a glass layer 50e having a thickness 52e, a first primary surface 54e, and a second primary surface 56e. The first primary surface 54e also can extend to the first primary surface of the glass structure 110 (see FIGS. 5 and 5B). In some aspects, the glass structure 110 has a thickness 102 that is greater than or equal to 125 µm. According to an exemplary embodiment, the thickness 52e of the glass layer 50e can be set from about 20 µm to about 125 µm. In certain aspects of cover element 100f, a polymeric layer 70 can be disposed on the first primary surface 54e of the glass layer 50e and/or on one or both primary surfaces of glass structure 110. A polymeric layer 70 employed for this purpose in the cover element 100f has a comparable structure and function to the polymeric layer 70 outlined earlier in connection with the cover element 100. An additional polymeric layer 70 may also be disposed on the second primary surface 56e, according to some embodiments.

In the cover element (or glass article) 100f depicted in FIGS. 5 and 5B, the glass layer 50e, as incorporated into the glass structure 110, is essentially the same as the glass layer 50a described in the foregoing in connection with cover elements 100, 100a and 100b. Furthermore, the structure and arrangement of the cover element 100f is similar to the cover element 100e described earlier in connection with FIGS. 4, 4A and 4B. However, the glass layer 50e employed in cover element 100f does not include a compressive stress region 60.

As shown in FIG. 5A, the cover element 100f (or glass article) can be subjected to bending forces 42 that bend the glass layer 50e upon a constant bend radius 40. Since the thickness 52e of the glass layer 50e is generally smaller than the thickness 102 of the glass structure 110, the bending forces 42 tend to cause bending displacements in the glass layer 50e and little or no bending in the adjacent sections of the glass structure 110. As such, the bending stress and stress intensity levels are reduced at the first primary surface 54e of the glass layer 50e by virtue of minimizing the thickness 52e to levels below the thickness 102 of the glass structure 110.

In cover element 100f (or glass article), however, the increased thickness 102 of the glass structure 110 provides additional puncture resistance for the majority of the cover element (i.e., beyond that in the central region 96 containing the glass layer 50e). As demonstrated by the results depicted in FIG. 6, puncture resistance and glass thickness can be correlated. The results in FIG. 6 were generated by measuring the puncture resistance of various glass samples having thicknesses including 116, 102, 87, 71, 60, 49, 33 and 25 µm. These glass samples were prepared by etching 130 µm-thick glass samples to the foregoing thickness levels using an etching solution having 15 vol % HF and 15 vol % HCl. Puncture resistance testing was performed on each glass sample, as laminated to a 375 µm compliant layer stack to simulate the structure of a flexible display device. The 375 µm thick compliant layer stack consisted of the following layers: (a) a 50 µm thick PSA layer, (b) a 100 µm thick PET layer, and (c) a 100 µm thick PSA layer, and (d) a 125 µm thick PET layer. Once each glass sample (e.g., 116 µm thick glass, 102 µm thick glass, etc.) was laminated to the 375 µm thick compliant layer stack, a flat tip probe having a 200 µm diameter stainless steel tip was pushed into a primary surface of the glass sample opposite from the compliant layer stack. The tip was then advanced into the sample until failure (as verified by visual observation with an optical microscope) and the force at failure was measured (in units of kgf). The results from this testing were plotted in FIG. 6.

Figure 6:
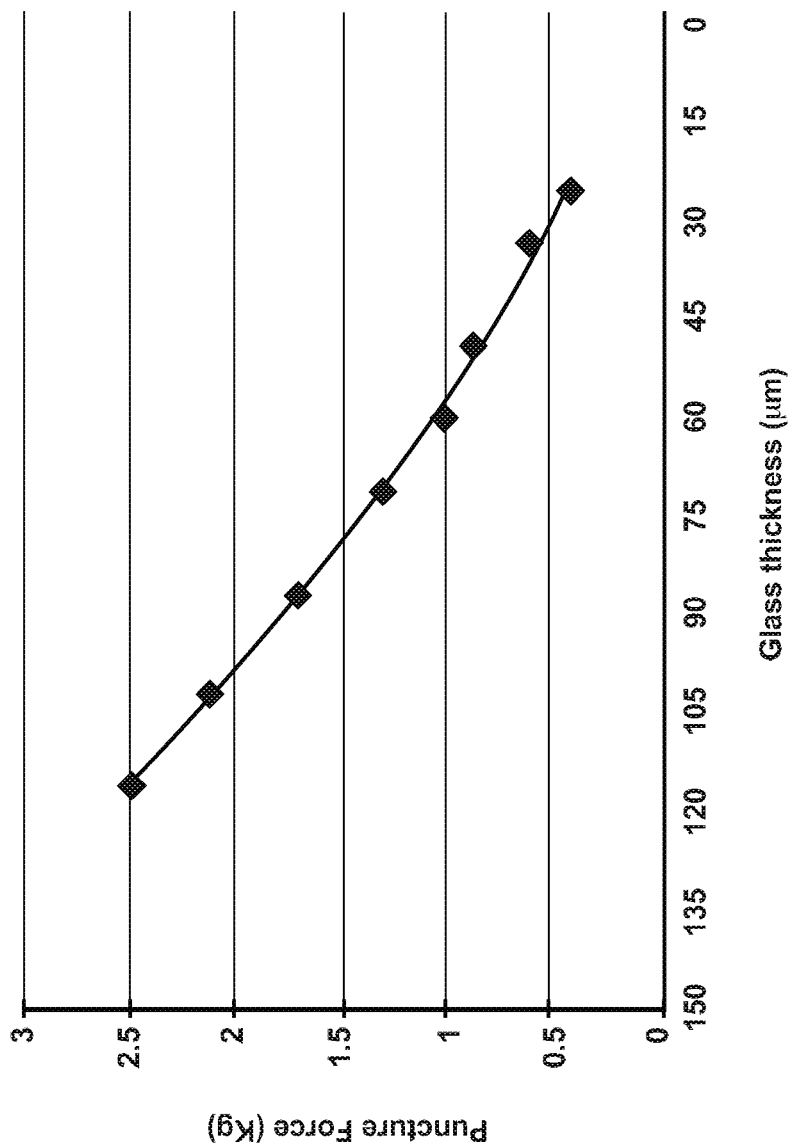
FIG. 6 is a plot of failure puncture load test data as a function of thickness of a glass layer according to an aspect of this disclosure.

As the results from FIG. 6 demonstrate, the puncture resistance of the glass samples decreased from about 2.5 kgf to about 0.4 kgf with decreasing glass layer thickness from about 116 µm to about 25 µm, respectively. Hence, the puncture resistance of these glass samples was highly dependent on glass thickness. In addition, FIG. 6 demonstrates that the puncture resistance for the tested glass substrate sample having a thickness of about 116 µm is about 2.5 kgf. It is evident through extrapolation that puncture resistance levels that can exceed 3 kgf can be obtained through the use of glass substrates having a thickness of 130 µm or greater. As such, one aspect of cover element 100*f* (see FIGS. 5, 5A and 5B) employs a glass structure 110 having a thickness of about 130 µm or greater to obtain a puncture resistance of 3 kgf (in the regions of cover element 100*f* beyond those in proximity to the central region 96 containing the thinner, glass layer 50*e*). In some additional aspects of the cover element 100*f*, the central region 96 beneath the glass layer 50*e* and second primary surface 56*e* can be further reinforced with a generally non-compliant, polymeric layer. This reinforcement can tend to offset any reduced puncture resistance in the glass layer 50*e* relative to the increased puncture resistance of the glass structure 110.

In the cover element 100*f* depicted in FIGS. 5, 5A and 5B, thickness 52*e* of the glass layer 50*e* is generally smaller than the thickness 102 of the glass structure 110. In one implementation of the cover element 100*f*, a bend radius of ≤2 mm for the cover element 100*f* is feasible with a thickness 52*e* of approximately 20 to 25 µm. To obtain such thickness levels for thickness 52*e*, while holding the thickness 102 at a higher value to maintain puncture resistance, a selective etching process can be conducted on the cover element 100*f*.

In one example selective etching process, one step is to provide a glass structure with a substantially constant thickness equal to the thickness 102 for the glass structure 110. Coating materials are then applied on the second primary surface 56*e* of the glass structure 110 in regions adjacent to the intended central region 96 of the glass structure 110 (i.e., the region that will be etched to the thickness 52*e*) to protect or otherwise mask these regions during a subsequent etching step. For example, these materials may be a film or ink that can be coated on the glass structure 110 by lamination or screen printing processes. One of ordinary skill in the art would readily understand what type of coating materials would be suitable for a particular etchant composition selected for the selective etching process for cover element 100*f*. By applying these coating materials or the like adjacent to the central region 96, only the central region 96 will be exposed to the acid employed in a subsequent etching step. In the subsequent etching step or steps, etching solutions according to the foregoing (e.g., 15 vol % HF and 15 vol % HCl) can be applied to the masked, glass structure for an appropriate time to achieve the desired thickness 52*e* in the glass layer 50*e*. After the selective etching has been completed (including washing off the etching solution with deionized water, for example), the masking materials can be peeled or otherwise stripped using a suitable stripper solution depending on the particular masking materials employed in the selective etching process.

Referring again to the selective etching process employed to produce a cover element 100*f*, the edges 98 can be left uncoated during the etching step or steps. As a result, these edges 98 are subjected to a light etch as the glass layer 50*e* is formed with a thickness 52*e*. This light etch to edges 98 can beneficially improve their strength. In particular, cutting or singling processes employed to section the glass structure before the selective etching process is employed can leave flaws and other defects within the surface of the glass structure 110. These flaws and defects can propagate and cause glass breakage during the application of stresses to the cover element 100*f* from the application environment and usage. The selective acid etching process, by virtue of lightly etching these edges 98, can remove at least some of these flaws, thereby increasing the strength and/or fracture resistance of the edges of the cover element 100*f*.

In the cover element (or glass article) 100*f*, the glass layer 50*e* can be characterized by: (a) an absence of failure when the layer 50*e* is held at a bend radius from about 1 mm to about 5 mm for at least 60 minutes at about 25° C. and about 50% relative humidity; (b) a puncture resistance of greater than about 1.5 kgf when the second primary surface 56*e* of the layer 50*e* is supported by (i) an approximately 25 µm thick pressure-sensitive adhesive having an elastic modulus of less than about 1 GPa and (ii) an approximately 50 µm thick polyethylene terephthalate layer having an elastic modulus of less than about 10 GPa, and the first primary surface 54*e* of the layer 50*e* is loaded with a stainless steel pin having a flat bottom with a 200 µm diameter; and (c) a pencil hardness of greater than or equal to 8H. In some aspects, the thickness 102 of the glass structure 110 may be equal to or greater than 125 µm. In an additional aspect, the thickness 52*e* of the glass layer 50*e* may be set from about 20 µm to about 125 µm to achieve the bend radius. According to an exemplary embodiment, the thickness 52*e* of the glass layer 50*e* can be set from about 20 µm to about 30 µm to achieve the bend radius from about 1 mm to about 5 mm. In some aspects, the thickness 52*e* of glass layer 50*e* (having an alkali-free alumino-borosilicate glass composition, for example) can be about 25 µm or less to obtain a bend radius of about 2 mm, and a bend radius of about 1 mm with some additional light etching.

The foldable electronic device assemblies 200-200*d* and cover elements 100-100*f* depicted in FIGS. 1-5B can be fabricated according to a method that includes certain steps of forming the foldable glass element/layer 50, 50*a*. For example, the method can include forming a foldable glass element/first glass layer 50, 50*a* having a first primary surface 54, 54*a*, a compressive stress region 60, 60*a*, 60*b* extending from the first primary surface 54, 54*a* of the glass element/layer 50, 50*a* to a first depth 62, 62*a*, 62*b*, and a final thickness 52, 52*a*.

The method for forming device assemblies 200-200*d* and cover elements 100-100*f* depicted in FIGS. 1-5B can also include the step of forming a glass element 50 having a thickness 52 from about 25 µm to about 125 µm. Here, the element 50 further comprises the glass layer 50*a*, 50*e* a first primary surface 54, and a second primary surface 56. In these aspects, the glass element 50 or glass layer 50*a*, 50*e* can also characterized by: (a) an absence of failure when the element 50 or glass layer 50*a*, 50*e* is held at a bend radius 40 from about 3 mm to about 20 mm for at least 60 minutes at about 25° C. and about 50% relative humidity; (b) a puncture resistance of greater than about 1.5 kgf when the second primary surface 56 of the element 50 is supported by (i) an approximately 25 µm thick PSA having an elastic modulus of less than about 1 GPa and (ii) an approximately 50 µm thick PET layer having an elastic modulus of less than about 10 GPa, and the first primary surface 54, 54*a*, 54*e* of the element 50 or glass layer 50*a*, 50*e* is loaded with a stainless steel pin having a flat bottom with a 200 µm diameter; and (c) a pencil hardness of greater than or equal to 8H. In other aspects of the method, glass element 50 or glass layer 50a, 50e can be configured to avoid failure for bend radii that range from about 3 mm to about 10 mm. In some aspects, the bend radius 40 can be set in a range from about 1 mm to about 5 mm. The bend radius 40 can also be set to a range from about 5 mm to 7 mm without causing a failure in the glass element 50 or glass layer 50a, 50e according to other aspects of the method.

In some embodiments of the foregoing method, the step of forming the foldable glass element/glass layer 50, 50a employs one or more of the following forming processes: fusion, slot drawing, rolling, redrawing or float. Other forming processes can be employed depending on the final shape factor for the glass element/layer 50, 50a and/or the intermediate dimensions of a glass precursor used for the final glass element/layer 50, 50a.

The forming process may be further configured to form the foldable glass element/glass layer 50, 50a to the final thickness 52, 52a and, as such, may include sub-process steps to obtain the final thickness 52, 52a. The step of forming the glass element/glass layer 50, 50a can include a material removal process that is configured to remove material from the glass element/layer 50, 50a to reach the final thickness 52, 52a. Various known acid etching/acid thinning processes can be employed for this purpose as understood by those with ordinary skill in this field. For example, a suitable etching solution can comprise 15 vol % HF and 15 vol % HCl. By controlling etching time and/or etching solution concentration, a desired final thickness 52, 52a can be obtained in the glass element/layer 50, 50a. An example etching rate using this solution is about 1.1 μm per minute. In some embodiments of the method, the material removal process employed to reach the final thickness 52, 52a can be further configured to reduce the maximum flaw size in proximity to the first primary surface 54, 54a and/or the second primary surface 56, 56a, and/or the edge—e.g., to 5 μm or less, 2.5 μm or less, 0.5 μm or less, or even lower.

According to some embodiments of the method of making the foldable electronic device assemblies 200-200d and cover elements 100-100f depicted in FIGS. 1-5B, an ion exchange process can be employed to generate the compressive stress region 60, 60a, 60b and/or edge compressive stress regions 59a. As outlined earlier, the step of forming a compressive stress region 60, 60a, 60b, and/or edge compressive stress region 59a extending from one or more primary surfaces of the foldable glass element 50 and/or layer 50a to one or more selected depths can include the following additional sub-process steps: providing a strengthening bath comprising a plurality of ion-exchanging metal ions selected so as to produce compressive stress in the glass element/layer 50, 50a containing ion-exchangeable metal ions; and submersing the glass element/layer 50, 50a in the strengthening bath to exchange a portion of the plurality of ion-exchangeable metal ions in the glass element/layer 50, 50a with a portion of the plurality of the ion-exchanging metal ions in the strengthening bath to form a compressive stress region 60, 60a, 60b and/or edge compressive stress region 59a that extends from the one or more primary surfaces to one or more selected depths within the glass element/layer 50, 50a. In some embodiments of the method, the ion-exchanging metal ions have an atomic radius that is larger than the atomic radius of the ion-exchangeable metal ions contained in the glass element/layer 50, 50a. In other embodiments of the method, the submersing step includes submersing the glass element/layer 50, 50a in the strengthening bath at about 400° C. to about 450° C. for about 15 minutes to about 180 minutes to develop the compressive and/or edge compressive stress region(s).

Figure 8A:
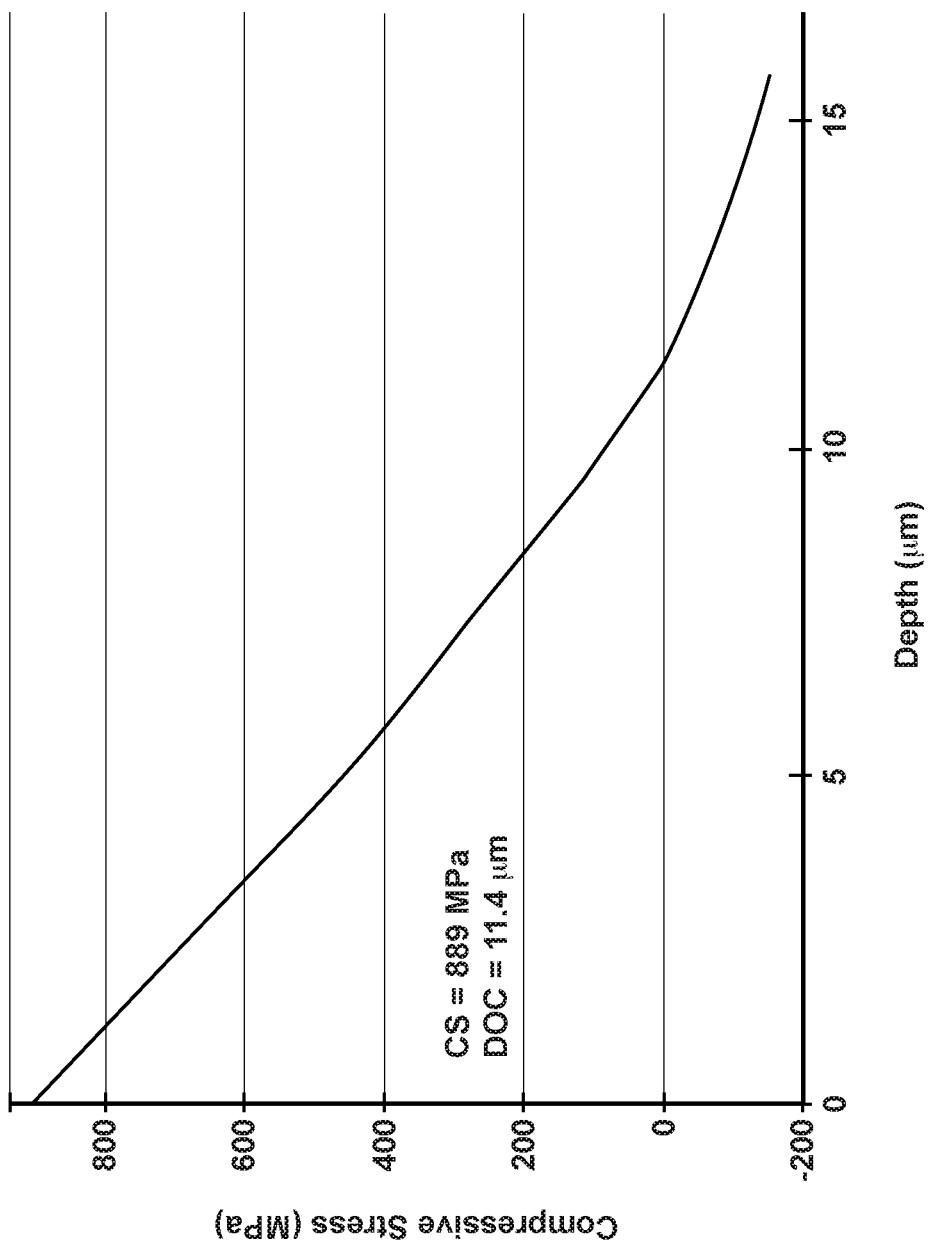
FIG. 8A is a plot of compressive stress vs. depth in a 75 μm thick foldable glass element after an ion exchange process step according to some embodiments of this disclosure.

According to some embodiments, 75 μm thick glass samples with a composition consistent with Corning® Gorilla Glass® 2.0 were subjected to an ion exchange process that included a $KNO_3$ bath submersion at 430° C. for 30 minutes. Compressive stress (MPa) as a function of glass layer depth (μm) was then measured and the results are depicted in FIG. 8A. As shown, this ion exchange process produced compressive stress of about 889 MPa at the surface of the glass and appreciable compressive stress levels were measured to a depth of about 11.4 μm (i.e., DOC=11.4 μm).

In some embodiments of the method, a post-ion exchange process to remove material from the surface of the glass element/layer 50, 50a can provide a benefit in terms of flaw size reduction. In particular, such a removing process can employ a light etching step to remove about 1 μm to about 5 μm from the final thickness of the glass element/layer 52, 52a at the first primary surface 54, 54a after formation of the compressive stress region 60, 60a. For example, the removing step can employ a 950 ppm $F^-$ ion (e.g., an HF acid), 0.1M citric acid etching solution for ~128 minutes for this purpose. As outlined earlier in connection with Equation (2), a reduction in the maximum flaw size in the glass element/layer 50, 50a, particularly near their primary surfaces and/or edges, can serve to reduce the stress intensity factor produced from bending the layer and/or the element.

Figure 8B:
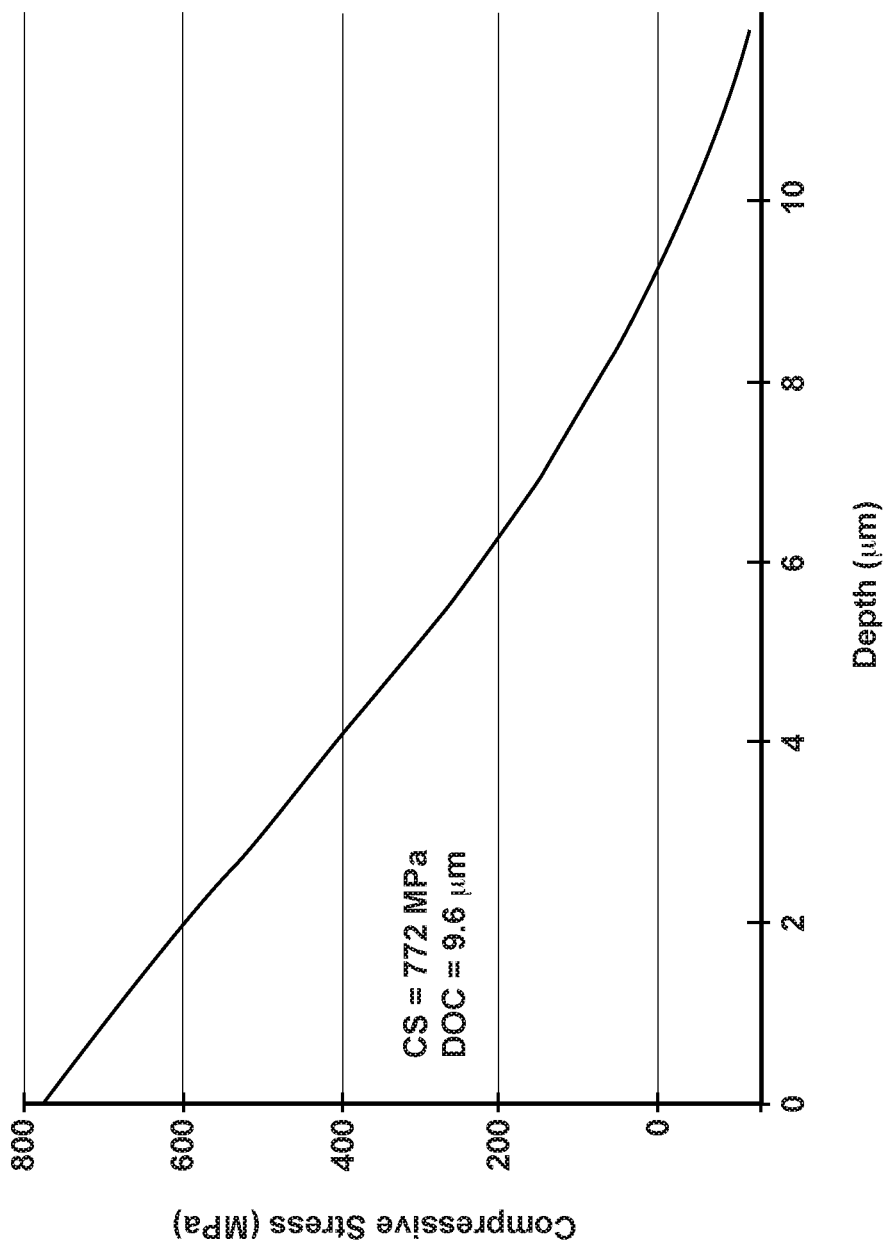
FIG. 8B is a plot of compressive stress vs. depth in a 75 μm thick foldable glass element after an ion exchange process step and a light etching step according to some embodiments of this disclosure.

Referring to FIG. 8B, the effect on compressive stress in the glass element/layer (e.g., foldable glass element/layer 50, 50a) subjected to both an ion exchange and post-ion exchange material removal process can be observed. In particular, FIG. 8B depicts compressive stress as a function of glass layer depth (μm) for glass layer samples prepared in accordance with those in FIG. 8A and additionally subjected to light etching process to remove about 1-2 μm of material from the surface. These samples were measured with a compressive stress of about 772 MPa at the surface of the glass and appreciable compressive stress levels were measured to a depth of about 9.6 μm (i.e., DOC=9.6 μm). In effect, FIG. 8B has a similar compressive stress as a function of depth relationship as shown in FIG. 8A; however, it is apparent that FIG. 8B is effectively a truncated version of FIG. 8A, with the first portion removed consistent with the actual removal of material from the light etching process. As such, the post-ion exchange material removal process can somewhat reduce the DOC and maximum compressive stress obtained from the ion exchange process, while at the same time providing a benefit in terms of flaw size reduction. To the extent that higher compressive stress levels and/or DOC levels are desired for a given application, the ion exchange process can be tailored to produce compressive stress and DOC levels somewhat above the targeted levels, given the expected effect from the post-ion exchange material removal process.

According to some embodiments, the removing process can be conducted to control the flaw distribution in the compressive stress regions 60, 60a and/or 60b and/or edge compressive stress regions 59a to a maximum flaw size of 5 μm or less at the primary surfaces (e.g., first primary surface 54) and/or edges of the glass element/layer 50, 50a. The removing step can also be conducted such that the compressive stress regions comprise a maximum flaw size of 2.5 μm or less, or even as low as 0.4 μm or less, and all ranges and sub-ranges between the foregoing values, at the primary surface(s) and/or edge(s) of the glass element/layer 50, 50a. According to some additional embodiments of the method, the removing step can also be conducted to control the flaw size distribution within a region of the glass element/layer 50, 50a that lacks the superposition of a compressive stress region and/or an edge compressive stress region.

According to some embodiments, a method of making the foldable electronic device assemblies 200-200d and cover elements 100-100f depicted in FIGS. 1-5B can include certain steps of forming the foldable glass element/layer 50, 50a. Such a method can include: forming a first glass layer 50a having a first primary surface 54a, a compressive stress region 60 extending from the first primary surface 54a of the glass layer 50a to a first depth 62 in the glass layer 50a, and a final thickness 52a, wherein the region 60 is defined by a compressive stress of at least about 100 MPa at the first primary surface 54a of the layer 50a; and forming a foldable glass element 50 having a thickness 52 from about 25 μm to about 125 μm, the element 50 further comprising the glass layer 50a, a first primary surface 54, and a second primary surface 56. In some embodiments, the element 50 comprises one glass layer 50a.

In an some embodiments, the steps of forming the first glass layer 50a and the foldable glass element 50 can include a step of forming an interim thickness (e.g., about 200 μm) that exceeds the final thickness 52a of the glass layer 50a (and thickness 52 of the element 50) using fusion, slot drawing, rolling, redrawing, float or other direct glass forming processes. The interim glass element/layer 50, 50a can then be separated, cut and/or otherwise shaped into near-final part dimensions using known cutting processes (e.g., water cutting, laser cutting, etc.). At this point, the interim glass element/layer 50, 50a can then be etched to a final thickness 52, 52a (e.g., about 75 μm) according to the foregoing process steps. Etching to a final thickness at this stage in the process can provide a benefit in removing flaws and other defects introduced from the prior glass forming and separation/cutting steps. Next, the glass element/layer 50, 50a can be subjected to process steps for forming the compressive stress region 60 including but not limited to the foregoing ion exchange process. A final, light etch can then be performed on the glass element/layer 50, 50a containing the compressive stress region 60 according to the prior-described process. This final, light etch can then remove any appreciable flaws and defects in the surface of the glass element/layer 50, 50a that resulted from the prior ion exchange process. The glass element 50 or glass layer 50a produced according to the method can be characterized by: (a) an absence of failure when the element 50 or glass layer 50a is held at a bend radius from about 3 mm to about 20 mm for at least 60 minutes at about 25° C. and about 50% relative humidity; (b) a puncture resistance of greater than about 1.5 kgf when the second primary surface 56, 56a of the element 50 or layer 50a is supported by (i) an approximately 25 μm thick pressure-sensitive adhesive having an elastic modulus of less than about 1 GPa and (ii) an approximately 50 μm thick polyethylene terephthalate layer having an elastic modulus of less than about 10 GPa, and the first primary surface 54, 54a of the element 50 or layer 50a is loaded with a stainless steel pin having a flat bottom with a 200 μm diameter; and (c) a pencil hardness of greater than or equal to 8H.

In some embodiments, the steps of forming the first glass layer 50a and foldable glass element 50 to the final thickness 52a and thickness 52, respectively, can be conducted by employing fusion, slot drawing, rolling, redrawing, float or other direct glass forming processes. The glass layer 50a (and element 50) can then be separated, cut and/or otherwise shaped into near-final part dimensions using known cutting processes (e.g., water cutting, laser cutting, etc.). At this point, the glass layer 50a (and element 50) can then be subjected to process steps for forming the compressive stress region 60 including but not limited to the foregoing ion exchange process. A final, light etch can then be performed on the glass layer 50a and element 50 containing the compressive stress region 60 according to the prior-described process. This final, light etch can then remove any appreciable flaws and defects in the surface of the glass layer 50a and element 50 that resulted from the prior ion exchange process.

The foldable glass element 50 or glass layer 50a produced according to the method can be characterized by: (a) an absence of failure when the element 50 or glass layer 50a is held at a bend radius from about 3 mm to about 20 mm for at least 60 minutes at about 25° C. and about 50% relative humidity; (b) a puncture resistance of greater than about 1.5 kgf when the second primary surface 56, 56a of the element 50 or layer 50a is supported by (i) an approximately 25 μm thick pressure-sensitive adhesive having an elastic modulus of less than about 1 GPa and (ii) an approximately 50 μm thick polyethylene terephthalate layer having an elastic modulus of less than about 10 GPa, and the first primary surface 54, 54a of the element 50 or layer 50a is loaded with a stainless steel pin having a flat bottom with a 200 μm diameter; and (c) a pencil hardness of greater than or equal to 8H.

Figure 9A:
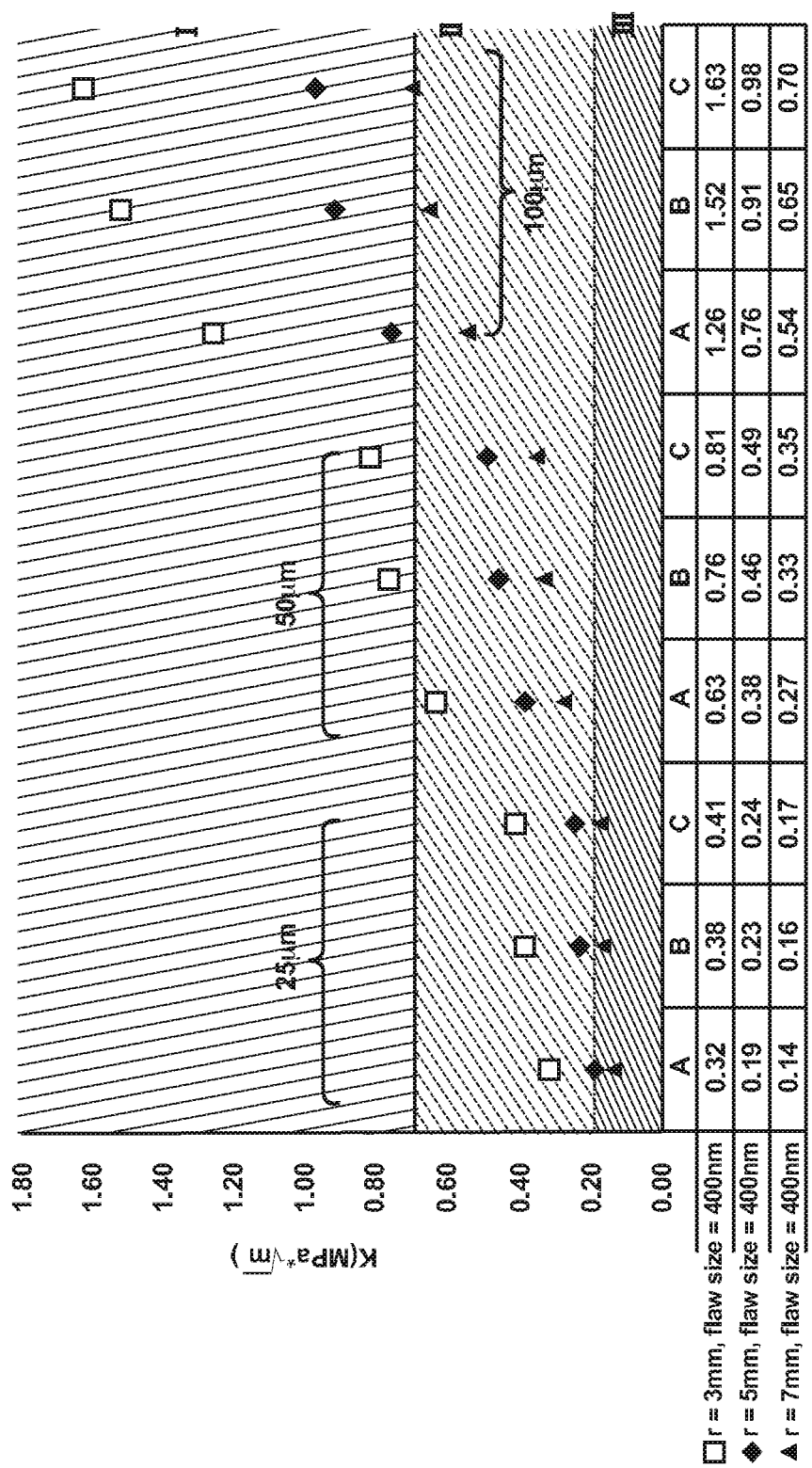
FIG. 9A is a schematic plot of estimated stress intensity factors for glass layers of three compositions having a thickness of 25, 50 and 100 μm and a bend radius of 3, 5 and 7 mm.

Referring to FIG. 9A, a schematic plot of estimated stress intensity factors is provided for glass layers of three compositions, "A," "B" and "C." The composition of the A group is: $SiO_2$ at 67.1% (by mol %); $Al_2O_3$ at 6.3%; $B_2O_3$ at 19.9%; MgO at 0.5%; CaO at 4.8%; SrO at 0.5%; $SnO_2$ at 0%; and $Na_2O$ at 0.9%. The composition of the B group is: $SiO_2$ at 66.7% (by mol %); $Al_2O_3$ at 10.9%; $B_2O_3$ at 9.7%; MgO at 2.2%; CaO at 9.1%; SrO at 0.5%; $SnO_2$ at 0.1%; and $Na_2O$ at 0%. The composition of the C group is: $SiO_2$ at 67.4% (by mol %); $Al_2O_3$ at 12.7%; $B_2O_3$ at 3.7%; MgO at 2.4%; CaO at 0%; SrO at 0%; $SnO_2$ at 0.1%; and $Na_2O$ at 13.7%. Equation (2) was employed to generate the estimates depicted in FIG. 7A. Glass layers "A," "B" and "C" have elastic moduli of 57.4, 69.3 and 73.6 GPa, respectively. Further, glass layers "A," "B" and "C" have a Poisson's ratio of 0.22, 0.22 and 0.23, respectively. In addition, stress intensity factor estimates were performed for the glass layers "A," "B" and "C" having a thickness of 25, 50 and 100 μm and a bend radius of 3, 5 and 7 mm. A flaw size of 400 nanometers (nm) was assumed for all cases, as it is a typical maximum flaw size for a fusion-formed glass surface. No compressive stress region was assumed to be present in any of these glass layers.

In FIG. 9A, regions I, II and III refer to instantaneous failure, slow fatigue failure and no-failure regions, respectively. As the estimates indicate, increasing the bend radius and decreasing the thickness of the glass layer are steps that each tend to reduce the stress intensity factors. If the bend radius is held to no lower than 5 mm and the thickness of the glass layer to 25 μm or less, the estimated stress intensity factors in FIG. 9A suggest that no failures would occur in static tension or fatigue (e.g., K at <0.2 MPa$\sqrt{}$m for region III). These particular glass layers depicted in FIG. 9A (i.e., glass layers with a bend radius equal to or greater than 5 mm and a thickness of 25 μm or less) could be suitable for use in foldable electronic device assemblies, cover elements and glass articles with relatively modest puncture resistance requirements according to certain aspects of the disclosure.

Figure 9B:
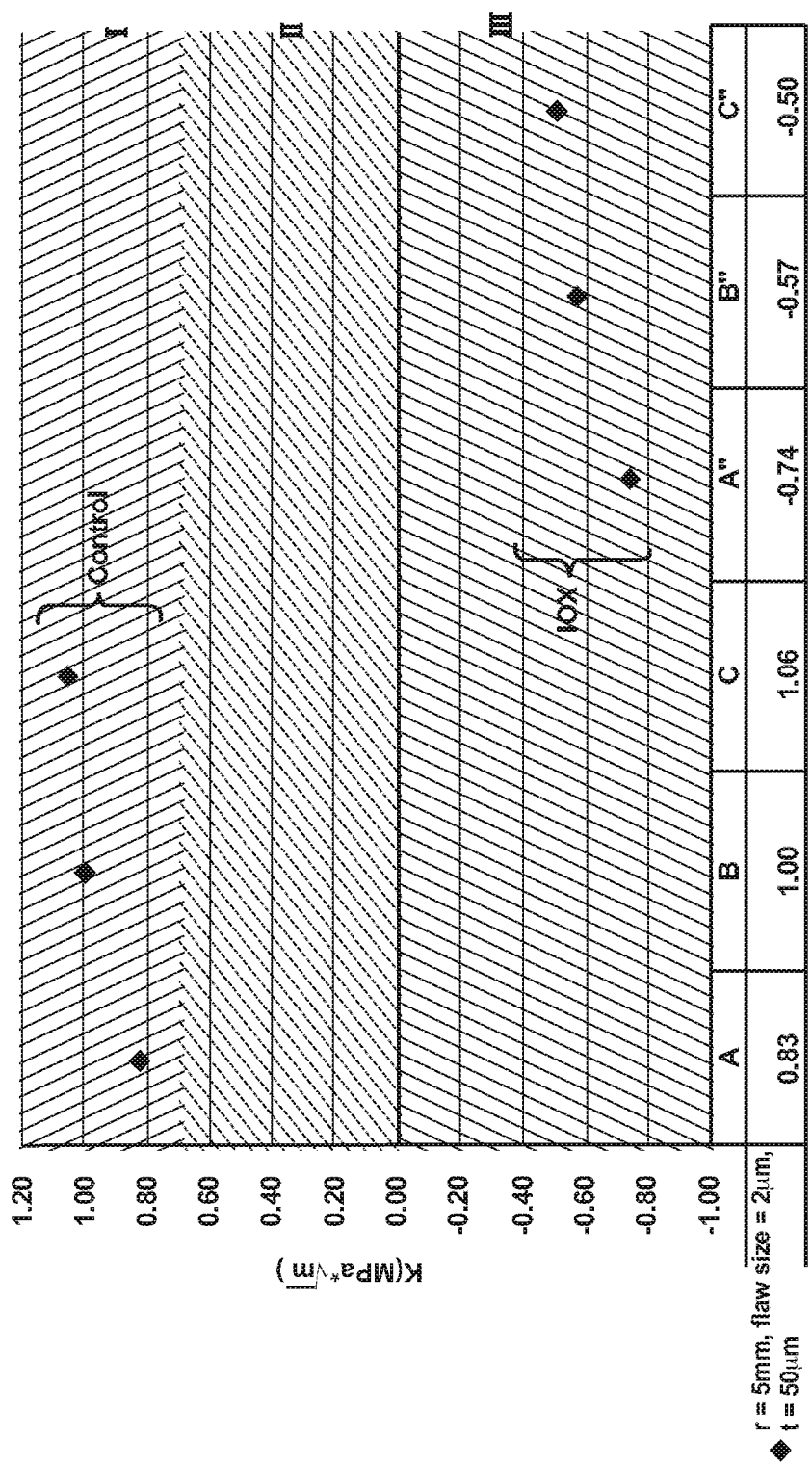
FIG. 9B is a schematic plot of estimated stress intensity factors for glass layers of three compositions having a thickness of 50 μm and a bend radius of 5 mm, with and without a compressive stress region, according to an aspect of this disclosure.

Referring to FIG. 9B, a schematic plot of estimated stress intensity factors is provided for glass layers of three compositions, "A," "B" and "C" (i.e., the same compositions as employed for the glass layers depicted in FIG. 9A). Each of the glass layers employed in the estimates depicted in FIG. 9B was assumed to have a thickness of 50 μm and a bend radius of 5 mm. Further, the "Control" (also denoted by A, B and C) group was assumed to lack a superimposed compressive stress region, and the "IOX" group (also denoted by A", B" and C") was assumed to possess a compressive stress region developed through an ion exchange process having about 700 MPa of surface compression, according to an aspect of this disclosure. A more conservative flaw size of 2000 nm (2 μm) was assumed for the purpose of generating these estimates, reflecting a worst-case scenario of a large flaw introduced at the application-use stage by a customer well after fabrication of the device containing the foldable electronic device assembly, glass element or glass article according to an aspect of this disclosure.

As the estimates in FIG. 9B indicate, a compressive stress region developed in a glass layer with an ion exchange process can significantly offset the stress intensity levels in the glass layers observed upon bending. Stress intensity levels well below the region III threshold (e.g., K at <0 MPa√m for region III) were observed for the "IOX" glass layers having a 50 μm thickness and a bend radius of 5 mm, by virtue of the additional compressive stress superimposed on the tensile stresses developed during bending. In contrast, the Control group, without a compressive stress region, was estimated to have stress intensity levels within region I.

Figure 10:
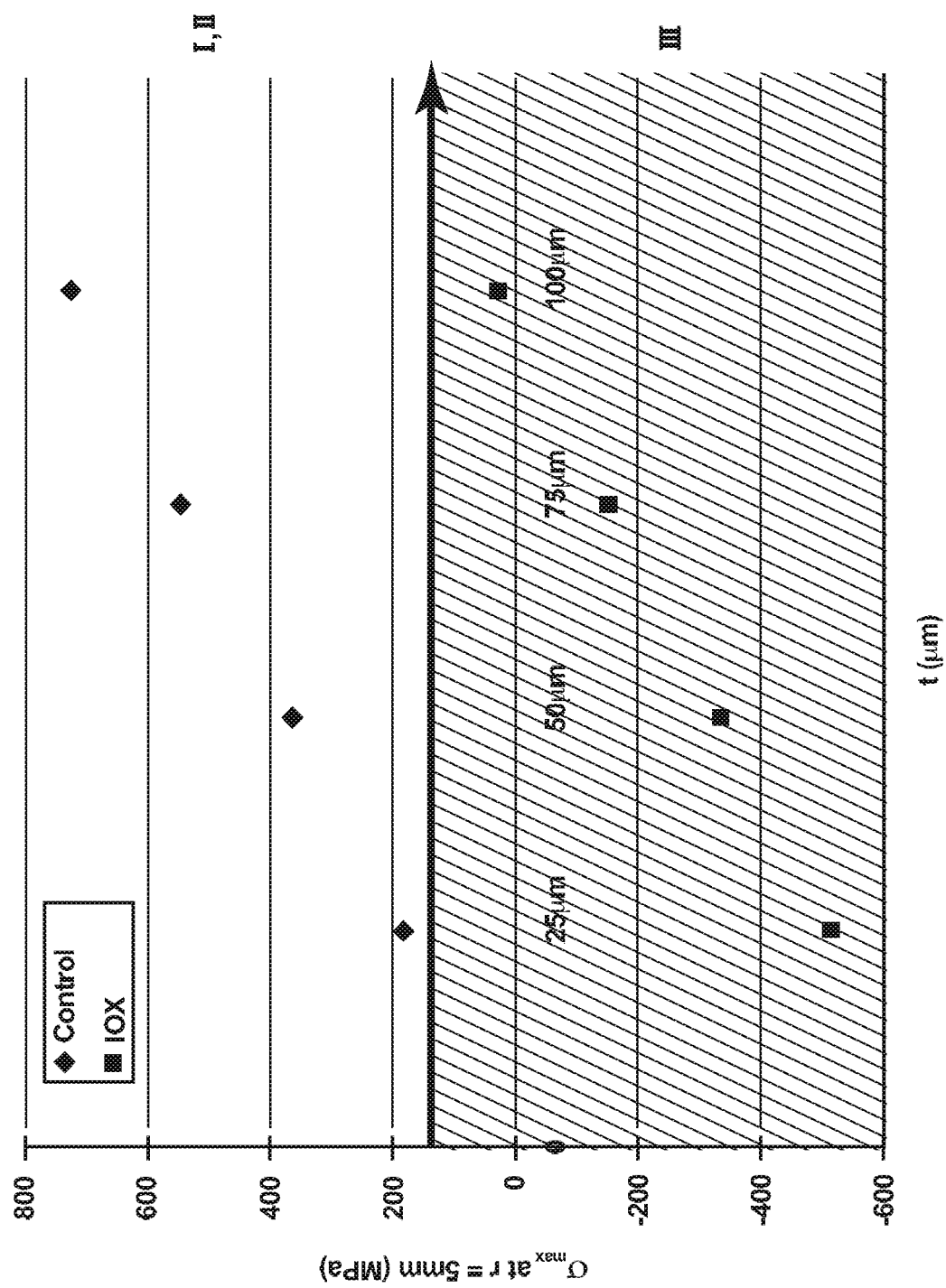
FIG. 10 is a schematic plot of estimated maximum stress levels at the surface of glass layers of one composition having thickness of 25, 50, 75 and 100 μm and a bend radius of 5 mm, with and without a compressive stress region developed through an ion exchange process, according to a further aspect of this disclosure.

Referring to FIG. 10, a schematic plot is provided of estimated stress levels at the surface of glass layers of one particular composition, a glass composition comparable to the composition of the C group depicted in FIGS. 9A and 9B. Each of the glass layers employed to generate the stress estimates depicted in FIG. 10 was assumed to have a thickness of 25, 50, 75 and 100 μm and a bend radius of 5 mm. Further, some of these glass layers were assumed to lack a compressive stress region (i.e., the "Control" group) and the remaining glass layers were assumed to possess a compressive stress region having about 700 MPa of surface compression, e.g., as developed through an ion exchange process (i.e., the "IOX" group) according to a further aspect of this disclosure. A flaw size of 400 nm was assumed for all cases, as it is a typical maximum flaw size for a fusion-formed glass surface. Further, the safety zone (i.e., region III) was set at stress intensity safety factor of K<0.2 MPa√m.

As the estimates in FIG. 10 indicate, a compressive stress region developed in a glass layer with an ion exchange process can significantly reduce the stress intensity levels in the glass layers observed upon bending. Stress intensity levels well below the region III threshold (e.g., K at <0.2 MPa√m for region III) were observed for all of the "IOX" glass layers having a thickness of 25, 50, 75 and 100 μm and a bend radius of 5 mm, by virtue of the additional compressive stress superimposed on the tensile stresses developed during bending. In contrast, the Control group, without a compressive stress region, was estimated to have stress intensity levels in region I for all thicknesses.

Figure 11:
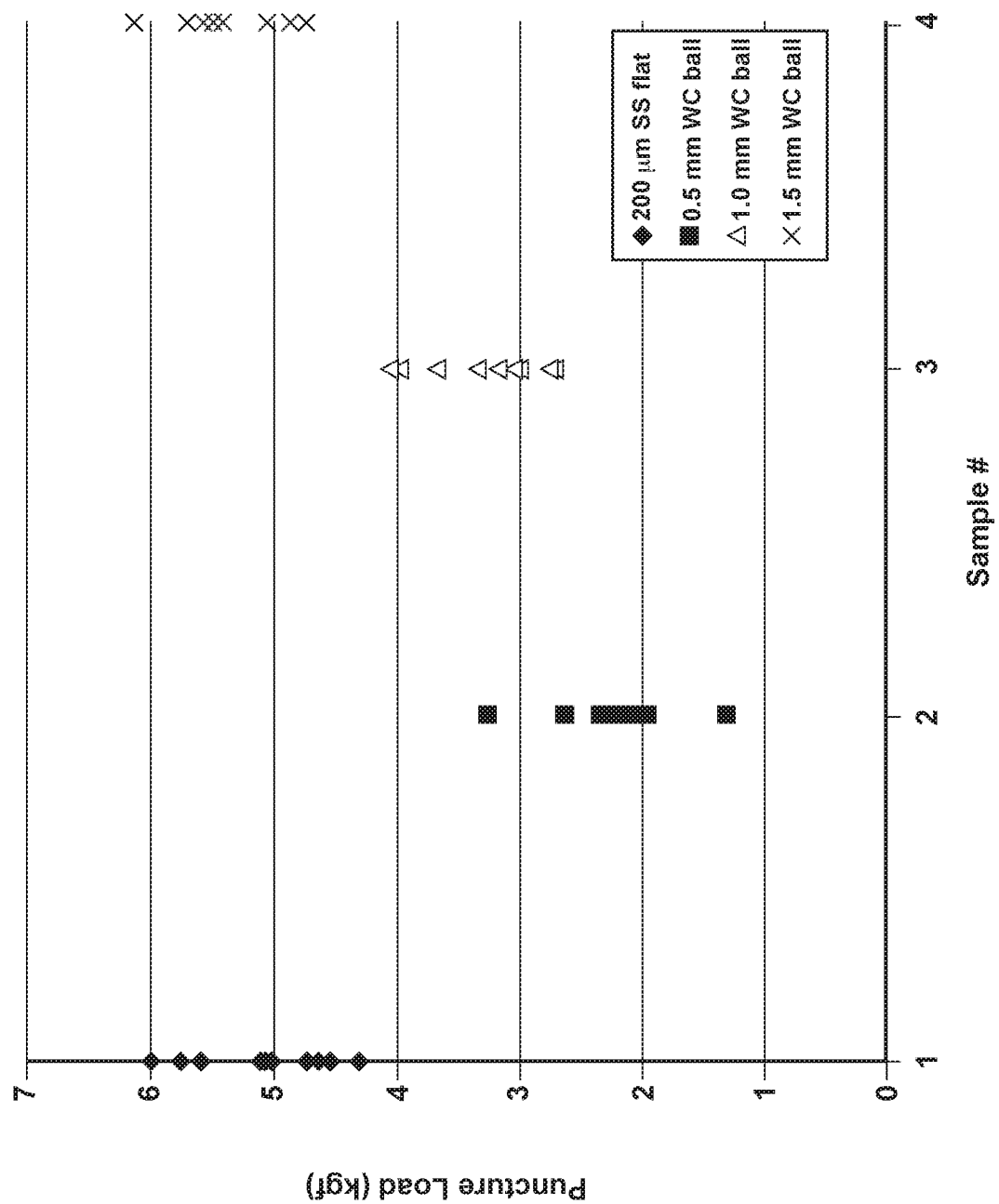
FIG. 11 is a plot of failure puncture load test data for glass layers of one composition having a thickness of 75 μm and a compressive stress region developed through an ion exchange process, according to an aspect of this disclosure.

Referring to FIG. 11, a plot of failure puncture load data for glass layers of one composition having a thickness of 75 μm and a compressive stress region developed through an ion exchange process is provided according to an aspect of this disclosure. In particular, the glass composition for the samples tested in FIG. 11 was: $SiO_2$ at 68.9% (by mol %); $Al_2O_3$ at 10.3%; $Na_2O$ at 15.2%; MgO at 5.4%; and $SnO_2$ at 0.2%. All of the glass layers tested in the experiment used to generate the data of FIG. 11 were subjected to an ion-exchange process to produce a compressive stress region with a compressive stress at the surface of about 772 MPa and a DOL of 9.6 μm. For purposes of testing, the glass layers were laminated to a 50 μm PET layer (having an elastic modulus of less than about 10 GPa) with a 25 μm PSA layer (having an elastic modulus of less than about 1 GPa). Puncture testing was performed on the outer glass surface.

As shown in FIG. 11, four groups of samples were tested to develop the puncture test data. Each group corresponded to a different puncture device: a 200 μm diameter, flat bottom stainless steel punch; a 0.5 mm tungsten carbide ball; a 1.0 mm tungsten carbide ball; and a 1.5 mm tungsten carbide ball. The data in FIG. 11 demonstrate the sensitivity of the puncture failure load data to the particular puncture device employed in the testing. Generally, the variability in results appears to be similar for each of the devices employed. As indicated in FIG. 11, the glass layers having a thickness of 75 μm with a compressive stress region developed through ion-exchange processing had puncture failure loads well in excess of 4 kgf when tested with a 200 μm diameter, flat bottom stainless steel punch.

In another example, a glass layer with a composition that was comparable to the glass layers tested in FIG. 11 was prepared according to an aspect of this disclosure with a compressive stress region generated through an ion exchange process was subjected to a 2-point, static fatigue bend test. In particular, the glass layer tested had a thickness of 75 μm and its compressive stress region was developed by submersion in a $KNO_3$ molten salt bath at 430° C. for 30 minutes. Further, the glass layer was subjected to a post-ion exchange material removal process involving an acid etch in a 950 ppm F⁻ ion, 0.1M citric acid etching solution for about 128 minutes. Upon testing, the glass layer did not fail after being subjected to a bend radius of ~5 mm for 120 hours.

In a further example, 75 μm thick glass layer samples were prepared in accordance with the composition and ion exchange process steps of the samples tested in FIG. 11. These samples were not laminated with any compliant layers. As-prepared, these samples were 105×20×0.075 mm. 10 samples were then arranged in a bent configuration within a static test fixture with a 10 mm plate separation (plates fabricated from Teflon® material). The samples were then held within the fixture at 85° C. under 85% relative humidity. 9 of the 10 samples have not experienced any failure modes after over two months of testing in the fixture. One sample failed during the first day of testing. Given these results and other analyses, it is believed that any samples with failure-inducing surface flaws remaining after processing can be removed through proof testing.

In an additional example, 75 μm thick glass layer samples were prepared in accordance with the composition and ion exchange process steps of the samples tested in FIG. 11, including lamination to a 50 μm PET layer with a 25 μm PSA layer. As-prepared, these samples were 105×20×0.075 mm (not including the PET/PSA layers). Five samples were then subjected to a clamshell cyclic fatigue test. The clamshell cyclic fatigue test fixture held the samples with a 10 mm plate separation under ambient temperature and humidity conditions. Each cycle involved closing the clamshell fixture while retaining the 10 mm plate separation and then fully opening the fixture such that the sample was uniform with no bend. Each of the five samples has survived over 45,000 of such cycles.

Figure 12:
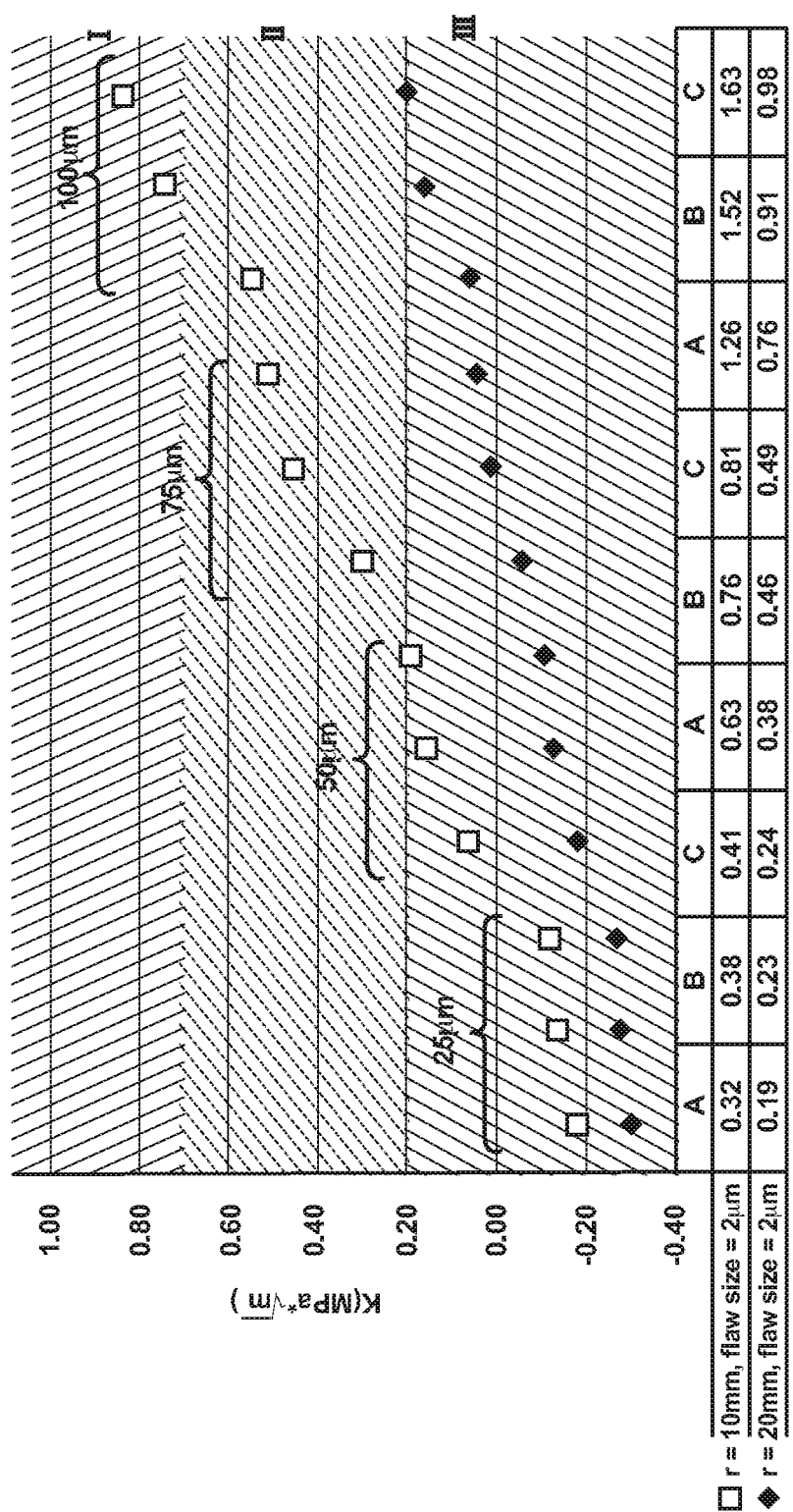
FIG. 12 is a schematic plot of estimated stress intensity factors for glass layers of three compositions having a thickness of 25, 50, 75 and 100 μm, a bend radius of 10 and 20 mm, and a compressive stress region developed through a mismatch in the coefficient of thermal expansion between core and cladding regions of the glass layers, according to a further aspect of this disclosure.

Referring now to FIG. 12, a schematic plot of estimated stress intensity factors for glass layers of three compositions, groups "A," "B" and "C" having the same composition as the groups of samples employed for the estimates given in FIGS. 9A and 9B, is provided according to a further aspect of the disclosure. Each of the samples employed for the estimates in FIG. 12 had a thickness of 25, 50, 75 or 100 µm, and a bend radius of 10 or 20 mm. Here, each tested sample possessed compressive stress regions that were developed through heating, and subsequently cooling, core and cladding regions of the glass layers in intimate contact, the core region having a CTE greater than the CTE of the clad regions. The estimates employed in FIG. 12 assumed a flaw size of about 2 µm in the surface of the glass layer for each sample. Further, it was assumed that about 150 MPa of compressive stress was developed in the compressive stress region of these glass layers through CTE mismatch between the core and cladding regions.

As the estimates in FIG. 12 indicate, a compressive stress region developed in a glass layer with a CTE mismatch between its core and cladding regions can significantly reduce the stress intensity levels in the glass layers observed upon bending. Stress intensity levels well below the region III threshold (e.g., K at <0.2 MPa√m for region III) were observed for all of the glass layers having a thickness of 25, 50, 75 and 100 µm and a bend radius of 20 mm, by virtue of the additional compressive stress superimposed on the tensile stresses developed during bending. In addition, glass layers having a thickness of 25 µm and 50 µm and a bend radius of 10 mm also possessed stress intensity levels below the region III threshold. As such, these particular glass layers employing a CTE mismatch approach can be employed according to aspects of the disclosure within foldable electronic device assemblies, cover elements and glass articles having bend radii requirements of 10 mm or more (see, e.g., cover element 100b in FIG. 1D and the corresponding description).

Figure 13:
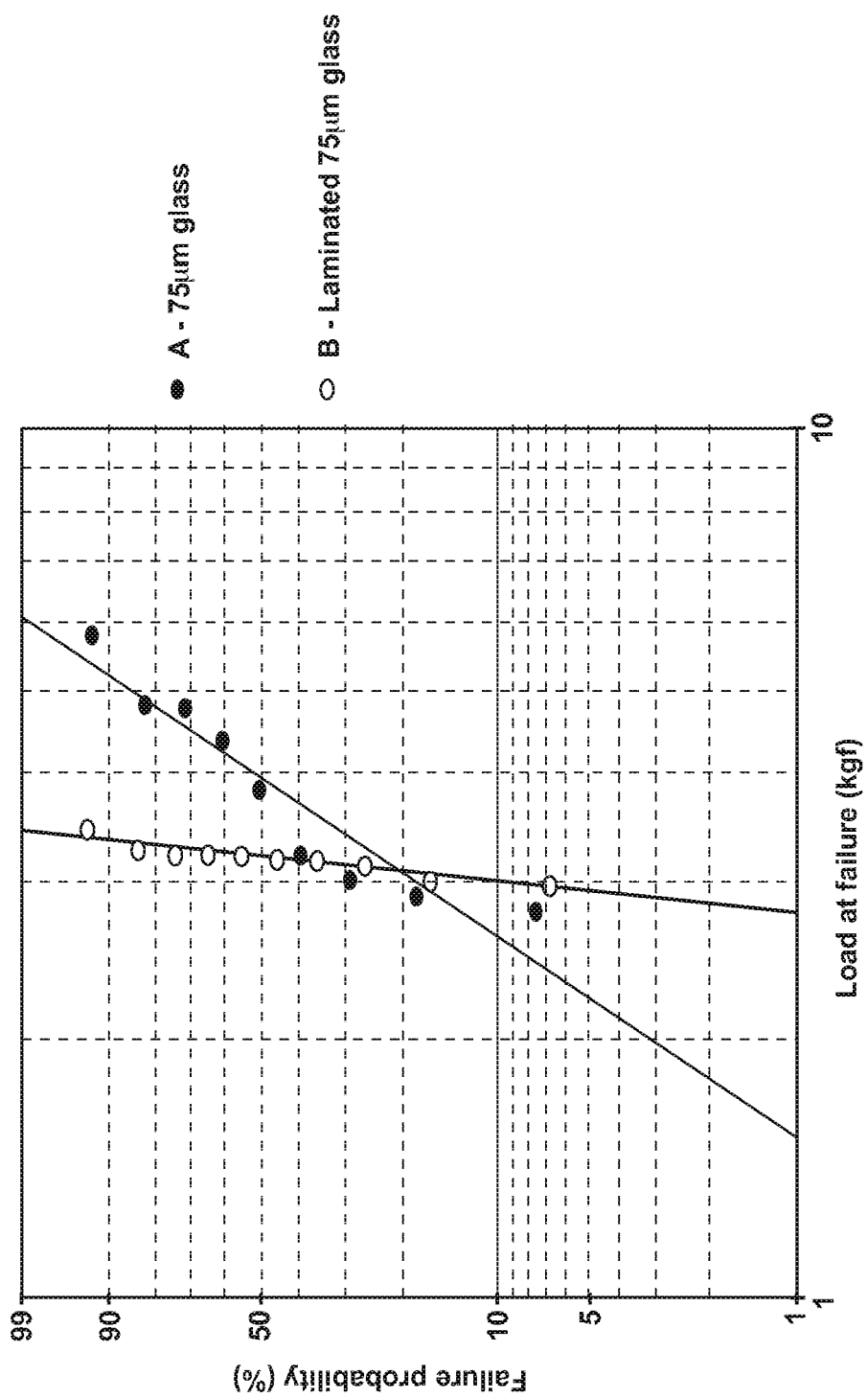
FIG. 13 is a Weibull plot of failure probability vs. load at failure for two groups of glass samples according to an aspect of this disclosure.

In FIG. 13, a Weibull plot of failure probability vs. puncture load data for glass layers of one composition having a thickness of 75 µm and a compressive stress region developed through an ion exchange process is provided according to an aspect of this disclosure. In particular, the glass composition for the samples tested was comparable to those tested in FIG. 11. All of the glass layers tested in the experiment used to generate the data of FIG. 13 were subjected to an ion-exchange process to produce a compressive stress region with a compressive stress at the surface of about 772 MPa and a DOL of 9.6 µm. The "B" group of glass layers, as denoted by open circle symbols in FIG. 13, consisted of glass samples laminated to a 50 µm PET layer with a 25 µm PSA layer. All puncture testing was performed on the outer glass surface of these samples, away from the PET/PSA layer stack. An "A" group of glass layers, as denoted by closed circle symbols in FIG. 13, consisted of glass samples that were not laminated to a PET/PSA layer stack. The puncture test results shown in FIG. 13 were generated using a 200 µm diameter, flat bottom stainless steel punch.

As shown in FIG. 13, the non-laminated "A" group and laminated "B" group of samples exhibited Weibull characteristic strength values (i.e., at a failure probability of 63.2% or greater) of 4.3 kgf and 3.3 kgf, respectively. Further, all samples from both groups failed at 5.5 kgf or greater. The Weibull modulus of the laminated "B" group is higher than the Weibull modulus of the non-laminated "A" group, indicating that variability in failure performance can be reduced by virtue of laminating the samples. On the other hand, the non-laminated "A" group demonstrated a higher average puncture failure load and Weibull characteristic strength compared to the laminated "B" group, suggesting that lamination can somewhat reduce puncture test performance, likely caused by increased local stress concentrations associated with the compliant layers in vicinity to the glass near the puncture testing tip. As such, the choices and options associated with laminating foldable electronic device assemblies and cover elements according to aspects of this disclosure can be mindful of the potential optimization of puncture resistance variability and overall maximization of puncture resistance.

Overall Stress Profile in the Glass Element and/or Layer(s)

Tensile stress in glass tends to make flaws propagate, whereas compressive stress in glass tends to suppress the propagation of flaws. Flaws may be present in the glass from the nature in which it was made, handled, or processed. Accordingly, it is desirable to have the portions of the glass that are likely to have or receive flaws (i.e., the primary surfaces, and from those surfaces to a depth to which cracks may penetrate) in compression. For a bent piece of glass, the stress profile is comprised of two main components, the first $\sigma_I$ being that inherently in the glass from the way it was made and/or processed, and the second $\sigma_B$ being that induced from a bend in the glass.

Figure 14:
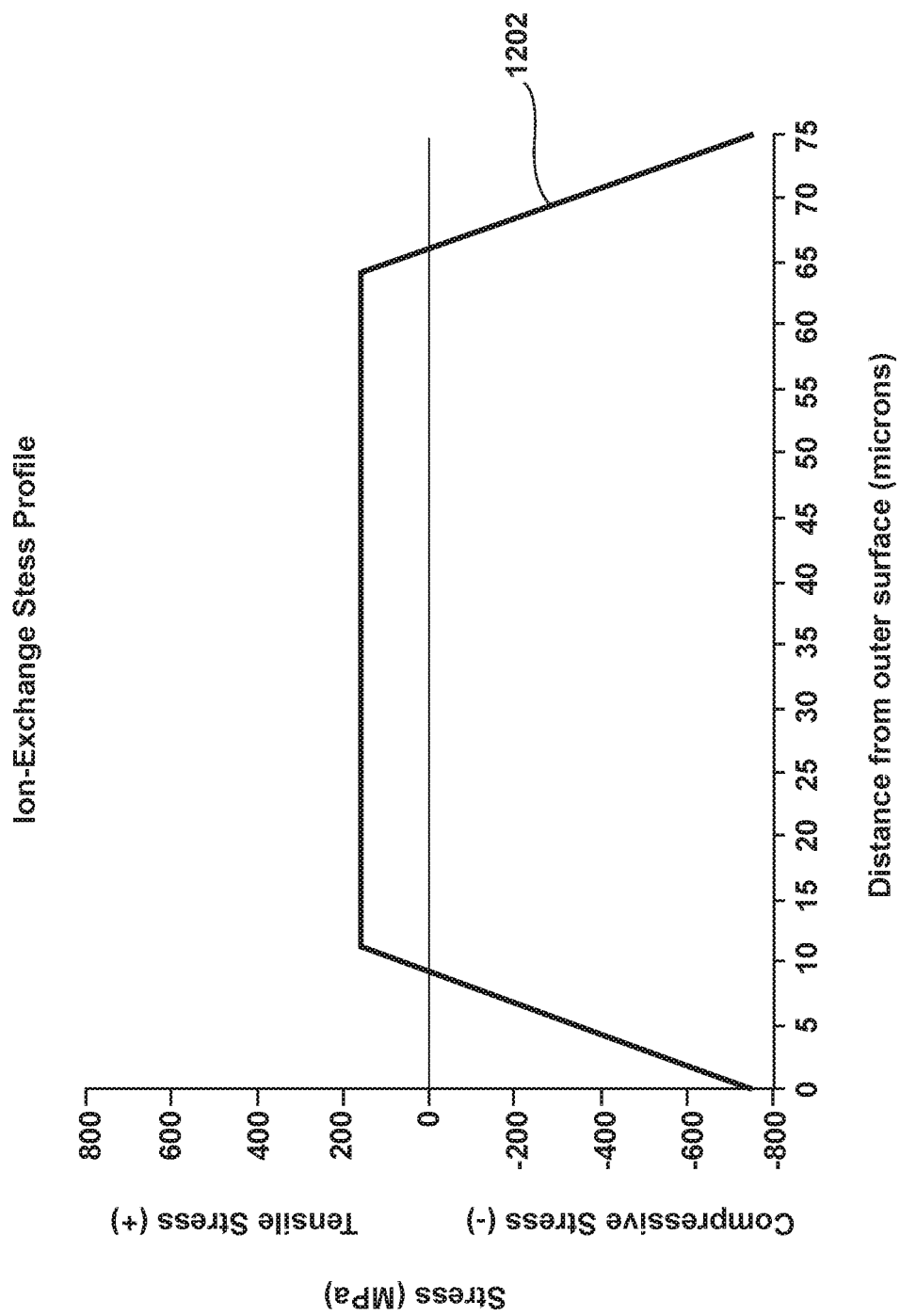
FIG. 14 is a stress profile for a foldable glass element according to embodiments of the disclosure when compressive stress results from metal ion exchange between salt and glass.

One example of the first component $\sigma_I$, stress inherently in the glass itself, is shown in FIG. 14. Line 1202 is a stress profile for a 75 micron thick glass element made of Corning Code 2319 (Gorilla® Glass 2) having a compressive stress of 756 MPa and a DOC of 9.1 microns. As used herein, a positive (+) stress is tensile, and a compressive stress is negative (−). The inherent stress profile in the glass may vary based on different IOX conditions, glass compositions, and/or differing processing conditions when making the glass (as in the case of glass laminates described above, which may impart a compressive stress in the outer layer of the glass). In any event, the glass itself will have an inherent stress profile.

Figure 15:
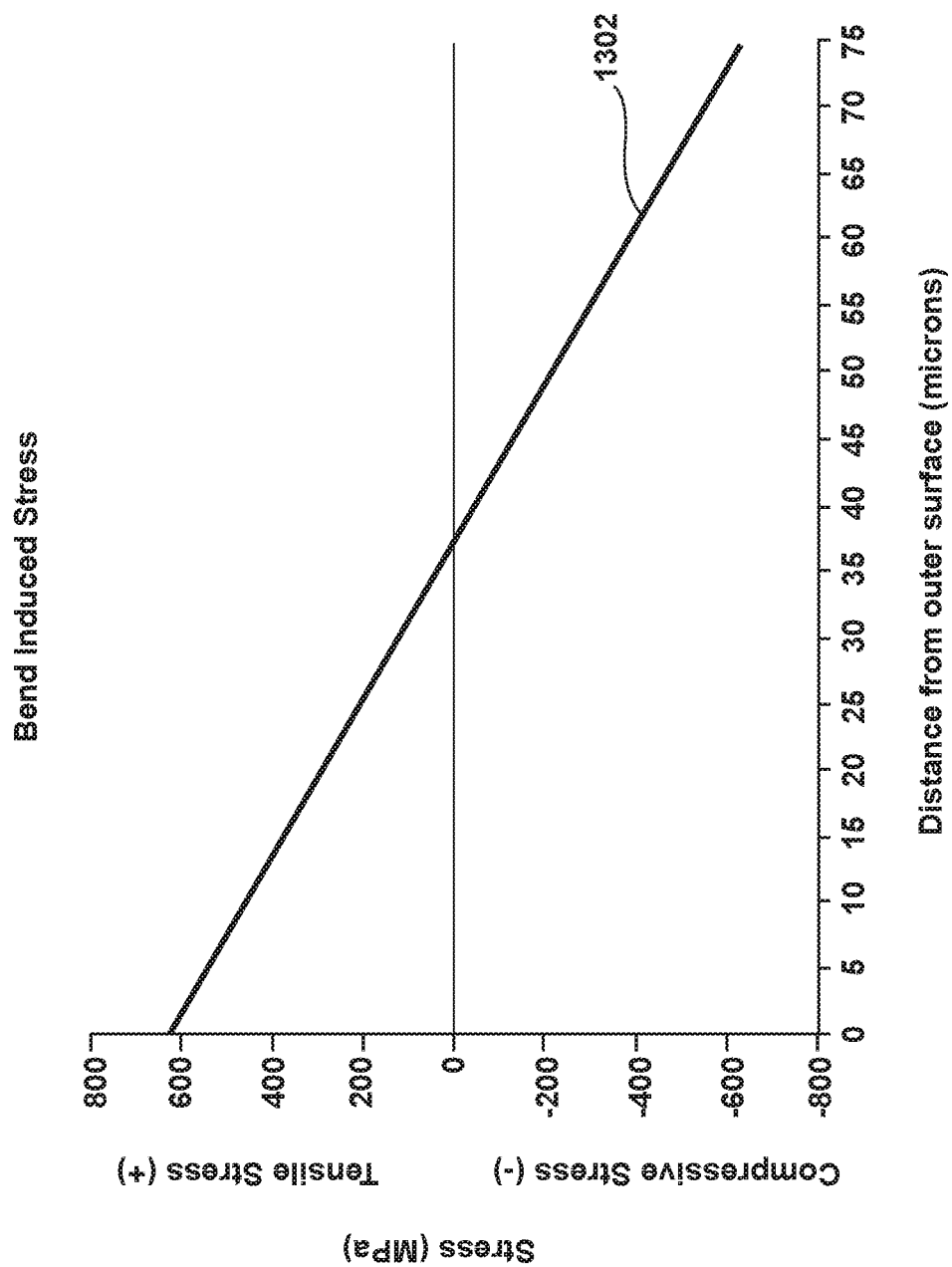
FIG. 15 is a stress profile for a foldable glass element according to embodiments of the disclosure when subject to a bending stress.

When the foldable glass element 50 employed in the foldable electronic device assemblies and cover elements of the disclosure is bent, the bend induces a second stress component $\sigma_B$ to the stress profile within the glass. For example, when the foldable glass element 50 is bent in the direction shown in FIG. 1A, tensile stress induced by the act of bending is given by Equation (1) above, and will be the maximum at the outer surface, for example first primary surface 54 of glass element 50. The second primary surface 56 will be in compression. An example of bend induced stress is shown in FIG. 15 as line 1302. Line 1302 is a bend stress plot for a 75 micron thick glass element made of Corning Code 2319 (Gorilla® Glass 2) but, for the moment, ignoring the inherent stress profile in the glass due to IOX. The parameters for Equation (1), for this type of glass, as plotted, are elastic modulus, E=71.3 GPa, Poisson's ratio, v=0.205, thickness, h=75 microns, and bend radius, R=4.5 mm.

Figure 16:
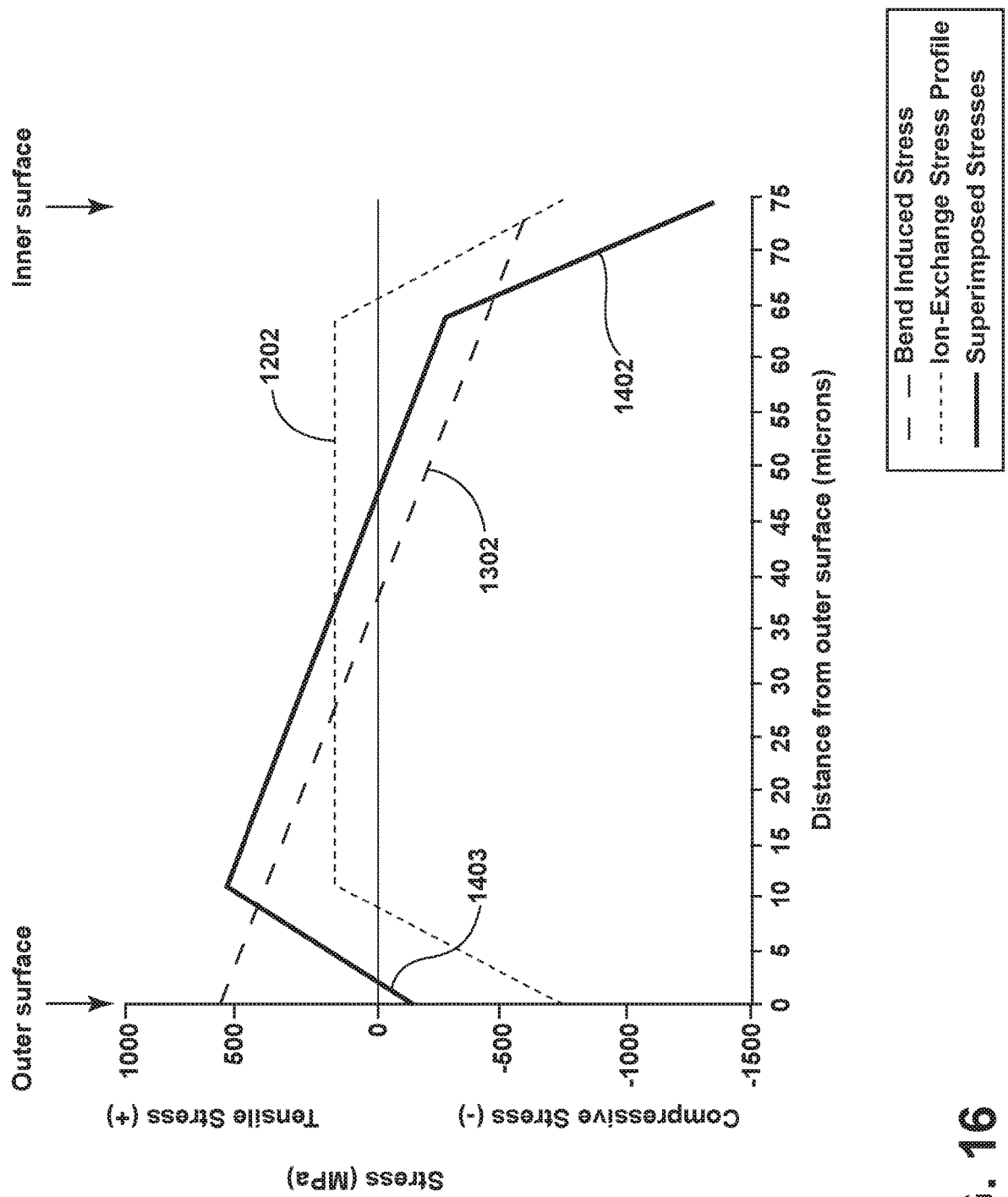
FIG. 16 is a resultant stress profile showing the stress profiles of FIGS. 6 and 7 added together.

Thus, the overall stress profile in the glass (e.g., foldable glass element 50) will be, again, the sum of the two above-described components, or $\sigma_I + \sigma_B$. The overall stress is shown in FIG. 16 as solid line 1402, which is the sum of line 1202 inherent stress, $\sigma_I$, shown in short dashes, and line 1302 bend induced stress $\sigma_B$ shown in long dashes. The stress at the outer surface of the glass element 50, for example primary surface 54 as shown in FIG. 1A, is shown at the left side of the plot, whereas the stress at the second primary surface 56 (inner) is shown at the right side of the plot. As can be seen from line 1402, the stress at the inner, second primary surface 56 is compressive and will limit the propagation of flaws. Also, at the stress at the outer or first primary surface 54 is also compressive and will limit the propagation of flaws. As shown, for the conditions noted above, the compressive stress extends from the first primary surface 54 to a depth of a few microns. The amount of compressive stress at outer primary surface, and the depth below the outer primary surface to which the compressive stress extends, can be increased in a number of ways, as noted earlier and throughout the disclosure. First, the bend-induced tensile stress may be made smaller. As can be seen from Equation (1) the bend induced stress $\sigma_B$ can be made smaller by using a thinner glass, and/or a larger bend radius, and/or a glass with a lower elastic modulus, E, and/or a glass with a higher Poisson's ratio, v. Second, the amount of compressive stress at the outer primary surface can be increased by choosing a glass with a greater inherent compressive stress $\sigma_I$ at the desired location as by, for example, using different IOX conditions, glass compositions, and/or differing processing conditions, as noted above in connection with the discussion on FIG. 14.

In some embodiments at the outer, first primary surface, i.e., the primary surface at the outside of a bent portion of foldable glass element 50, for example first primary surface 54 as shown in FIG. 1A, for a foldable or rollable display (e.g., foldable electronic device assemblies 200-200d and cover elements 100-1000 wherein the bend radius is ≤20 mm, the sum of the inherent stress $\sigma_I$ and the bend stress $\sigma_B$ can be configured to less than 0 MPa as shown by Equation (3) below.

$$\sigma_I + \sigma_B < 0 \quad (3)$$

As also noted earlier, some embodiments of the foldable electronic device assemblies 200-200d and cover elements 100-100f are such that Equation (3) results in sum of the inherent stress $\sigma_I$ and the bend stress $\sigma_B$ of less than 400 MPa (in tension), less than 200 MPa (in tension), etc.

Additionally, it can be beneficial to define the stress profile in the foldable glass element 50 of the foldable electronic device assemblies 200-200d and cover elements 100-100f so that Equation (3) is satisfied to a depth of at least 1 micron below the primary surface 54 in some examples, to a depth of at least 2 microns below the primary surface 54 in other examples, and to a depth of at least 3 microns below the primary surface 54 in still other examples, and all ranges and sub-ranges between the foregoing values. The deeper below the primary surface that Equation (3) holds, the more durable the device will be. That is, if a flaw (a scratch from handling the device during manufacturing or use, for example) extends below the primary surface to a greater degree than the relationship in Equation (3) holds, then the flaw will propagate over time and the glass element will fail. Stated another way, the IOX profile should be managed so that the stress induced from bending is contained in region 1403, i.e., line 1402 intercepts the Y axis at zero or less, to minimize failure (see FIG. 16). Additionally, in further examples, the flaw population should be managed so that flaws are contained in the region 1403, i.e., the maximum flaw depth from the glass surface does not exceed the point at which the line 1402 intercepts the X axis whereby the flaw is contained in the compressive region in the glass and will not propagate. Thus, by maximizing the area 1403, smaller bend radii and deeper flaws may be tolerated while failure is minimized.

The outer primary surface was shown as first primary surface 54 in the foregoing discussion, but in some examples the second primary surface 56 may be the outer primary surface instead of first primary surface 54. In other examples, for example in a tri-fold arrangement, both the first primary surface 54 and the second primary surface 56, may have portions that are an outer primary surface, i.e., are on the outside of a bent portion of the glass element 50. In some examples, the foldable electronic device assemblies 200-200d and cover element 100-100f (see FIGS. 1-5B) will be used with a display panel disposed on the side of second primary surface 56, whereas in other examples, these assemblies and cover elements may be used with a display panel disposed on the side of the first primary surface 54. As noted earlier, device assemblies 200-200d and cover elements 100-100f have a polymeric layer 70 disposed over one or both of the first and second primary surfaces 54, 56, whereby a viewer will view the display through the polymeric layer 70 and foldable glass element 50. See FIGS. 1A, 2A, and 3A, for example.

Impact Resistance

As noted earlier, to further increase puncture resistance (and/or durability) of the foldable electronic device assemblies and cover elements of the disclosure, a polymeric layer 70 may advantageously be used on the side of the glass element 50 receiving the load. Although not wishing to be bound by theory, when the layer 70 is on the side of the cover elements 100-100f receiving the load, it may assist in dissipating the energy from the load, thus allowing the glass element to withstand increased loading. This may be particularly true when the load is a dynamic one, as opposed to a static load as described above in connection with the stainless steel tip and tungsten carbide ball tests. One example of a dynamic loading test is a pen drop test, as described earlier in connection with the "Drop Test 1".

Figure 7A:
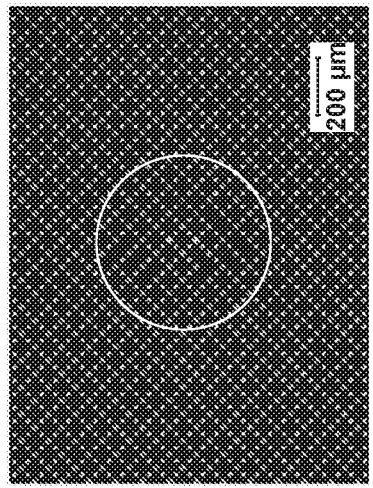
FIG. 7A is a series of photographs of the surface of a polyimide layer and the surface of an organic light-emitting diode (OLED) layer of a comparative foldable electronic device assembly after being subjected to a Drop Test 1.
Figure 7A:
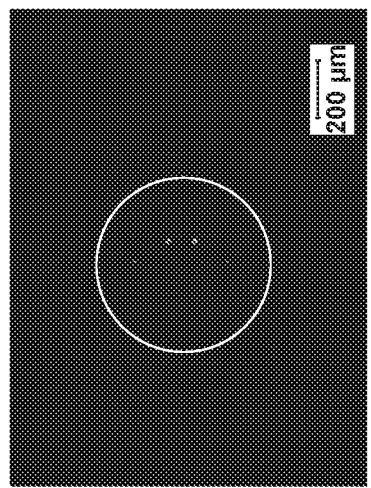
Figure 7A:
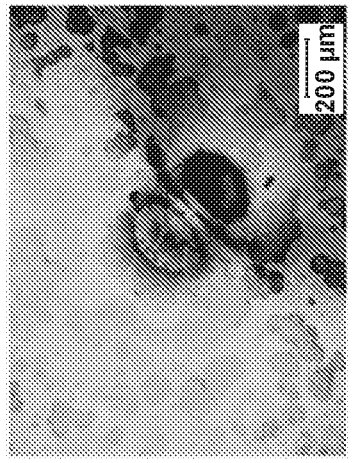

Referring now to FIG. 7A, a series of photographs is provided of the surface of a polyimide layer and the surface of an organic light-emitting diode (OLED) layer of a comparative foldable electronic device assembly after being subjected to a Drop Test 1. In this comparative foldable electronic device assembly configuration, a flexible OLED-containing substrate (i.e., a Samsung® Galaxy S6 Edge flexible OLED module) serves as a substrate. Further, two alternating layers of 50 µm thick polyimide ("PI") material and 50 µm thick removable adhesive tape are disposed over the substrate as shown in FIG. 7A.

This comparative device configuration shown in FIG. 7A, which lacks a foldable glass element and polymeric layer disposed on the glass element, was then subjected to a Drop Test 1 with various pen drop heights, with pen drops on the PI-side of the assembly. As is evident from FIG. 7A, damage was observed on the PI layer at pen drop height of 3 cm and the underlying OLED-containing substrate at a pen drop height of 7 cm. Accordingly, this comparative configuration was susceptible to damage at a pen drop height of 7 cm. In addition, the PI layer/adhesive configuration above the OLED-containing substrate did not offer any additional impact resistance as a pen drop height of 7 cm resulted in damage to both of the PI/adhesive layers and the underlying OLED-containing substrate.

Figure 7B:
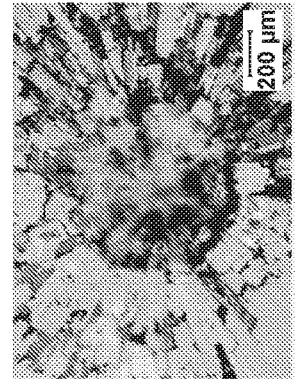
FIG. 7B is a series of photographs of the surface of a polyimide layer, the surface of a glass element, and the surface of an organic light-emitting diode (OLED) layer of a foldable electronic device assembly according to some embodiments of the disclosure after being subjected to a Drop Test 1.
Figure 7B:
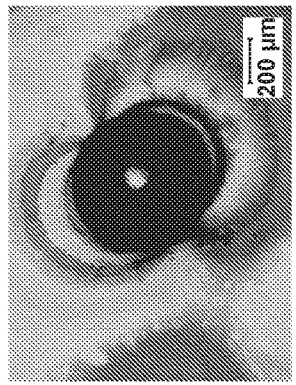
Figure 7B:
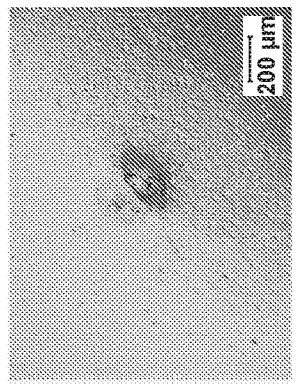
Figure 7B:
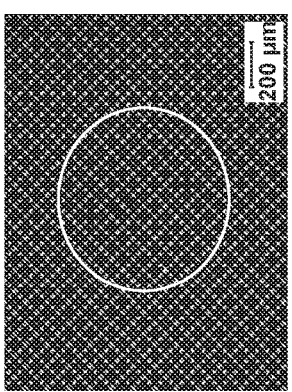
Figure 7B:
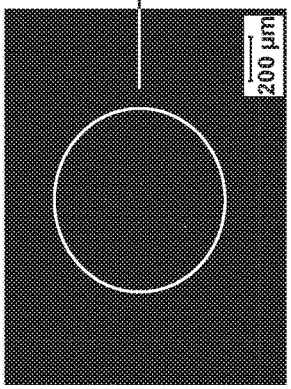

Referring now to FIG. 7B, a series of photographs is provided of the surface of a polyimide layer, the surface of foldable glass element, and the surface of an organic light-emitting diode (OLED) layer of a foldable electronic device assembly according to some embodiments of the disclosure after being subjected to a Drop Test 1 with pen drop heights of 3 cm and 17 cm. In this foldable electronic device assembly configuration, a flexible OLED-containing substrate (as comprising a PET material) serves as a substrate.

As shown in FIG. 7B, a foldable glass element (e.g., as comparable to a foldable glass element 50 depicted in FIGS. 1-1A) with a thickness of 75 µm is coupled to the OLED-containing substrate with a 50 µm thick removable adhesive tape layer. As also shown in FIG. 7B, a 50 µm thick PI layer is coupled to the foldable glass element with a 25 µm removable adhesive tape layer.

This foldable electronic device assembly configuration shown in FIG. 7B, which includes a foldable glass element and polymeric layer disposed on the glass element, was then subjected to a Drop Test 1 with various pen drop heights, with pen drops on the PI-side of the assembly. As is evident from FIG. 7B, a small dimple was observed on the outermost PI layer at a pen drop height of 3 cm, while no damage was observed in the underlying OLED-containing substrate until a pen drop height of 17 cm. Accordingly, it is evident from FIGS. 7A and 7B, that the inclusion of a foldable glass element with a polymeric layer disposed thereon advantageously tends to reduce impact-related damage, particularly to an underlying substrate.

Referring now to Table 1 below, a series of pen drop tests were conducted according to the listed samples with the Drop Test 1 outlined in the disclosure. The samples are configured as indicated in Table 1, each with an underlying, flexible OLED-containing substrate. More particularly, "OLED" refers to a flexible, OLED-containing substrate (as containing a Samsung® Galaxy S6 Edge flexible OLED module); "tape" refers to a removable adhesive tape (e.g., as comparable to an adhesive 80 as shown in FIGS. 1-1D and described herein); "PI" refers to a polyimide layer (e.g., as comparable to a polymeric layer 70 as shown in FIGS. 1-1D and described herein); "HC" refers to hard coating (e.g., as comparable to a scratch-resistant coating 90 as shown in FIGS. 1-1D and described herein); "glass" refers to a foldable glass structure (e.g., as comparable to a foldable glass element 50 as shown in FIGS. 1-1D and described herein); and "OCA" refers to an optically clear adhesive (e.g., as comparable to an adhesive 80 as shown in FIGS. 1-1D and described herein).

1). Further, the comparative example, Comp. Ex. 2, with a PI layer and an OLED-containing substrate experiences dimpling-type damage to its outermost PI layer at a pen drop height of about 3 cm (see, e.g., left-most image in FIG. 7A for an example of a dimple caused by a pen drop in the Drop Test 1). Hence, samples that do not employ a foldable glass element experience pen drop-related damage at pen drop heights of about 6.2 cm or less. Further, the addition of an HC layer and a PI layer to an OLED-containing substrate tends to marginally improve the damage resistance of an OLED-containing substrate assembly, as is evident in Comp. Ex. 3. In particular, these samples did not experience damage to their respective underlying OLED-containing substrates with pen drop heights of up to about 10 cm. Similarly, the inclusion of a foldable glass element to an OLED-containing substrate, as depicted by Comp. Ex. 4, also tends to improve the damage resistance of the assembly. In particular, these samples did not experience damage to their underlying OLED-containing substrate until a pen drop height of 9.2 cm, yet damage occurred to the glass element at a pen drop height of about 4.6 cm.

Surprisingly, however, the combination of a PI layer and a glass element over an OLED-containing substrate yields a substantial improvement in impact-related damage resistance, as is evident in the results from the inventive samples, Exs. 2 and 3. More particularly, the Ex. 2 and Ex. 3 samples exhibited no damage to their respective glass elements and OLED-containing substrates at drop heights of up to 19 cm. In view of the results from Table 1, the inventive samples Exs. 2 and 3, each with a foldable glass element and a polymeric layer, can sustain pen drop heights of up to 19 cm without damage. This stands in comparison to a comparative sample having a foldable glass element but no polymeric layer, Comp. Ex. 4, exhibiting a maximum pen drop height of 4.6 cm. Hence, these results demonstrate that cover elements and foldable electronic device assemblies, configured according to the disclosure with a polymeric layer and foldable glass element, can sustain pen drop heights of at least 1.5 times in comparison to comparable device assem-

TABLE 1

Drop test results for OLED substrate-containing samples employing Drop Test 1 (pen drop height in cm)

| Observation | OLED Comp. Ex. 1 | 50 µm PI 50 µm tape OLED Comp. Ex. 2 | 30 µm HC 75 µm PI 50 µm tape OLED Comp. Ex. 3 | 75 µm glass 50 µm tape OLED Comp Ex. 4 | 50 µm PI 50 µm OCA 75 µm glass 50 µm tape OLED Ex. 2 | 50 µm PI 25 µm OCA 75 µm glass 50 µm tape OLED Ex. 3 |
|---|---|---|---|---|---|---|
| dimple in PI or HC layer | — | 3 cm | 10 cm | — | 3.8 cm | 4.6 cm |
| OLED pixel damage | 3 cm | 5 cm | 10 cm | — | 21.2 cm | 19 cm |
| glass element damage | — | — | — | 4.6 cm | 26 cm | 20.6 cm |
| OLED bright spots | 5 cm | 6.2 cm | 10 cm | 9.2 cm | 23.4 cm | 19 cm |

As is evident from the results in Table 1, damage to pixels in the OLED-containing substrate occurs at relatively low pen drop heights of about 6.2 cm or less in the comparative examples that do not include a flexible glass element, i.e., Comp. Ex. 1 and Comp. Ex. 2. That is, certain pixels were deemed inoperative in the OLED substrate after a Drop Test 1 to a particular pen drop height (see, e.g., center-most and right-most images in FIG. 7A for an example of pixel-related damage to an OLED-containing substrate from a Drop Test blies and cover elements that include also include a foldable glass element, but lack a polymer layer.

Referring now to Table 2 below, a series of pen drop tests were conducted according to the listed samples with the Drop Test 1 outlined in the disclosure, primarily to demonstrate that the thickness variations in the samples of Table 1 had no significant bearing on those results. The samples in this example are configured as indicated in Table 2, each with an underlying, flexible OLED-containing substrate.

More particularly, the codes in Table 1 are consistent with those in Table 2 and "PET" refers to a flexible, polymeric layer comprising a polyethylene terephthalate material.

TABLE 2

Drop test results for OLED substrate-containing samples employing Drop Test 1 (pen drop height in cm)

| Observation | 50 µm PI 25 µm OCA 75 µm glass 50 µm tape OLED Ex. 3 | 50 µm PI 50 µm tape 50 µm tape 50 µm tape OLED Comp. Ex. 5 | 50 µm PI 50 µm tape 50 µm PI 50 µm tape OLED Comp. Ex. 6 | 100 µm PET 50 µm tape 50 µm tape OLED Comp. Ex. 7 |
|---|---|---|---|---|
| dimple in PI or HC layer | 4.6 cm | 3 cm | 3 cm | 3.8 cm |
| OLED pixel damage | 19 cm | 5.8 cm | 5 cm | 5 cm |
| glass element damage | 20.6 cm | — | — | — |
| OLED bright spots | 19 cm | 6.6 cm | 7.8 cm | 7 cm |

As is evident from Table 2, inventive example Ex. 3 with a foldable glass element (i.e., the same Ex. 3 sample listed in Table 1) can be compared to three comparative examples, Comp. Ex. 5, Comp. Ex. 6 and Comp. Ex. 7, each lacking a foldable glass element, but with the same overall thickness as the inventive example, Ex. 3. As demonstrated by Table 2, all of the comparative examples (Comp. Exs. 5-7), each lacking a glass element, experienced damage to their underlying OLED-containing substrates at pen drop heights of no greater than 7 cm. In comparison, the inventive example (Ex. 3) with a foldable glass element exhibited no damage to its glass element and OLED-containing substrate at drop heights of up to 19 cm. As all examples in Table 2 have the same overall thickness, it is evident that the damage resistance benefit demonstrated by the Ex. 3 sample can be associated with its foldable glass element, in combination with its polymeric layer comprising polyimide ("PI").

Two different versions of a pen drop test, Drop Test 2, and Drop Test 3, were also used to study dynamic loading on cover elements consistent with the principles of the disclosure.

In Drop Test 2, the samples were tested with the load imparted to the side of the cover element having the polymeric layer 70 thereon (when such was part of the cover element), with the opposite side of the cover element being supported by a stage made from Kydex® T material. The stage was rectangular and measured 12.7 cm by 10.16 cm (5 inches by 4 inches) with a 7.3 cm (2 and seven eighths inch) square center section having a reduced thickness. The reduced thickness section was 1.6 mm (0.0625 inches) thick, whereas the remainder (periphery) of the stage was 4.7 mm (0.185 inches) thick. The side of the glass element opposite that of impact, i.e., that resting on the stage, was taped with 3M® code 471 tape (0.14 mm thick) to contain fracture pieces, i.e., the adhesive side of the tape was applied to the glass element and the non-adhesive side rested on the stage. A tube was used to guide the pen to the sample, and the tube was suspended above the center section of the stage and generally perpendicular to the top surface of the sample. The tube had an outside diameter of 2.2 cm (seven eighths of an inch), and an inside diameter of 1.7 cm (twenty one thirty seconds of an inch). After each drop, the tube was relocated relative to the sample to guide the pen to a different impact location on the sample. The pen was a Paper Mate®, FlexGrip Elite®, having a ball point of 0.8 mm diameter, and a weight of 6.45 grams. The pen was dropped with the ball point exposed so that the ball point could interact with the test sample. The pen was first dropped from a height 2 cm, and the height incremented by 2 cm per drop until the drop caused glass fracture. The drop height causing fracture was then recorded. The pen was changed to a new pen after every 5 drops, and for each new sample tested.

Figure 21:
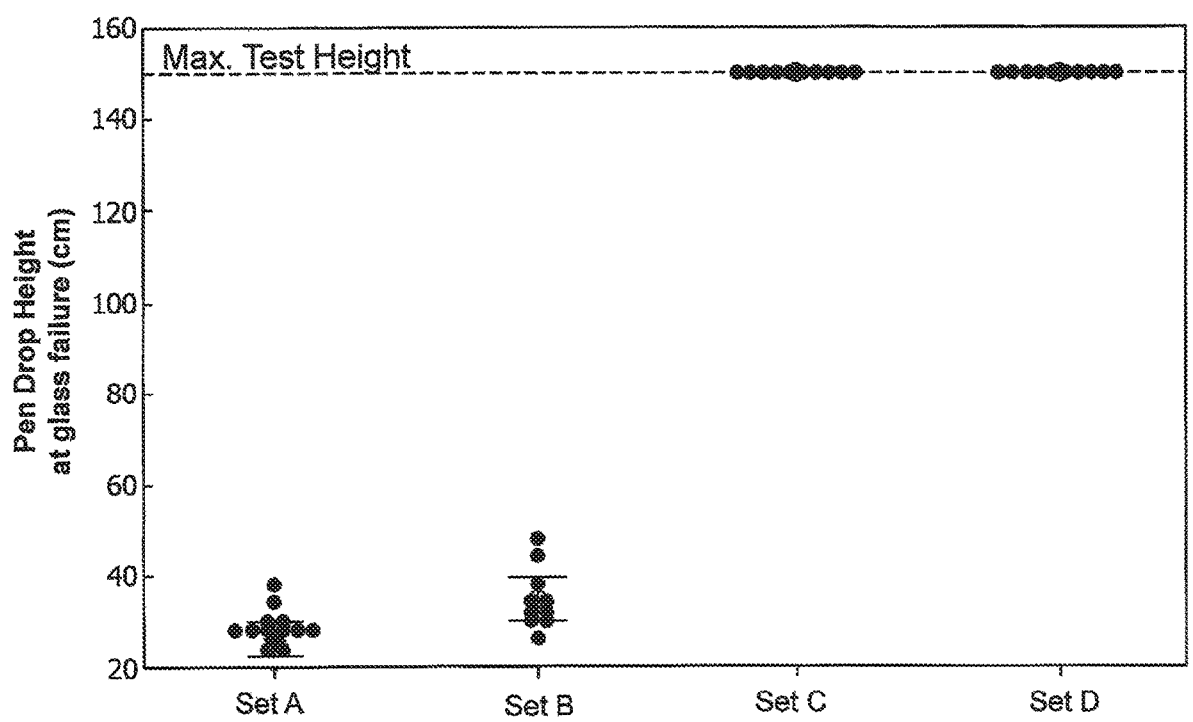
FIG. 21 is a plot of pen drop height at glass element failure for different cover element configurations according to an aspect of the disclosure.

FIG. 21 shows results of testing various glass elements with the pen drop test according to the Drop Test 2. The glass elements for this data set were prepared in a manner similar to that in which the other samples in this disclosure were prepared. Specifically, glass samples with a composition consistent with Corning® Gorilla Glass® 2.0 were subjected to a deep etch to achieve the desired thickness of about 67 microns, then subjected to IOX and to a light etch after the IOX. The resulting glass pieces were 67 microns thick, and had a compressive stress and a DOL similar to those of other samples described herein. For example Set A, the glass element was tested without any additional layer on top, i.e., the pen was allowed to drop directly onto the glass element. For example Set B, the glass element was tested with a 12.7 micron thick PET layer set on top thereof, without any adhesive coupling between the glass element and the additional layer. For example Set C, the glass element was tested with a 254 micron thick PET layer set on top thereof without any adhesive coupling between the glass element and the additional layer. For example Set D, the glass element was tested with a 127 micron thick PC layer set on top thereof without any adhesive coupling between the glass element and the additional layer. As can be seen from FIG. 21, by comparing Set A with any one of Sets B-D, the glass element was able to withstand an increased pen drop height, i.e., was able to absorb more load energy, without damage when an additional layer was present than when the additional layer was not present. Further, the properties of the additional layer (for example, thickness of the layer, and material from which the layer is made) affect the ability of the cover element to absorb energy without failure. By comparing Set B with Set C, it is seen that generally increasing the thickness of the polymeric layer 70 allows the cover element (e.g., as employed in a foldable electronic device assembly) to absorb more load energy, i.e., the cover element can withstand a higher pen drop height. Also, the choice of material for the layer 70 will affect the ability of the cover element to absorb energy. By comparing Set C with Set D, it is seen that a thinner (127 micron) layer of PC was able to withstand at least the same amount of load energy, i.e., a pen drop height of 150 cm (the maximum testing height), as did the thicker (254 micron) layer of PET.

In Drop Test 3, the samples were tested with the load imparted to the side of the cover element having the polymeric layer 70 thereon (when such layer was part of the cover element), with the opposite side of the cover element being supported by an aluminum plate. No tape was used on the side of the glass element resting on the aluminum plate. A tube was used to guide the pen to the sample, and the tube sat on the top surface of the sample so that the longitudinal axis of the tube was generally perpendicular to the top surface of the sample. The tube had an outside diameter of 2.54 cm (1 inch) and an inside diameter of 1.4 cm (nine sixteenths of an inch). After each drop, the tube was relocated relative to the sample to guide the pen to a different impact location on the sample. The pen was a BIC® with an Easy-Glide System®, Fine, and having a ball point of 0.7 mm diameter, and a weight of 4.68 grams. The pen was dropped with the cap attached to the top end so that the ball point could interact with the test sample. The pen was first dropped from a height of 1 cm, and the height incremented by 1 cm per drop until the drop caused glass fracture. The drop height causing fracture was then recorded. The pen was changed to a new pen after every 5 drops, and for each new sample tested.

Table 3, below, shows the results of testing various glass elements with the pen drop test according to Drop Test 3. The glass elements for this data set were prepared in a manner similar to that in which the other samples in this disclosure were prepared. Specifically, glass samples with a composition consistent with Corning® Gorilla Glass® 2.0 were subjected to a deep etch to achieve the desired thickness of about 75 microns, then subject to IOX and to a light etch after the IOX. The resulting glass pieces were 75 microns thick, and had a compressive stress and a DOL similar to those of other samples described herein. A polymer layer was laminated to the glass element with a pressure sensitive adhesive. The pen was then dropped onto the sample with the polymer layer facing toward the incoming pen. Various combinations of polymer layer thickness and adhesive thickness were used, wherein the same materials for each the polymer layer and adhesive were used in each sample set. For this set of tests: the glass element was tested by itself in Set E; for set F, the glass element was laminated to an 80 micron thick PI plus HC layer with a 50 micron thick PSA layer, wherein the HC faced toward the incoming pen; for set G, the glass element was laminated to a 50 micron thick PI plus HC layer with a 50 micron thick PSA layer, wherein the HC faced toward the incoming pen; for set H, the glass element was laminated to an 80 micron thick PI plus HC layer with a 30 micron thick PSA layer, wherein the HC faced toward the incoming pen. As is seen from Table 3, by comparing Set E with any one of Sets F-H, the glass element was able to withstand an increased pen drop height, i.e., was able to absorb more load energy, without damage when an additional layer was present than when the additional layer was not present. Further, the properties of the additional layer (for example, thickness of the layer, and thickness of the adhesive) affect the ability of the cover element (e.g., as employed in a foldable electronic device assembly) to absorb energy without failure. By comparing Set F with Set G, it is seen that generally increasing the thickness of layer 70 allows the cover element to absorb more load energy, i.e., the cover element can withstand a higher pen drop height of 32 cm with an 80 micron thick layer, whereas it is able to withstand a pen drop height of only 18 cm with a 50 micron thick layer of the same material. Also, the thickness of the adhesive used to couple the layer with the glass element will affect the ability of the cover element to absorb energy. By comparing Set F with Set H, it is seen that a cover element with an adhesive layer thickness of 50 microns as in set F, was able to withstand a higher a pen drop height (32 cm) than was the cover element having an adhesive thickness of only 30 microns (glass thickness and additional layer thickness/material being equal) which withstood a pen drop height of only 9 cm. Again, without wishing to be bound by theory, in some examples, the thicker adhesive may absorb and/or dissipate and/or distribute more of the load energy imparted by the dropping pen than does a thinner adhesive of the same material whereby the thicker adhesive better protects the glass element of the cover element (e.g., as employed in a foldable electronic device assembly).

TABLE 3

| Sample Set | Lamination | Thickness (um) | Results failure height (cm) |
|---|---|---|---|
| E | None | 75 | 2-3 |
| F | 80 um HC + PI with 50 um PSA | 75 | 32 |
| G | 50 um HC + PI with 50 um PSA | 75 | 18 |
| H | 80 um HC + PI with 30 um PSA | 75 | 9 |

Although the samples of FIG. 21 and Table 3 were not specifically tested for bend radius, because the glass elements were prepared in the same manner as other samples discussed herein, they are expected to be able to achieve similar bend radii. And this would be particularly true if the cover element is bent so that the center of curvature is on the side of the cover element on which the additional layer is not present. That is, when bending the cover element as shown in FIG. 1A, 2A, 3A, 4A, or 5A, the polymeric layer 70 may provide additional benefit to the glass by beneficially shifting the neutral stress axis as discussed in PCT Patent Application No. PCT/US15/44596, filed on Aug. 11, 2015. Thus, a polymeric layer 70 as described above in connection with FIG. 21 and Table 3 may be particularly useful for providing puncture resistance when using thinner glass elements in an attempt to achieve tighter bending radii.

Although the loading conditions for the puncture resistance test (as with the stainless steel tip or tungsten carbide ball) and pen drop tests described above are different in the sense of static versus dynamic loading, one would generally expect that, directionally, given the characteristics and thicknesses of materials in the cover element, the tests are both indicative of the ability of the cover element to absorb energy without failing. That is, the ability of the cover element to withstand a higher static load than does another cover element is also generally indicative that it will withstand a higher dynamic load as well.

Benefit of Light Etch Step After IOX

Figure 17:
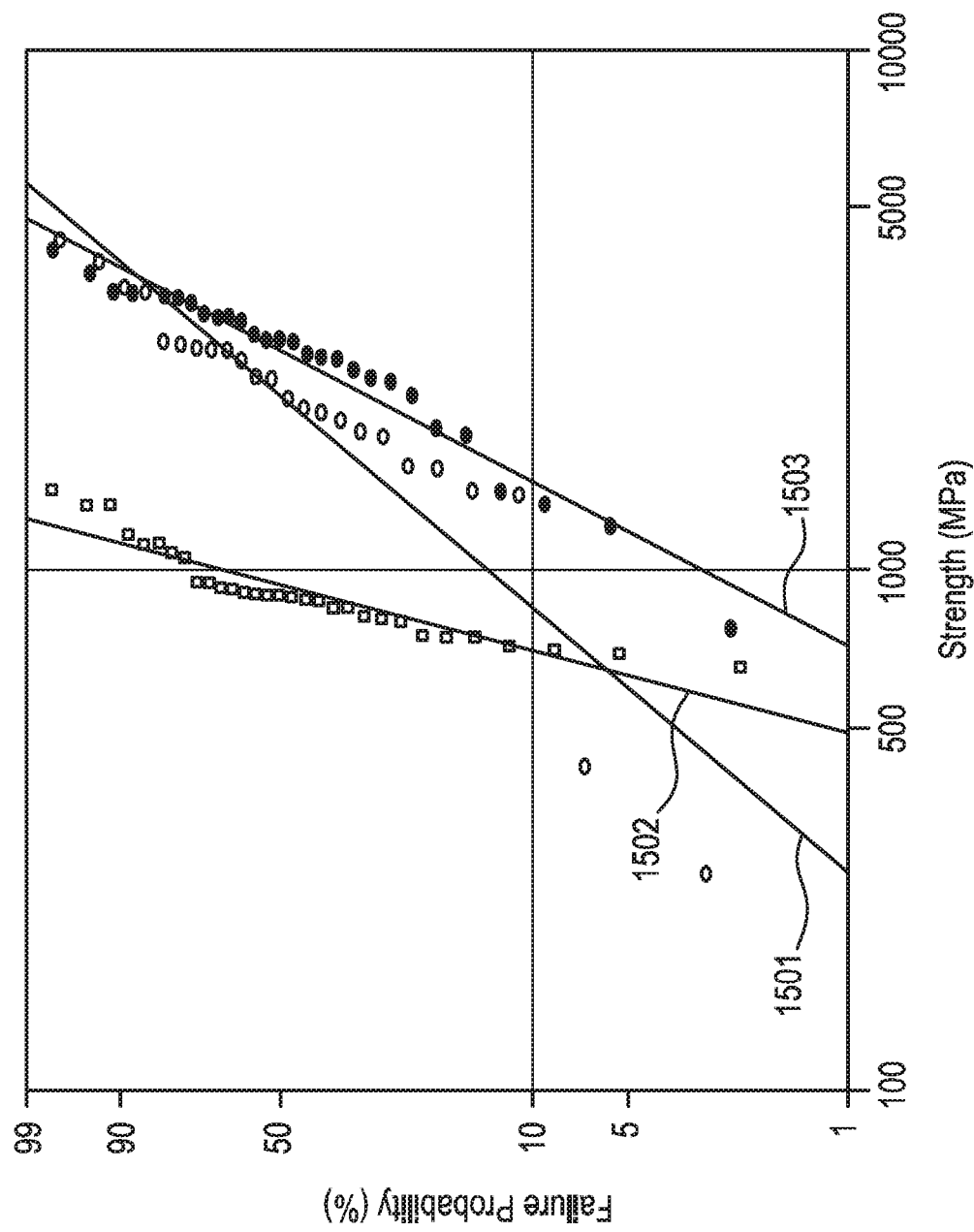
FIG. 17 is a Weibull plot of failure probability vs. strength under two point bending of various different glass samples.
Figure 18:
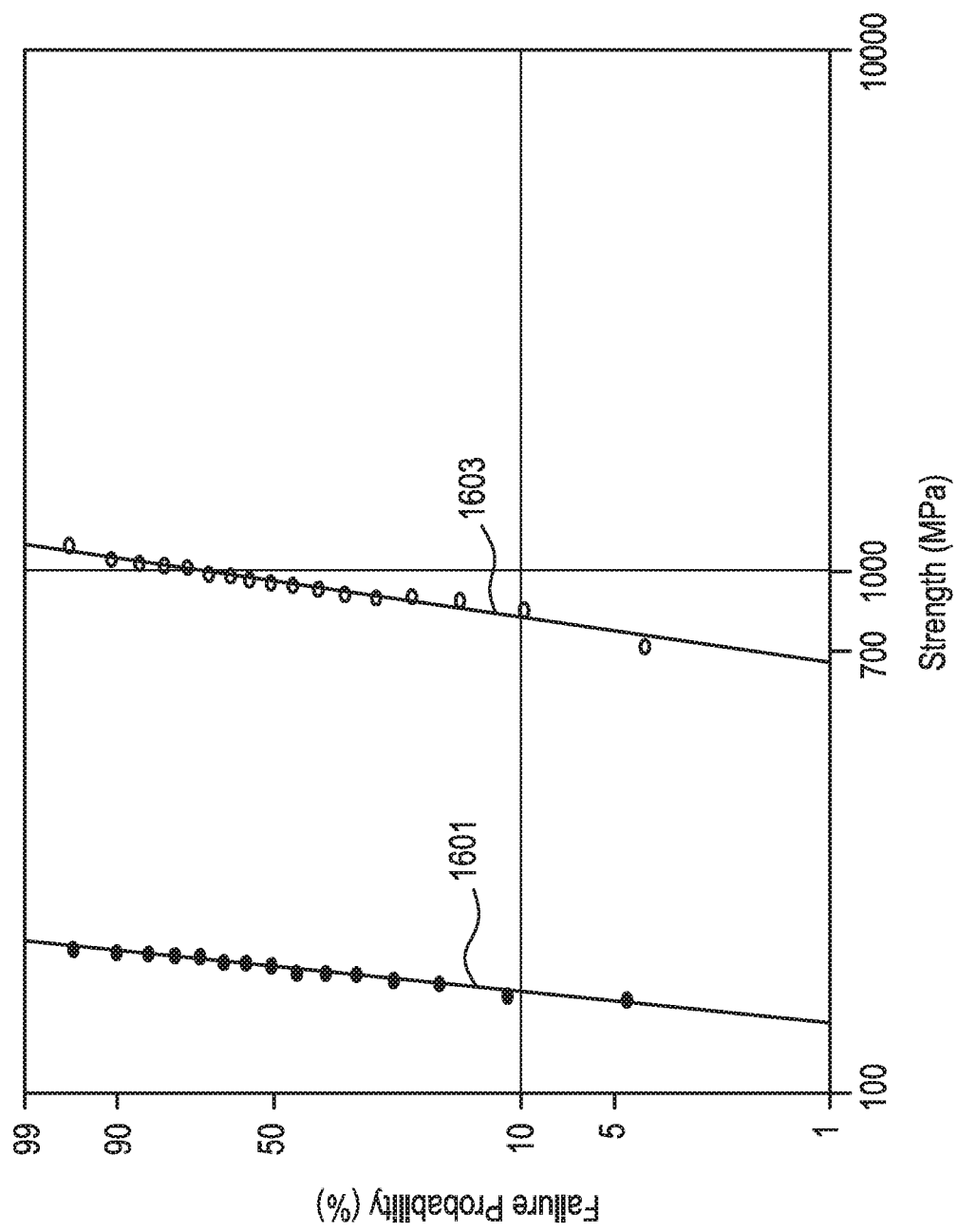
FIG. 18 is a Weibull plot of failure probability vs. strength under two point bending of various different glass samples after cube corner contact.

The benefit of performing an etching step after an IOX strengthening step is shown in FIGS. 17 and 18, which show various two point bend strength distributions. The two point bend values in these figures were measured by testing the samples as follows. The samples were stressed at a constant rate of 250 MPa/sec. For the two point bending protocol, see S. T. Gulati, J. Westbrook, S. Carley, H. Vepakomma, and T. Ono, "45.2: Two point bending of thin glass substrates," in SID Conf., 2011, pp. 652-654. The environment was controlled at 50% relative humidity and 25° C. The data sets show the maximum stress at failure, and assume that the failure occurs at the minimum radius location. Line 1501 shows a Weibull distribution for strength of glass samples that were deep etched from 200 microns thick to 75 microns thick (no IOX or subsequent etching were performed on these samples). This set of samples shows a strength of about 850 MPa at a 10% failure probability. Line 1502 shows a Weibull distribution of strength of glass samples that were deep etched from 200 microns thick to 75 microns thick and then subject to IOX (but no subsequent etching). These samples show a slightly decreased strength, of about 700 MPa at a 10% failure probability, from the values for the deep-etched-only samples of Line 1501. Not wishing to be bound by theory, it appears that the IOX process reduces strength by extending flaws. Line 1503 then shows a Weibull distribution of strength of glass samples that were deep etched from 200 microns thick to 75 microns thick, subject to IOX under the same conditions as the samples of Line 1502, and then given a subsequent light etching to remove<2 microns of thickness from each surface. These samples show an increased strength, of about 1500 MPa at a 10% failure probability, with respect to each of the sample sets of Line 1501 and 1502. FIG. 17 thus shows the benefits of performing a light etch after the IOX. Again, not wishing to be bound by theory, it is believed that the light etch after IOX reduces flaw depth and blunts crack tips introduced by the IOX process itself and, thus, increases the strength of the samples.

Although IOX appears to reduce the strength in deep-etched samples (as seen in FIG. 17), FIG. 18 shows another benefit (in addition to that discussed above in connection with FIGS. 14-16) of strengthening the primary surfaces of the glass for foldable and/or rollable displays. In particular, non-IOXed glass is subject to fatigue by not having its outer surface (of a bend) in compression. Accordingly, non-IOXed glass samples are more likely to see time delayed failure. Line 1601 shows a Weibull distribution of strength of glass samples that were only deep etched from 200 microns thickness to 75 microns thickness (these were not IOXed), and that were subject to 2 point bend strength testing following a very low load 10 gf contact with a cube corner diamond indenter. In particular, the cube corner test was performed on a Mitutoyo HM-200 Hardness Testing Machine with a cube corner diamond indenter tip. The test was performed on bare glass placed on the sample stage of the apparatus. The load of 10 grams force (go was applied and held for a dwell time of 10 seconds. The indentation was performed in 50% relative humidity and 25° C. The indent is centered in the testing sample, so that this will be the location of maximum stress (minimum radius) when testing by two point bend test. Following indentation, the samples were held in the same environment for 24 hours prior to the two point bend test as described above. The line 1601 shows a strength of about 150 MPa at a 10% failure probability. Line 1603 shows a Weibull distribution of strength of glass samples that were deep etched from 200 microns thickness to 75 microns thickness, were IOXed, subsequently etched to remove 2 microns thickness from each side, and then were subject to 2 point bend strength testing following a very low load 10 gf contact with a cube corner diamond indenter. The line 1603 shows as strength of about 800 MPa at a 10% failure probability. By comparing line 1601 with Line 1501, and by comparing Line 1603 with line 1503, it is seen that any contact will greatly reduce the strength of a non-strengthened part. However, by comparing Line 1603 with Line 1601, it is seen that the damage is contained within the compression depth for the IOXed part, giving greater strengths for the strengthened parts of Line 1603 than for the non-strengthened parts of Line 1601. Accordingly, strengthening, by IOX for example, is a beneficial manner of reducing the effects of contact damage, even contact damage caused by relatively low loads of 10 gf Vickers Crack Initiation Examples of glass elements according to the present disclosure are also capable of providing resistance to the formation of strength limiting flaws. This is beneficial when the glass element is used as a cover glass and subject to contact as from a user, or other contact event. Although not wishing to be bound by theory, IOX also provides resistance to the formation of strength-limiting flaws. A force of greater than 2 kgf is necessary to produce/initiate a crack of >100 microns in samples of glass that have been deep-etched, IOXed, and then light etched, as discussed above. FIGS.

Figure 19A:
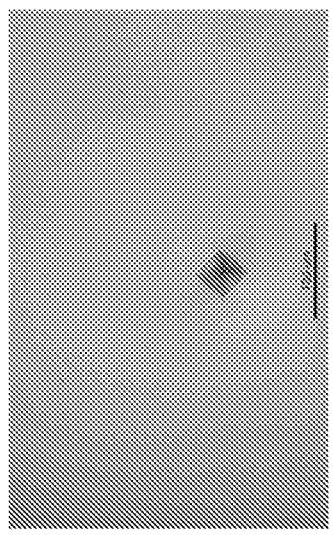
FIG. 19A is a sample glass according to aspects of the disclosure after indentation with Vickers indenter under 1 kgf load.
Figure 19B:
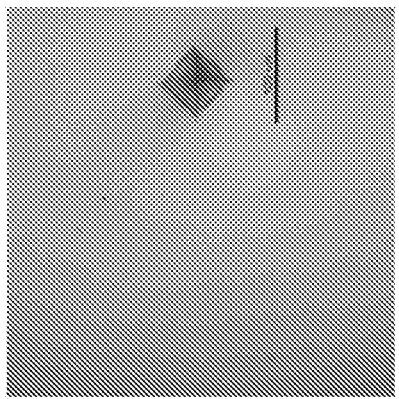
FIG. 19B is a sample glass according to aspects of the disclosure after indentation with a Vickers indenter under 2 kgf load.
Figure 19C:
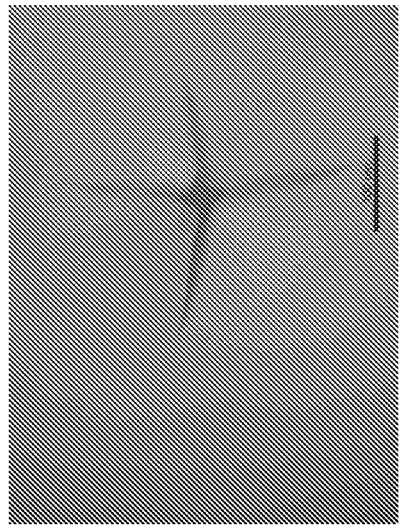
FIG. 19C is a comparative glass after indentation with Vickers indenter under 1 kgf load.
Figure 19D:
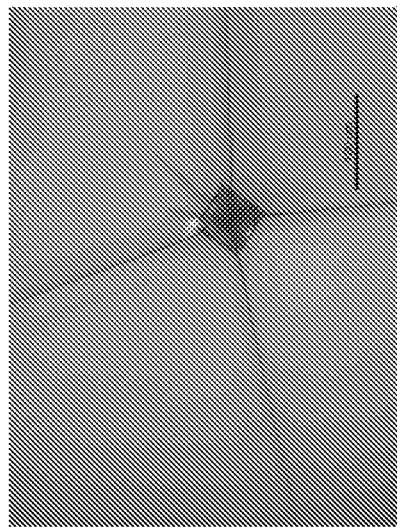
FIG. 19D is a comparative glass after indentation with a Vickers indenter under 2 kgf load.

19A, 19B, 19C and 19D show a comparison between samples FIGS. 19A and 19B that were IOXed (subject to deep-etch, IOX, and then light etch as discussed above) and those in FIGS. 19C and 19D that were not IOXed (but were simply deep etched). FIG. 19A shows an IOXed sample that was subject to a 1 kgf load with a Vickers diamond indenter. The Vickers crack initiation test was performed on a Leco Vickers Hardness Tester LV800AT. The test was performed on bare glass placed on the sample stage of the indentation apparatus. The glass was indented at increasing load until more than 50% of ten indents made at a given load showed the presence of strength limiting flaws. The indentation was performed under ambient conditions with an indent dwell time of 10 seconds. As seen in FIG. 19A, the indenter produced a flaw of less than 100 microns. FIG. 19B shows an IOXed sample that was subject to a 2 kgf load with a Vickers indenter. Similarly to FIG. 19A, the indenter produced a flaw of less than 100 microns. Accordingly, it is seen that examples of the present disclosure can withstand a 2 kgf load without incurring a strength limiting flaw, i.e., a flaw of greater than 100 microns. FIG. 19C shows a non-IOXed glass sample that was subject to a 1 kgf load with a Vickers indenter. As seen in FIG. 19C, the indenter produced a flaw of greater than 100 microns. FIG. 19D shows a non-IOXed glass sample that was subject to a 2 kgf load with a Vickers indenter. As seen in FIG. 19D, the indenter produced a flaw of much greater than 100 microns. A comparison of FIG. 19A with FIG. 19C, and a comparison of FIG. 19B with FIG. 19D, shows that the IOXed glass parts are able to provide resistance to the formation of strength limiting flaws, i.e., of flaws greater than 100 microns. As can be seen by a comparison of FIGS. 19B and 19D, a very small increase of force on the Vickers indenter (i.e., from 1 kgf to 2 kgf) produces a much larger flaw in the non-strengthened part. Although not wishing to be bound by theory, it is thought that the Vickers indenter requires much more force (than does the cube corner) to produce strength-limiting flaws because the Vickers indenter has a much wider angle than does the cube corner indenter.

Vickers Hardness

The glass element has a Vickers Hardness of from 550 to 650 kgf/mm². The Vickers hardness was measured on a Mitutoyo HM-114 Hardness Testing Machine. The hardness was measured by indenting at 200 grams force (gf) and measuring the average of the two major diagonal lengths of the resulting impression. The hardness was calculated by the following equation: $VHN=(P*1.8544)/d^2$, where VHN is Vickers hardness number, P is the applied load of 200 gf, and d is the average major diagonal length. Typically ten VHN measurements are taken to determine the average VHN. Indentation is performed in 50% relative humidity and 25° C. The test is performed on bare glass placed on the sample stage of the indentation apparatus. The dwell time of the indentation is 10 seconds. Hardness, including Vickers Hardness, is a measure of permanent deformation in a material. The harder a material, as evidenced by a higher Vickers Hardness number, the less the permanent deformation in the material. Accordingly, hardness is a measure of scratch and other damage resistance of the material to, for example, keys, and things of similar or lesser hardness that may come into contact with the material. A Vickers Hardness of from 550 to 650 kgf/mm² provides suitable scratch and other damage resistance of a device cover to keys and other objects that may be found in a user's pocket or backpack, for example, together with the device cover.

Closing Force

Another consideration in a foldable or bendable display is the force to get the device to fold or bend. The force necessary to close the device should not be so high as to make the user uncomfortable when closing it. Additionally, the force should not be so high as to tend to make the device want to open when it is intended to stay closed. Accordingly, the two point bend closing force should be limited. However, because the two point bend closing force also depends upon the dimension of the glass element extending along the direction of the fold line, herein called width, the forces should be normalized based on width. The two point bend closing force is given by Equation (4) below, which assumes that the glass will behave as if it were disposed between two parallel plates, i.e., so that it does not have a constant bending radius. The $(1-v^2)$ term under the modulus takes into account that for a material such as glass, a stress/bend in one direction will produce a shrinking in another direction. This is typically the case for plate-shaped objects.

$$F = \left(\frac{wt}{6}\right)\left(\frac{\sigma_{max}^2}{\left(\frac{E}{1-v^2}\right)}\right) \quad (4)$$

wherein t is the thickness of the sample in mm, w is the width in mm of the glass element along the fold line, E is the modulus of the glass material in GPa, v is the Poisson's ratio of the material, and wherein $\sigma_{max}$ is given by the following Equation (5) when using the parallel plate two point bend method.

$$\sigma_{max} = 1.198 \frac{E}{1-v^2}\left[\frac{t}{(D-t)}\right] \quad (5)$$

wherein E is the modulus of the material in GPa, v is the Poisson's ratio of the material, t is the thickness of the material in mm, and D is the separation distance (in mm) between the parallel plates. Equation (5) is the maximum stress in a parallel plate bend apparatus, and is different from that in Equation (1) because it accounts for the fact that the sample will not achieve a uniform constant bend radius (as was assumed for Equation (1)) in the test apparatus, but will have a smaller minimum radius. The minimum radius (R) is defined as D−h=2.396 R, wherein h is the glass thickness in mm and is the same as t. The minimum radius R, determined for a given plate separation can be used in Equation (1) to determine maximum stress.

Dividing each side of Equation (4) by w, width of the glass element along the fold line, leads to a value for F/w. Plugging in values for the glass samples found by the inventors to have particularly beneficial closing force—thickness t=0.075 mm, a plate separation distance D=10 mm (wherein plate separation distance is that in a two point bend method via parallel plates as discussed below in connection with the cycle testing), a modulus E of 71 GPa, a Poisson's ratio v of 0.205—the inventors have found that a value of F/w of 0.076 N/mm or less leads to an acceptable closing force, i.e., one that is not uncomfortable to a user, and one that does not tend to make the device open when in its folded state. By way of example, the inventors found that with a width of 105.2 mm, a closing force of 7.99N was acceptable. And with a width of 20 mm, a force of 1.52 N was acceptable. Thus, again, normalizing for width, a value F/w=0.076 N/mm or less was found to be acceptable.

Cycle Test

During use in a display or other device, the glass element 50 may be subject to repeated bending cycles. For example, the display device may be repeatedly folded and unfolded. Thus, to determine a suitable lifetime of the device, it is beneficial to characterize the number of cycles that the glass element may be folded and unfolded. To test the cyclic bending durability of glass element 50, the glass element 50 was disposed in a curved shape between two parallel plates 2102 and 2104 (See FIG. 20) having an initial separation distance D of 30 mm. The plates were then moved, while remaining parallel, so as to decrease the separation distance to a target distance, held at that target distance for about a second, and then returned to the initial separation distance of 30 mm, held at the initial separation distance for about a second, thus ending a cycle. The plates were moved at a rate of 38 mm/s. The cycle is then repeated. The number of cycles may then be counted until the glass element fails. Although an initial separation distance D of 30 mm was chosen, in other tests, the initial separation distance may be greater or less than 30 mm. The value of 30 mm was chosen as a distance at which there would not be significant load on the glass element 50. The target distance can be varied so as to achieve a target bend radius that one desires to test. The target bend radius (being the tightest radius achieved by the glass element being tested) is equal to 0.414 times the separation distance D of the parallel plates 2102, 2104. This is a simplified calculation that essentially ignores the glass thickness h (or t) from the calculation of minimum bending radius R in the discussion following Equation (5) because the glass thickness of interest will typically be much less than the plate separation distance D. However, to the extent necessary, the glass thickness can be accounted for by using the calculation for minimum bending radius R in the discussion following Equation (5) above. The bend radius is not simply half of D because the glass element does not form a perfect semicircle in the test apparatus. Thus, to test different target bend radii, different parallel plate distances can be suitably calculated. As shown, first primary surface 54 makes the outer surface of the bend and contacts with the inner surfaces of the parallel plates, whereas second primary surface 56 forms the inner surface of the bend. When a polymeric layer 70 is present on first primary surface 54, such would be in contact with the parallel plates. Because the thickness 72 of polymeric layer 70 can be minimal, in some embodiments (on the order of 1 micron or less), its thickness may be ignored when calculating bend radius (for first primary surface 54, as shown in FIG. 22) from plate separation distance D. However, to the extent that the polymeric layer 70 has any significant thickness, according to other embodiments, the plate separation distance D may be increased by twice the second layer thickness in order to achieve a desired target bend radius at the primary surface being tested (as shown in FIG. 22, first primary surface 54). Although first primary surface 54 is shown as being the outer primary surface of the bent configuration of element 50, a similar method may be used to test bend radius and cycling with second primary surface 56 as the outer surface of the bend, as appropriate to the configuration which glass element 50 will take in an end device.

A glass element according to one example of the present disclosure was 75 microns thick, had an IOX compressive stress of 775 MPa, and a DOL of 10 microns, and withstood over 200,000 bending cycles at a target plate separation distance D of 9 mm, as described above. Another glass element according to another example of the present disclo sure was 75 microns thick, had an IOX compressive stress of 775 MPa, and a DOL of 10 microns, and withstood over 200,000 bending cycles at a target plate separation distance D of 8 mm, as described above. For a typical display device, passing 200,000 bending cycles is considered a suitable lifetime.

Figure 20:
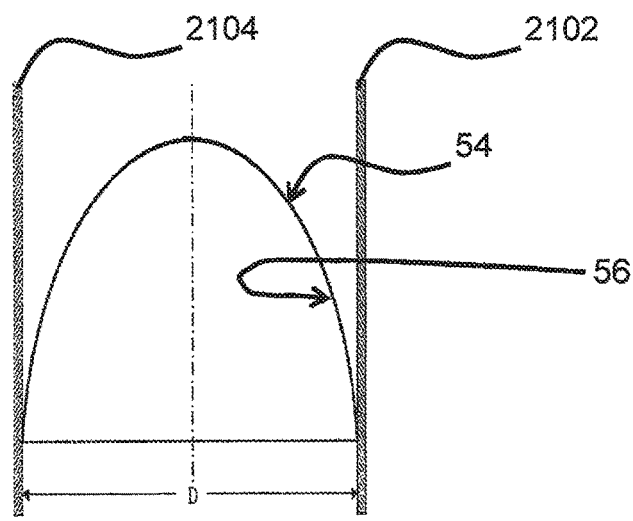
FIG. 20 is a two point bend test configuration.

Still further, although a dynamic bending test is described above, a similar parallel plate test apparatus may be used to test a static bend radius. In this case, the parallel plates 2102, 2104 (see FIG. 20) are set to a desired separation distance D so that 0.414 times the plate separation distance equals the desired static bend radius to be tested. Once the parallel plates 2102, 2104 are set at the necessary separation distance D, the glass element is placed between the parallel plates so as to achieve a bent configuration as shown in FIG. 20.

After a relaxation time of 1 hour (or another specified relaxation time), the height of the remaining crease or bend in the sample is measured.

Referring now to Table 4 below, a series of Static Bend tests were conducted according to the listed samples. The samples are configured as indicated in Table 4, each with an underlying, flexible 100 μm thick PET material as a surrogate for an OLED-containing substrate (labeled "PET"). As also listed in Table 4, "PI" refers to a polyimide layer (e.g., as comparable to a polymeric layer 70 as shown in FIGS. 1-1D and described herein); "glass" refers to a foldable glass structure (e.g., as comparable to a foldable glass element 50 as shown in FIGS. 1-1D and described herein); and "OCA" refers to an optically clear adhesive (e.g., as comparable to an adhesive 80 as shown in FIGS. 1-1D and described herein).

TABLE 4

Static Test results for OLED substrate-containing samples
(remaining bend/crease height or plate distance in mm)

| Test Condition | 100 μm PET Comp. Ex. 8 | 50 μm PI 25 μm OCA 100 μm PET Comp. Ex. 9 | 75 μm glass 50 μm OCA 100 μm PET Ex. 4 | 50 μm PI 75 μm glass 50 μm OCA 100 μm PET Ex. 5 | 50 μm PI 50 μm OCA 25 μm OCA 75 μm glass 50 μm OCA 100 μm PET Ex. 6 |
|---|---|---|---|---|---|
| initial plate distance | 10.5 mm | 10.5 mm | 10.5 mm | 10.5 mm | 10.5 mm |
| 480 hrs @ 85° C./85% RH | 68 mm | 57 mm | 48 mm | 47 mm | 46 mm |
| 480 hrs @ 85° C./85% RH + 168 hrs relax | 71 mm | 52 mm | 34 mm | 40 mm | 42 mm |

Resistance to Permanent Warp and Deformation

In addition to the damage resistance afforded by the foldable electronic device assemblies and cover elements of the disclosure, these device assemblies and cover elements also offer resistance to permanent warp and deformation associated with bending and folding evolutions. When devices containing OLED display modules are designed for bendable, foldable or rollable applications, stresses are developed in these modules from repeated opening/closing (dynamic bend) or prolonged exposure to a bend or fold in a closed or partially open position (static bend). As a result of these stresses, the polymers in conventional OLED-containing display modules can permanently deform at the locations of these bends and/or in proximity to them. In contrast, the foldable electronic device assemblies and cover elements of the disclosure are significantly more resistant to such permanent warp and deformation.

To simulate these effects, a high-temperature and high-humidity bend test (referred to as a "Static Test" herein) was conducted. In the Static Test, samples are installed between two metal alloy plates. The two metal plates are disposed in parallel to one another at a specified distance. As the plates are moved together to the specified distance, the sample is bent into a desired C-shaped configuration. Unless otherwise noted, the samples are bent such that the bend radius of curvature is located on the OLED-containing substrate side of the sample, akin to the bend direction shown in FIG. 1A. Hence, for samples containing a foldable glass element, the first or outer primary surface is placed in tension from the bend and the second or inner primary surface of the glass element is placed in compression by the bend. Further, as the Static Bend Test is conducted with a constant spacing between the two metal plates, the samples are subjected to an atmosphere of 85% relative humidity and 85° C. temperature. After a particular test duration (e.g., 120 hours, 240 hrs, 480 hours, etc.), a sample is removed from the plates and the specified 85° C./85% relative humidity atmosphere.

As is evident from Table 4, the comparative example employing a 100 μm thick PET layer (Comp. Ex. 8) demonstrates a remaining bend of 68 mm after 480 hours on test that does not significantly reduce after another 168 hours of relaxation outside of the test. As additional polymeric materials are added (Comp. Ex. 9), particularly a PI layer with less viscoelasticity than PET, the remaining bend heights after 480 hours on test and after an additional 168 hours of relaxation are reduced to 57 mm and 52 mm, respectively. Moreover, the PI layer appears to cause some degree of relaxation as the bend height in Comp. Ex. 9 is reduced from 57 mm to 52 mm after the 168 hour relaxation time. This is an indication of resistance to permanent warp and deformation. The results are even more pronounced in the inventive samples (Exs. 4-6) that include a 75 μm thick glass element. In particular, these samples exhibit about 46 mm to 48 mm bend heights after 480 hours on test, and bend heights of about 34 mm to 42 mm after 168 hours of additional relaxation.

Accordingly, the flexible electronic device assemblies 200-200d of the disclosure (see FIGS. 1-3B and corresponding description), and variants consistent with these exemplary assemblies, can comprise an ability to resist permanent warp such that a permanent warp of the foldable electronic device assembly is at least 10% lower than a permanent warp of a comparable foldable electronic device assembly, wherein the permanent warp of the device assemblies is measured according to the Static Test after a hold time on test of 480 hours at 85° C. and 85% relative humidity. Still further, the comparable foldable electronic device assembly comprises (a) a comparable substrate and comparable polymeric layer comprising the same dimensions and compositions as the respective substrate and polymeric layer of the foldable electronic device assembly, and (b) a comparable foldable polymeric element disposed between the comparable substrate and comparable polymeric layer that comprises a polyimide (PI) comprising the same, or a smaller, thickness as the glass element of the foldable electronic device assembly. In some embodiments, the foldable electronic device assembly 200-200d can be configured with an ability to resist permanent warp such that a permanent warp of the foldable electronic device assembly is at least 20% lower than a permanent warp of the comparable foldable electronic device assembly.

As would be understood by those with ordinary skill in the field, a comparison of the results and samples in Table 4 between Exs. 4-6 and Comp. Ex. 9 is supporting evidence of these attributes. That is, the remaining bend/crease height of the inventive samples, Exs. 5 and 6, after 480 hours on test is about 46.5 mm and 41 mm after another 168 hours of relaxation; and the remaining bend/crease height of the comparative example, Comp. Ex. 9, is about 57 mm and 52 mm, respectively, under the same test conditions. As such, the inventive samples with foldable glass elements demonstrate an improvement of about 18% (57–46.5/57) and about 21% (52–41/52) in permanent warp (after 480 hours on test and 480 hours+168 hours of relaxation, respectively) over a comparable sample with a PI layer instead of a foldable glass element. As such, the inclusion of a foldable glass element in the foldable electronic device assemblies and cover elements of the disclosure substantially improves the resistance of the assembly and cover element to permanent warp and deformation.

Further, as used herein the term "glass" is meant to include any material made at least partially of glass, including glass and glass-ceramics. "Glass-ceramics" include materials produced through controlled crystallization of glass. In embodiments, glass-ceramics have about 30% to about 90% crystallinity. Non-limiting examples of glass ceramic systems that may be used include $Li_2O \times Al_2O_3 \times nSiO_2$ (i.e., an LAS system), $MgO \times Al_2O_3 \times nSiO_2$ a MAS system), and $ZnO \times Al_2O_3 \times nSiO_2$ (i.e., a ZAS system).

Many variations and modifications may be made to the above-described embodiments of the disclosure without departing substantially from the spirit and various principles of the disclosure. All such modifications and variations are intended to be included herein within the scope of this disclosure and protected by the following claims.

For example, although in some embodiments the cover element was described as being used as a typical "cover glass" for a display, the cover element may be used on any portion of a device housing, and in some embodiments need not be transparent (as where the cover element is not used in a location where one would view objects there through).

According to a first exemplary aspect, a cover element is provided that comprises: a foldable glass element comprising a thickness from about 25 μm to about 200 μm, the glass element further comprising: (a) a first primary surface, (b) a second primary surface, and (c) a compressive stress region extending from the first primary surface of the glass element to a first depth in the glass element, the region defined by a stress $\sigma_I$ of at least about 100 MPa in compression at the first primary surface of the glass element; and a polymeric layer comprising a thickness from about 10 μm to about 100 μm and disposed over the first primary surface of the glass element. The glass element is characterized by a stress profile such that when the glass element is bent to a target bend radius of from 1 mm to 20 mm, with the center of curvature on the side of the second primary surface so as to induce a bending stress $\sigma_B$ at the first primary surface in tension, $\sigma_I + \sigma_B < 400$ MPa (in tension). Further, the cover element comprises an ability to withstand a pen drop height of at least 1.5 times that of a control pen drop height of the cover element without the layer, wherein the pen drop heights are measured according to a Drop Test 1, with the layer disposed on the side of the glass element facing the pen.

According to a second exemplary aspect, a cover element is provided that comprises: a foldable glass element comprising a thickness from about 25 μm to about 200 μm, the glass element further comprising: (a) a first primary surface, (b) a second primary surface, and (c) a compressive stress region extending from the second primary surface of the glass element to a first depth in the glass element, the region defined by a stress $\sigma_I$ of at least about 100 MPa in compression at the second primary surface of the glass element; and a polymeric layer comprising a thickness from about 10 μm to about 100 μm and disposed over the first primary surface of the glass element. The glass element is characterized by a stress profile such that when the glass element is bent to a target bend radius of from 1 mm to 20 mm, with the center of curvature on the side of the first primary surface so as to induce a bending stress $\sigma_B$ at the second primary surface in tension, $\sigma_I + \sigma_B < 200$ MPa (in tension). Further, the cover element comprises an ability to withstand a pen drop height of at least 1.5 times that of a control pen drop height of the cover element without the layer, wherein the pen drop heights are measured according to a Drop Test 1, with the layer disposed on the side of the glass element facing the pen.

According to a third exemplary aspect, the cover element of the first exemplary aspect is provided, wherein $\sigma_I + \sigma_B < 0$ MPa at the first primary surface of the glass element.

According to a fourth exemplary aspect, the cover element of the second exemplary aspect is provided, wherein $\sigma_I + \sigma_B < 0$ MPa at the second primary surface of the glass element.

According to a fifth exemplary aspect, the cover element of any one of the first and third exemplary aspects is provided, wherein the glass element further comprises a maximum flaw size of less than or equal to 2 μm at the first primary surface of the glass element.

According to a sixth exemplary aspect, the cover element of any one of the second and fourth exemplary aspects is provided, wherein the glass element further comprises a maximum flaw size of less than or equal to 2 μm at the second primary surface of the glass element.

According to a seventh exemplary aspect, the cover element of any one of exemplary aspects 1-6 is provided, wherein the layer comprises a polyimide, a polyethylene terephthalate, a polycarbonate or a poly methyl methacrylate.

According to an eighth exemplary aspect, the cover element of any one of exemplary aspects 1-7 is provided, wherein the layer is coupled to the glass element by an adhesive.

According to a ninth exemplary aspect, the cover element of any one of the first and third exemplary aspects is provided, wherein $\sigma_I + \sigma_B < 0$ MPa to a depth of at least 1 μm below the first primary surface of the glass element.

According to a tenth exemplary aspect, the cover element of the any one of the second and fourth exemplary aspects is provided, wherein $\sigma_I + \sigma_B < 0$ MPa to a depth of at least 1 μm below the second primary surface of the glass element.

According to an eleventh exemplary aspect, the cover element of any one of the first and third exemplary aspects is provided, wherein the stress at the first primary surface of the glass element is from about 700 MPa to about 2000 MPa in compression, and further wherein the compressive stress region comprises a plurality of ion-exchangeable metal ions and a plurality of ion-exchanged metal ions, the ion-exchanged metal ions comprising an atomic radius larger than the atomic radius of the ion-exchangeable metal ions.

According to a twelfth exemplary aspect, the cover element of any one the second and fourth exemplary aspects is provided, wherein the stress at the second primary surface of the glass element is from about 700 MPa to about 2000 MPa in compression, and further wherein the compressive stress region comprises a plurality of ion-exchangeable metal ions and a plurality of ion-exchanged metal ions, the ion-exchanged metal ions comprising an atomic radius larger than the atomic radius of the ion-exchangeable metal ions.

According to a thirteenth exemplary aspect, the cover element of any one of the first and third exemplary aspects is provided, wherein the first depth is set at approximately one third of the thickness of the glass element or less from the first primary surface of the glass element.

According to a fourteenth exemplary aspect, the cover element of any one the second and fourth exemplary aspects is provided, wherein the first depth is set at approximately one third of the thickness of the glass element or less from the second primary surface of the glass element.

According to a fifteenth exemplary aspect, the cover element of any one of exemplary aspects 1-14 is provided, further comprising: a scratch-resistant coating disposed on the polymeric layer, wherein the coating has a pencil hardness of at least 5H according to ASTM Test Method D3363, and further wherein the cover element with the layer and the coating comprises an ability to withstand a pen drop height of at least 1.5 times that of a control pen drop height of the cover element without the layer and the coating, wherein the pen drop heights are measured according to a Drop Test 1, with the layer and coating disposed on the side of the glass element facing the pen.

According to a sixteenth exemplary aspect, a foldable device assembly is provided that comprises: a foldable electronic device substrate; and a foldable glass element disposed over the device substrate, the glass element comprising a thickness from about 25 µm to about 200 µm and further comprising: (a) a first primary surface, (b) a second primary surface, and (c) a compressive stress region extending from the first primary surface of the glass element to a first depth in the glass element, the region defined by a stress $\sigma_I$ of at least about 100 MPa in compression at the first primary surface of the glass element. The foldable device assembly also includes a polymeric layer comprising a thickness from about 10 µm to about 100 µm and disposed over the first primary surface of the glass element. The glass element is characterized by a stress profile such that when the glass element is bent to a target bend radius of from 1 mm to 20 mm, with the center of curvature on the side of the second primary surface so as to induce a bending stress $\sigma_B$ at the first primary surface, $\sigma_I + \sigma_B < 400$ MPa (in tension). Further, the foldable electronic device assembly comprises an ability to withstand a pen drop height of at least 1.5 times that of a control pen drop height of the foldable electronic device assembly without the polymeric layer, wherein the pen drop heights are measured according to a Drop Test 1, with the layer disposed on the side of the glass element facing the pen.

According to a seventeenth exemplary aspect, the device assembly of the sixteenth exemplary aspect is provided, wherein $\sigma_I + \sigma_B < 0$ MPa at the first primary surface of the glass element.

According to an eighteenth exemplary aspect, the device assembly of the sixteenth or the seventeenth exemplary aspects is provided, wherein the glass element further comprises a maximum flaw size of less than or equal to 2 µm at the first primary surface of the glass element.

According to a nineteenth exemplary aspect, the device assembly of any one of exemplary aspects 16-18 is provided, wherein the foldable electronic device assembly is able to withstand a pen drop height of greater than 8 cm according to the Drop Test 1.

According to a twentieth exemplary aspect, the device assembly of any one of exemplary aspects 16-19 is provided, wherein the foldable electronic device assembly is able to withstand a pen drop height of greater than 15 cm according to the Drop Test 1.

According to a twenty-first exemplary aspect, the device assembly of any one of exemplary aspects 16-20 is provided, wherein the layer comprises a polyimide, a polyethylene terephthalate, a polycarbonate, or a poly methyl methacrylate.

According to a twenty-second exemplary aspect, the device assembly of any one of exemplary aspects 16-21 is provided, wherein the layer is coupled to glass element by an adhesive and the glass element is coupled to the device substrate by an adhesive.

According to a twenty-third exemplary aspect, the device assembly of any one of exemplary aspects 16-22 is provided, wherein $\sigma_I + \sigma_B < 0$ MPa to a depth of at least 1 µm below the first primary surface of the glass element.

According to a twenty-fourth exemplary aspect, the device assembly of any one of exemplary aspects 16-23 is provided, wherein the stress at the first primary surface of the glass element is from about 700 MPa to about 2000 MPa (in compression), and further wherein the compressive stress region comprises a plurality of ion-exchangeable metal ions and a plurality of ion-exchanged metal ions, the ion-exchanged metal ions comprising an atomic radius larger than the atomic radius of the ion-exchangeable metal ions.

According to a twenty-fifth exemplary aspect, the device assembly of any one of exemplary aspects 16-24 is provided, wherein the first depth is set at approximately one third of the thickness of the glass element or less from the first primary surface of the glass element.

According to a twenty-sixth exemplary aspect, the device assembly of any one of exemplary aspects 16-25 is provided, further comprising: a scratch-resistant coating disposed on the polymeric layer, wherein the coating has a pencil hardness of at least 5H according to ASTM Test Method D3363, and further wherein the foldable electronic device assembly comprises an ability to withstand a pen drop height of at least 1.5 times that of a control pen drop height of the foldable electronic device assembly without the layer and the coating, wherein the pen drop heights are measured according to a Drop Test 1, with the layer and the coating disposed on the side of the glass element facing the pen.

According to a twenty-seventh exemplary aspect, a foldable electronic device assembly is provided that comprises: a foldable electronic device substrate; and a foldable glass element disposed over the device substrate, the glass element comprising a thickness from about 25 µm to about 200 µm and further comprising: (a) a first primary surface, (b) a second primary surface, and (c) a compressive stress region extending from the first primary surface of the glass element to a first depth in the glass element, the region defined by a stress $\sigma_I$ of at least about 100 MPa in compression at the first primary surface of the glass element. The foldable device assembly also includes a polymeric layer comprising a thickness from about 10 µm to about 100 µm and disposed over the first primary surface of the glass element. The glass element is characterized by a stress profile such that when the glass element is bent to a target bend radius of from 1 mm to 20 mm, with the center of curvature on the side of the second primary surface so as to induce a bending stress $\sigma_B$ at the first primary surface, $\sigma_I+\sigma_B$<400 MPa (in tension). Further, the foldable electronic device assembly comprises an ability to resist permanent warp such that a permanent warp of the foldable electronic device assembly is at least 10% lower than a permanent warp of a comparable foldable electronic device assembly, wherein the permanent warp of the device assemblies is measured according to a Static Test after a hold time on test of 480 hours at 85° C. and 85% relative humidity. In addition, the comparable foldable electronic device assembly comprises (a) a comparable substrate and comparable polymeric layer comprising the same dimensions and compositions as the respective substrate and polymeric layer of the foldable electronic device assembly, and (b) a comparable foldable polymeric element disposed between the comparable substrate and comparable polymeric layer that comprises a polyimide (PI) comprising the same, or a smaller, thickness as the glass element of the foldable electronic device assembly.

According to a twenty-eighth exemplary aspect, the device assembly of the twenty-seventh exemplary aspect is provided, wherein the foldable electronic device assembly comprises an ability to resist permanent warp such that a permanent warp of the foldable electronic device assembly is at least 20% lower than a permanent warp of the comparable foldable electronic device assembly According to a twenty-ninth exemplary aspect, the device assembly of the twenty-seventh or the twenty-eighth exemplary aspects is provided, wherein $\sigma_I+\sigma_B$<0 MPa at the first primary surface of the glass element.

According to a thirtieth exemplary aspect, the device assembly of any of exemplary aspects 27-29 is provided, wherein the glass element further comprises a maximum flaw size of less than or equal to 2 µm at the first primary surface of the glass element.

According to a thirty-first exemplary aspect, the device assembly of any of exemplary aspects 27-30 is provided, wherein the layer comprises a polyimide, a polyethylene terephthalate, a polycarbonate, or a poly methyl methacrylate.

According to a thirty-second exemplary aspect, the device assembly of any of exemplary aspects 27-31 is provided, wherein the layer is coupled to the glass element by an adhesive and the glass element is coupled to the device substrate by an adhesive.

According to a thirty-third exemplary aspect, the device assembly of any of exemplary aspects 27-32 is provided, wherein $\sigma_I+\sigma_B$<0 MPa to a depth of at least 1 µm below the first primary surface of the glass element.

According to a thirty-fourth exemplary aspect, the device assembly of any of exemplary aspects 27-33 is provided, wherein the stress at the first primary surface of the glass element is from about 700 MPa to about 2000 MPa in compression, and further wherein the compressive stress region comprises a plurality of ion-exchangeable metal ions and a plurality of ion-exchanged metal ions, the ion-exchanged metal ions comprising an atomic radius larger than the atomic radius of the ion-exchangeable metal ions.

According to a thirty-fifth exemplary aspect, the device assembly of any of exemplary aspects 27-34 is provided, wherein the first depth is set at approximately one third of the thickness of the glass element or less from the first primary surface of the glass element.

According to a thirty-sixth exemplary aspect, the device assembly of any of exemplary aspects 27-35 is provided, further comprising: a scratch-resistant coating disposed on the polymeric layer, wherein the scratch-resistant coating has a pencil hardness of at least 5H according to ASTM Test Method D3363, and further wherein the foldable electronic device assembly comprises an ability to withstand a pen drop height of at least 1.5 times that of a control pen drop height of the foldable electronic device assembly without the layer and the coating, wherein the pen drop heights are measured according to a Drop Test 1, with the layer and the coating disposed on the side of the glass element facing the pen.

According to a thirty-seventh exemplary aspect, the cover element of the first or the third exemplary aspects is provided, wherein the foldable glass element further comprises a second compressive stress region extending from the second primary surface of the glass element to a second depth in the glass element, the second region defined by a stress $\sigma_I$ of at least 100 MPa in compression at the second primary surface of the glass element.

According to a thirty-eighth exemplary aspect, the cover element of the second or the fourth exemplary aspects is provided, wherein the foldable glass element further comprises a second compressive stress region extending from the first primary surface of the glass element to a second depth in the glass element, the second region defined by a stress $\sigma_I$ of at least 100 MPa in compression at the first primary surface of the glass element.

According to a thirty-ninth exemplary aspect, the device assembly of any one of exemplary aspects 16-26 is provided, wherein the foldable glass element further comprises a second compressive stress region extending from the second primary surface of the glass element to a second depth in the glass element, the second region defined by a stress $\sigma_I$ of at least 100 MPa in compression at the second primary surface of the glass element.

According to a fortieth exemplary aspect, the device assembly of any one of exemplary aspects 27-36 is provided, wherein the foldable glass element further comprises a second compressive stress region extending from the second primary surface of the glass element to a second depth in the glass element, the second region defined by a stress $\sigma_I$ of at least 100 MPa in compression at the second primary surface of the glass element.

According to a forty-first exemplary aspect, a glass article is provided that comprises: a foldable glass element comprising a thickness from about 25 µm to about 75 µm, the glass element further comprising: (a) a first primary surface, (b) a second primary surface, and (c) a compressive stress region extending from the first primary surface of the glass element to a first depth in the glass element, the region defined by a stress $\sigma_I$ of at least about 100 MPa in compression at the first primary surface of the glass element. The glass element is characterized by a stress profile such that when the glass element is bent to a target bend radius of from 1 mm to 10 mm, with the center of curvature on the side of the second primary surface so as to induce a bending stress $\sigma_B$ at the first primary surface in tension, $\sigma_I+\sigma_B$<0 MPa. Further, the cover element comprises an ability to withstand a pen drop from a height of greater than that of the glass element alone.

According to a forty-second exemplary aspect, the glass article of the forty-first exemplary aspect is provided, wherein the glass element is able to withstand a pen drop from a height of greater than 40 cm according to Drop Test 2, or of greater than 3 cm according to Drop Test 3.

According to a forty-third exemplary aspect, the glass article of the forty-first or the forty-second exemplary aspect is provided, further comprising: a layer disposed on the first primary surface of the glass element, wherein the glass article with the layer has an ability to withstand a pen drop height at least twice that of the glass article without the layer, wherein the pen is dropped according to Drop Test 2 or to Drop Test 3, with the layer disposed on the side of the glass element facing the incoming pen.

According to a forty-fourth exemplary aspect, the glass article of any one of the 41-43 exemplary aspects is provided, wherein the layer comprises polyimide (PI), polyethylene terephthalate (PET) or polycarbonate (PC).

According to a forty-fifth exemplary aspect, the glass article of any one of the 41-44 exemplary aspects is provided, wherein the layer is coupled to the glass element by an adhesive.

According to a forty-sixth exemplary aspect, the glass article of any one of the 41-45 exemplary aspects is provided, wherein $\sigma I+\sigma B<0$ to a depth of at least one micron below the first primary surface.

According to a forty-seventh exemplary aspect, the glass article of any one of the 41-46 exemplary aspects is provided, wherein the glass element further comprises a pencil hardness of greater than or equal to 8H.

According to a forty-eighth exemplary aspect, the glass article of any one of the 41-47 exemplary aspects is provided, wherein the glass element further comprises a plurality of layers.

According to a forty-ninth exemplary aspect, the glass article of any one of the 41-48 exemplary aspects is provided, wherein the compressive stress at the first primary surface of the glass element is from about 700 MPa to 2000 MPa.

According to a fiftieth exemplary aspect, the glass article of any one of the 41-49 exemplary aspects is provided, wherein the first depth is set at approximately one third of the thickness of the glass element or less from the first primary surface of the glass element.

According to a fifty-first exemplary aspect, the glass article of any one of the 41-50 exemplary aspects is provided, wherein the compressive stress region comprises a maximum flaw size of 5 μm or less at the first primary surface of the glass element.

According to a fifty-second exemplary aspect, the glass article of any one of the 41-51 exemplary aspects is provided, wherein the compressive stress region comprises a plurality of ion-exchangeable metal ions and a plurality of ion-exchanged metal ions, the ion-exchanged metal ions having an atomic radius larger than the atomic radius of the ion-exchangeable metal ions.

According to a fifty-third exemplary aspect, a foldable electronic device is provided that comprises: an electronic device having a foldable feature, wherein the foldable feature comprises the glass article according to any one of the exemplary aspects 41-52.

According to a fifty-fourth exemplary aspect, a method of making a glass article is provided that includes the steps: forming a glass element having a thickness from about 25 μm to about 125 μm, the glass element further comprising: (a) a first primary surface, (b) a second primary surface, and (c) a compressive stress region extending from the first primary surface of the glass element to a first depth in the glass element, the region defined by a stress $\sigma_I$ of at least about 100 MPa in compression at the first primary surface of the glass element. The glass element is characterized by (a) a stress profile such that when the glass element is bent to a target bend radius of from 1 mm to 10 mm, with the center of curvature on the side of the second primary surface so as to induce a bending stress $\sigma_B$ at the first primary surface in tension, $\sigma_I+\sigma_B<0$ MPa; and (b) a puncture resistance of greater than about 1.5 kgf when the first primary surface of the glass element is loaded with a tungsten carbide ball having a diameter of 1.5 mm.

According to a fifty-fifth exemplary aspect, the method of the fifty-fourth exemplary aspect is provided, wherein the glass element is able to withstand a pen drop from a height of greater than 40 cm according to Drop Test 2, or of greater than 3 cm according to Drop Test 3.

According to a fifty-sixth exemplary aspect, the method of the fifty-fourth or the fifty-fifth exemplary aspect is provided, further comprising a layer disposed on the first primary surface of the glass element, wherein the glass article with the layer has an ability to withstand a pen drop height at least twice that of the glass article without the layer, wherein the pen is dropped according to Drop Test 2 or to Drop Test 3, with the layer disposed on the side of the glass element facing the incoming pen.

According to a fifty-seventh exemplary aspect, the method of any one of exemplary aspects 54-56 is provided, wherein the layer comprises polyimide (PI), polyethylene terephthalate (PET) or polycarbonate (PC).

According to a fifty-eighth exemplary aspect, the method of any one of exemplary aspects 54-57 is provided, wherein the layer is coupled to the glass element by an adhesive.

According to a fifty-ninth exemplary aspect, the method of any one of exemplary aspects 54-58 is provided, wherein $\sigma I+\sigma B<0$ to a depth of at least one micron below the first primary surface.

According to a sixtieth exemplary aspect, the method of any one of exemplary aspects 54-59 is provided, wherein the step of forming the first glass layer comprises a forming process selected from the group consisting of fusion, slot drawing, rolling, redrawing and float processes, the forming process further configured to form the glass layer to the final thickness.

According to a sixty-first exemplary aspect, the method of any one of exemplary aspects 54-60 is provided, wherein the step of forming the first glass layer comprises a forming process selected from the group consisting of fusion, slot drawing, rolling, redrawing and float processes, and a material removal process that removes material from the glass layer to reach the final thickness.

According to a sixty-second exemplary aspect, the method of any of exemplary aspects 54-61 is provided, wherein the step of forming a compressive stress region extending from the first primary surface of the glass layer to a first depth in the glass layer comprises: providing a strengthening bath comprising a plurality of ion-exchanging metal ions having an atomic radius larger in size than the atomic radius of a plurality ion-exchangeable metal ions contained in the glass layer; and submersing the glass layer in the strengthening bath to exchange a portion of the plurality of ion-exchangeable metal ions in the glass layer with a portion of the plurality of the ion-exchanging metal ions in the strengthening bath to form a compressive stress region extending from the first primary surface to the first depth in the glass layer.

According to a sixty-third exemplary aspect, the method the sixty-second exemplary is provided, wherein the submersing step comprises submersing the glass layer in the strengthening bath at about 400° C. to about 450° C. for about 15 minutes to about 180 minutes.

According to a sixty-fourth exemplary aspect, the method the sixty-first exemplary is provided, further comprising the step: removing about 1 μm to about 5 μm from the final thickness of the glass layer at the first primary surface after the step of forming the compressive stress region, wherein the removing step is conducted after the submersing the glass layer step.

According to a sixty-fifth exemplary aspect, the method of any one of exemplary aspects 54-64 is provided, wherein the compressive stress is from about 700 MPa to 2000 MPa.

According to a sixty-sixth exemplary aspect, the method of any one of exemplary aspects 54-65 is provided, wherein the glass element further comprises a pencil hardness of greater than or equal to 8H.

According to a sixty-seventh exemplary aspect, the method of any one of exemplary aspects 54-66 is provided, wherein the glass element further comprises a plurality of layers.

What is claimed is:

1. A cover element for a foldable electronic device, comprising:
   a foldable glass element comprising a thickness from about 25 µm to about 200 µm the glass element further comprising:
   (a) a first primary surface,
   (b) a second primary surface, and
   (c) a compressive stress region extending from the first primary surface of the glass element to a first depth in the glass element, the region defined by a stress $\sigma_I$ of at least about 100 MPa in compression at the first primary surface of the glass element; and
   a polymeric layer comprising a thickness from about 10 µm to about 100 µm and disposed over the first primary surface of the glass element,
   wherein the glass element is characterized by a stress profile such that when the glass element is bent to a target bend radius of from 1 mm to 20 mm, with the center of curvature on the side of the second primary surface so as to induce a bending stress $\sigma_B$ at the first primary surface in tension, $0 \leq \sigma_I + \sigma_B < 400$ MPa (in tension), and
   wherein the cover element comprises an ability to withstand a pen drop height of at least 1.5 times that of a control pen drop height of the cover element without the layer, wherein the pen drop heights are measured according to a Drop Test 1, with the layer disposed on the side of the glass element facing the pen.

2. The cover element according to claim 1, wherein the stress at the first primary surface of the glass element is from about 700 MPa to about 2000 MPa in compression, and further wherein the compressive stress region comprises a plurality of ion-exchangeable metal ions and a plurality of ion-exchanged metal ions, the ion-exchanged metal ions comprising an atomic radius larger than the atomic radius of the ion-exchangeable metal ions.

3. The cover element according to claim 1, wherein the first depth is set at approximately one third of the thickness of the glass element or less from the first primary surface of the glass element.

4. The cover element according to claim 1, further comprising:
   a scratch-resistant coating disposed on the polymeric layer,
   wherein the coating has a pencil hardness of at least 5H according to ASTM Test Method D3363, and
   further wherein the cover element with the layer and the coating comprises an ability to withstand a pen drop height of at least 1.5 times that of a control pen drop height of the cover element without the layer and the coating, wherein the pen drop heights are measured according to a Drop Test 1, with the layer and coating disposed on the side of the glass element facing the pen.

5. The cover element according to claim 1, wherein the glass element further comprises a maximum flaw size of less than or equal to 2 µm at the first primary surface of the glass element.

6. The cover element according to claim 1, wherein the layer comprises a polyimide, a polyethylene terephthalate, a polycarbonate or a poly methyl methacrylate.

7. The cover element according to claim 1, wherein the layer is coupled to the glass element by an adhesive.

8. The cover element according to claim 1, wherein $\sigma_I + \sigma_B < 0$ MPa at a depth of at least 1 µm below the first primary surface of the glass element.

9. The cover element according to claim 1, further comprising a scratch-resistant coating disposed on the polymeric layer, wherein the scratch-resistant coating has a pencil hardness of at least 5H according to ASTM Test Method D3363.

* * * * *